US010766992B2

(12) United States Patent
Ichikawa et al.

(10) Patent No.: US 10,766,992 B2
(45) Date of Patent: Sep. 8, 2020

(54) RESIN AND RESIST COMPOSITION

(71) Applicant: SUMITOMO CHEMICAL COMPANY, LIMITED, Tokyo (JP)

(72) Inventors: Koji Ichikawa, Toyonaka (JP); Yusuke Fuji, Ibaraki (JP); Satoshi Yamaguchi, Kawachinagano (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/604,444

(22) Filed: Jan. 23, 2015

(65) Prior Publication Data

US 2015/0132698 A1 May 14, 2015

Related U.S. Application Data

(62) Division of application No. 12/821,008, filed on Jun. 22, 2010, now Pat. No. 9,051,405.

(30) Foreign Application Priority Data

Jun. 23, 2009 (JP) ................................ 2009-148769
Oct. 16, 2009 (JP) ................................ 2009-239839

(51) Int. Cl.

| | |
|---|---|
| ***C08F 224/00*** | (2006.01) |
| ***C08F 220/10*** | (2006.01) |
| ***C08F 228/06*** | (2006.01) |
| ***G03F 7/004*** | (2006.01) |
| ***G03F 7/039*** | (2006.01) |
| ***C08F 220/18*** | (2006.01) |
| ***C08F 222/14*** | (2006.01) |
| ***G03F 7/027*** | (2006.01) |
| ***G03F 7/038*** | (2006.01) |
| ***C08F 220/28*** | (2006.01) |
| ***C08F 226/06*** | (2006.01) |

(52) U.S. Cl.

CPC .......... *C08F 224/00* (2013.01); *C08F 220/10* (2013.01); *C08F 220/18* (2013.01); *C08F 222/14* (2013.01); *C08F 228/06* (2013.01); *G03F 7/0045* (2013.01); *G03F 7/0046* (2013.01); *G03F 7/027* (2013.01); *G03F 7/038* (2013.01); *G03F 7/0382* (2013.01); *G03F 7/0392* (2013.01); *G03F 7/0397* (2013.01); *C08F 220/28* (2013.01); *C08F 226/06* (2013.01)

(58) Field of Classification Search

None

See application file for complete search history.

(56) References Cited

U.S. PATENT DOCUMENTS

| | | | | |
|---|---|---|---|---|
| 3,779,778 | A | 12/1973 | Smith et al. | |
| 3,849,137 | A | 11/1974 | Barzynski et al. | |
| 4,576,902 | A | 3/1986 | Saenger et al. | |
| 4,822,716 | A | 4/1989 | Onishi et al. | |
| 4,857,437 | A | 8/1989 | Banks et al. | |
| 5,017,453 | A | 5/1991 | Onishi et al. | |
| 5,073,476 | A | 12/1991 | Meier et al. | |
| 5,198,520 | A | 3/1993 | Onishi et al. | |
| 5,260,410 | A | 11/1993 | Schwalm | |
| 5,453,341 | A | 9/1995 | Schwalm | |
| 6,800,422 | B2 | 10/2004 | Thackeray et al. | |
| 7,186,495 | B2 | 3/2007 | Maeda et al. | |
| 7,304,175 | B2 | 12/2007 | Harada et al. | |
| 7,432,035 | B2 | 10/2008 | Maeda et al. | |
| 9,051,405 | B2 * | 6/2015 | Ichikawa .............. | C08F 220/10 |
| 2001/0026901 | A1 | 10/2001 | Maeda et al. | |
| 2003/0077543 | A1 * | 4/2003 | Sato ...................... | G03F 7/0045 430/287.1 |
| 2005/0260525 | A1 * | 11/2005 | Takemoto ............. | C08F 220/26 430/270.1 |
| 2006/0194982 | A1 | 8/2006 | Harada et al. | |
| 2007/0218401 | A1 | 9/2007 | Ando et al. | |
| 2007/0218403 | A1 | 9/2007 | Maeda et al. | |
| 2008/0193874 | A1 | 8/2008 | Takata et al. | |
| 2008/0286691 | A1 | 11/2008 | Akita et al. | |
| 2009/0004600 | A1 | 1/2009 | Akita et al. | |
| 2009/0023878 | A1 | 1/2009 | Maeda et al. | |
| 2009/0068590 | A1 | 3/2009 | Dazai et al. | |

(Continued)

FOREIGN PATENT DOCUMENTS

| | | | |
|---|---|---|---|
| DE | 39 14407 | A1 | 10/1990 |
| EP | 0 126 712 | A1 | 11/1984 |

(Continued)

OTHER PUBLICATIONS

The Office Action, dated Feb. 24, 2015, issued in the corresponding Japanese Patent Application No. 2014-094943.

(Continued)

*Primary Examiner* — Cynthia H Kelly

*Assistant Examiner* — Anna Malloy

(74) *Attorney, Agent, or Firm* — Birch, Stewart, Kolasch & Birch, LLP

(57) ABSTRACT

A resin containing a structural unit derived from a compound represented by the formula (aa)

(aa)

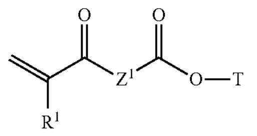

wherein T, $R^1$ and $Z^1$ are defined in the specification.

1 Claim, No Drawings

(56) References Cited

U.S. PATENT DOCUMENTS

| | | | |
|---|---|---|---|
| 2009/0226842 | A1 | 9/2009 | Shimizu et al. |
| 2010/0062364 | A1 | 3/2010 | Dazai et al. |
| 2010/0062369 | A1 | 3/2010 | Dazai et al. |
| 2010/0086873 | A1 | 4/2010 | Seshimo et al. |
| 2010/0136480 | A1 | 6/2010 | Motoike et al. |
| 2010/0183981 | A1 | 7/2010 | Matsumiya et al. |
| 2010/0196820 | A1 | 8/2010 | Kawaue et al. |
| 2010/0310985 | A1 | 12/2010 | Mori et al. |
| 2012/0329969 | A1 | 12/2012 | Matsumiya et al. |

FOREIGN PATENT DOCUMENTS

| | | | |
|---|---|---|---|
| EP | 2060600 | A1 | 5/2009 |
| JP | 55-164824 | A | 12/1980 |
| JP | 62-69263 | A | 3/1987 |
| JP | 62-153853 | A | 7/1987 |
| JP | 63-26653 | A | 2/1988 |
| JP | 63-146029 | A | 6/1988 |
| JP | 63-146038 | A | 6/1988 |
| JP | 63-163452 | A | 7/1988 |
| JP | 11-52575 | A | 2/1999 |
| JP | 2000-26446 | A | 1/2000 |
| JP | 2006-257078 | A | 9/2006 |
| JP | 2008-209917 | A | 9/2008 |
| JP | 2008-268744 | A | 11/2008 |
| JP | 2008-287057 | A | 11/2008 |
| JP | 2009-3242 | A | 1/2009 |
| JP | 2009-62491 | A | 3/2009 |
| JP | 2010-113334 | A | 5/2010 |
| JP | 2010-139662 | A | 6/2010 |
| JP | 2010-156941 | A | 7/2010 |
| JP | 2010-170054 | A | 8/2010 |
| JP | 2010-210714 | A | 9/2010 |
| JP | 2010-211042 | A | 9/2010 |
| JP | 2010-211043 | A | 9/2010 |
| JP | 2010-262258 | A | 11/2010 |
| JP | 2010-277043 | A | 12/2010 |
| JP | 2011-117987 | A | 6/2011 |
| TW | 200745759 | A | 12/2007 |

OTHER PUBLICATIONS

The Office Action, dated Mar. 3, 2015, issued in the corresponding Japanese Patent Application No. 2014-094944.

The Office Action, dated Feb. 3, 2015, issued in the corresponding Japanese Patent Application No. 2014-094940.

Japanese Decision of Refusal dated Feb. 4, 2014 for Japanese Application No. 2010-139231.

The Office Action and Search Report (including an English translation), dated Jul. 31, 2014, issued in the corresponding Taiwanese Patent Application No. 099120358.

The Office Action, dated Jan. 20, 2015, issued in the corresponding Japanese Patent Application No. 2014-094942.

The Office Action issued in the corresponding Japanese Patent Application No. 2014-094943 dated Aug. 11, 2015.

* cited by examiner

RESIN AND RESIST COMPOSITION

CROSS-REFERENCE TO RELATED APPLICATIONS

This application is a Divisional of co-pending application Ser. No. 12/821,008 filed on Jun. 22, 2010, which claims priority under 35 U.S.C. § 119(a) to Patent Application No. 2009-148769 filed in Japan on Jun. 23, 2009 and Patent Application No. 2009-239839 filed in Japan on Oct. 16, 2009. All of the above applications are hereby expressly incorporated by reference into the present application.

BACKGROUND OF THE INVENTION

1. Field of the Invention

The present invention relates to a resin and a resist composition, and more specifically relates to a resin used in the microfabrication of semiconductors and a resist composition that contain the same.

2. Background Information

Resist compositions used in the microfabrication of semiconductors using lithography technology contain resins.

Recently, a chemically amplified photoresist composition was proposed that is composed of a resin from polymerization of a preparation of 2-ethyl-2-adamantyl methacrylate, 3-hydroxy-1-adamantyl methacrylate and $\alpha$-methacryloyloxy-$\gamma$-butyrolactone in a mole ratio of 50:25:25, an acid generator composed of triphenylsulfonium 1-((3-hydroxyadamantyl)methoxycarbonyl)difluoromethanesulfonate, a quencher composed of 2,6-diisopropylaniline and a solvent (for example, JP-A-2006-257078).

Also, a resist composition was proposed that is composed of a resin from polymerization of a preparation of monomer A, monomer J and monomer G in a mole ratio of 52.6:15.8:31.6, and an acid generator composed of a compound represented by the formula (Y1) (for example, JP-A-2009-62491).

A

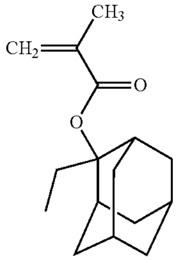

J

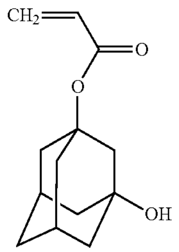

-continued

G

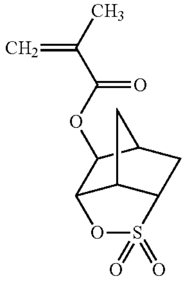

(Y1)

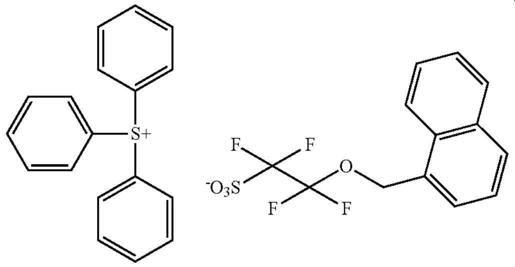

SUMMARY OF THE INVENTION

The object of the present invention is to provide a chemically amplified photoresist composition that provides better line edge roughness (LER), and better mask error factor (MEF).

The present invention provides following inventions of <1> to <14>.

<1> A resin comprising a structural unit derived from a compound represented by the formula (aa)

(aa)

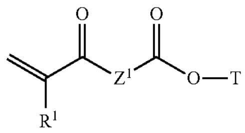

wherein T represents a $C_4$ to $C_{36}$ alicyclic hydrocarbon group, the hydrogen atom contained in the alicyclic hydrocarbon group may be replaced by a halogen atom, a hydroxyl group, a $C_1$ to $C_{12}$ alkyl group optionally substituted with a halogen atom or a hydroxyl group, a $C_1$ to $C_{12}$ alkoxyl group, a $C_6$ to $C_{12}$ aryl group, a $C_7$ to $C_{12}$ aralkyl group, a glycidyloxy group, a $C_2$ to $C_4$ acyl group, an alkoxycarbonyl group, an alkanoyloxyalkyl group or a cyano group, and the $-CH_2-$ contained in the alicyclic hydrocarbon group is replaced by at least one $-SO_2-$ and furthermore may be replaced by $-CO-$, $-O-$, $-S-$, $-SO_2-$ or $-N(R^c)-$;

$R^c$ represents a hydrogen atom or a $C_1$ to $C_6$ alkyl group;

$R^1$ represents a hydrogen atom, a halogen atom, or a $C_1$ to $C_6$ alkyl group that may optionally has halogen atoms; and $Z^1$ represents an optionally substituted $C_1$ to $C_{17}$ saturated hydrocarbon group, and the $-CH_2-$ contained in the saturated hydrocarbon group may be replaced by $-CO-$, $-O-$, $-S-$ or $-N(R^c)-$.

<2> The resin according to <1>, wherein T is a group represented by the formula (T1)

(T1)

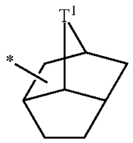

wherein the hydrogen atom contained in the ring may be replaced by a halogen atom, a hydroxyl group, a $C_1$ to $C_{12}$ alkyl group optionally substituted with a halogen atom or a hydroxyl group, a $C_1$ to $C_{12}$ alkoxyl group, a $C_6$ to $C_{12}$ aryl group, a $C_7$ to $C_{12}$ aralkyl group, a glycidyloxy group, a $C_2$ to $C_4$ acyl group, an alkoxycarbonyl group, an alkanoyloxyalkyl group or a cyano group, and the —$CH_2$— contained in the ring is replaced by at least one —$SO_2$— and furthermore may be replaced by —CO—, —O—, —S—, —$SO_2$— or —N($R^c$)—;

$R^c$ represents the same meaning as defined above;

* represents a bond to an oxygen atom; and $T^1$ represents —O— or —$CH_2$—.

<3> The resin according to <1> or <2>, wherein T is a group represented by the formula ($T^2$)

(T2)

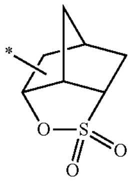

wherein the hydrogen atom contained in the ring may be replaced by a halogen atom, a hydroxyl group, a $C_1$ to $C_{12}$ alkyl group optionally substituted with a halogen atom or a hydroxyl group, a $C_1$ to $C_{12}$ alkoxyl group, a $C_6$ to $C_{12}$ aryl group, a $C_7$ to $C_{12}$ aralkyl group, a glycidyloxy group, a $C_2$ to $C_4$ acyl group, an alkoxycarbonyl group, an alkanoyloxyalkyl group or a cyano group, and the —$CH_2$— contained in the ring may be replaced by —CO—, —O—, —S—, —$SO_2$— or —N($R^c$)—; and $R^c$ and * represent the same meaning as defined above.

<4> The resin according to any one of <1> to <3>, wherein the $Z^1$ is —O—$CH_2$—.

<5> The resin according to any one of <1> to <4>, which further comprising an acid-labile group, the resin is insoluble or poorly soluble in aqueous alkali solution, and dissolves in aqueous alkali solution by the action of acid.

<6> The resin according to any one of <1> to <5>, which further comprising a structural unit derived from a compound having a norbornane lactone structure.

<7> The resin according to <6>, wherein the compound having the norbornane lactone structure is represented by the formula (bb)

(bb)

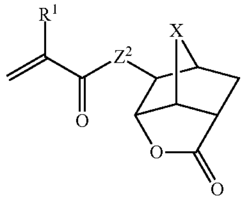

wherein $R^1$ represents a hydrogen atom, a halogen atom, or a $C_1$ to $C_6$ alkyl group that may optionally has halogen atoms;

$Z^2$ represents an optionally substituted $C_1$ to $C_{17}$ saturated hydrocarbon group, and the —$CH_2$— contained in the saturated hydrocarbon group may be replaced by —CO—, —O—, —S— or —$SO_2$—;

X represents —$CH_2$—, —O— or —S—; and $R^c$ represents the same meaning as defined above.

<8> The resin according to any one of <1> to <7>, which further comprising a structural unit derived from a compound having an adamantyl group substituted with at least two hydroxyl groups.

<9> The resin according to <8>, wherein the compound having the adamantyl group substituted with at least two hydroxyl groups structure is represented by the formula (cc)

(cc)

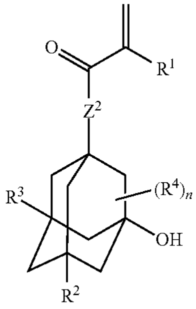

wherein $R^1$ represents a hydrogen atom, a halogen atom or a $C_1$ to $C_6$ alkyl group that may optionally has halogen atoms;

$Z^2$ represents an optionally substituted $C_1$ to $C_{17}$ saturated hydrocarbon group, and the —$CH_2$— contained in the saturated hydrocarbon group may be replaced by —CO—, —O—, —S— or —$SO_2$—;

$R^c$ represents the same meaning as defined above;

$R^2$ and $R^3$ independently represent a hydrogen atom, a methyl group or a hydroxyl group;

$R^4$ is independently in each occurrence a $C_1$ to $C_6$ alkyl group;

n represents 0 to an integer of 10.

<10> A resist composition comprising a resin according to any one of <1> to <9>, and an acid generator.

<11> The resist composition according to <10>, wherein the acid generator is a salt represented by the formula as an active ingredient (I)

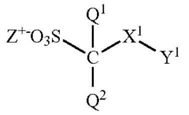

wherein $Q^1$ and $Q^2$ independently represent a fluorine atom or a $C_1$ to $C_6$ perfluoroalkyl group;

$X^1$ represents a single bond or an optionally substituted $C_1$ to $C_{17}$ saturated hydrocarbon group, the —$CH_2$— contained in the saturated hydrocarbon group may be replaced by —O— or —CO—;

$Y^1$ represents a linear or branched chain $C_1$ to $C_{36}$ aliphatic hydrocarbon group, a $C_3$ to $C_{36}$ alicyclic hydrocarbon group or a $C_6$ to $C_{36}$ aromatic hydrocarbon group, and the aliphatic hydrocarbon group, the alicyclic hydrocarbon group and the aromatic hydrocarbon group may be substituted, provided that a substituent dose not have a fluorine atom, and the —$CH_2$— contained in the aliphatic hydrocarbon group and the alicyclic hydrocarbon group may be replaced by —CO—, —O—, —S—, $SO_2$— or —$N(R^c)$—;

$R^c$ represents the same meaning as defined above;

$Z^+$ represents an organic counter cation.

<12> The resist composition according to <10> or <12>, wherein the acid generator is a compound including a divalent group represented by —O—$SO_2$— as the active ingredient.

<13> The resist composition according to any one of <10> to <12>, wherein the $Y^1$ is a $C_4$ to $C_{36}$ alicyclic hydrocarbon group, the hydrogen atom contained in the alicyclic hydrocarbon group may be replaced by a halogen atom, a hydroxyl group, a $C_1$ to $C_{12}$ alkyl group, a $C_1$ to $C_{12}$ alkoxyl group, a $C_6$ to $C_{12}$ aryl group, a $C_7$ to $C_{12}$ aralkyl group, a glycidyloxy group or a $C_2$ to $C_4$ acyl group, and the —$CH_2$— contained in the alicyclic hydrocarbon group is replaced by at least one —$SO_2$— and furthermore may be replaced by —CO—, —O—, —S—, —$SO_2$— or —$N(R^c)$—;

$R^c$ represents a hydrogen atom or a $C_1$ to $C_6$ alkyl group.

<14> The resist composition according to any one of <10> to <13>, which further comprises a basic compound.

<15> A method for forming pattern comprising steps of;

(1) applying the resist composition according to claim 10 onto a substrate;

(2) removing solvent from the applied composition to form a composition layer;

(3) exposing to the composition layer using a exposure device;

(4) heating the exposed composition layer and, (5) developing the heated composition layer using a developing apparatus.

According to the resin and the resist composition of the present invention, it is possible to achieve maintenance of stability over time, high resolution, satisfactory shape, satisfactory line edge roughness (LER), satisfactory resistance to pattern collapse, wide DOF and/or mask error factor (MEF) in the micropattern formed, and particularly LER and MEF are improved.

DETAILED DESCRIPTION OF THE PREFERRED EMBODIMENTS

The resin of the present invention has structural units derived from a compound represented by the formula (aa).

(aa)

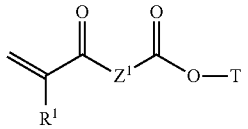

wherein T represents a $C_4$ to $C_{36}$ alicyclic hydrocarbon group, the hydrogen atom contained in the alicyclic hydrocarbon group may be replaced by a halogen atom, a hydroxyl group, a $C_1$ to $C_{12}$ alkyl group optionally substituted with a halogen atom or a hydroxyl group, a $C_1$ to $C_{12}$ alkoxyl group, a $C_6$ to $C_{12}$ aryl group, a $C_7$ to $C_{12}$ aralkyl group, a glycidyloxy group, a $C_2$ to $C_4$ acyl group, an alkoxycarbonyl group, an alkanoyloxyalkyl group or a cyano group, and the —$CH_2$— contained in the alicyclic hydrocarbon group is replaced by at least one —$SO_2$— and furthermore may be replaced by —CO—, —O—, —S—, —$SO_2$— or —$N(R^c)$—;

$R^c$ represents a hydrogen atom or a $C_1$ to $C_6$ alkyl group;

$R^1$ represents a hydrogen atom, a halogen atom, or a $C_1$ to $C_6$ alkyl group that optionally has a halogen atom;

$Z^1$ represents a $C_1$ to $C_{17}$ saturated hydrocarbon group that optionally has a substituent, and —$CH_2$— contained in the saturated hydrocarbon group may be replaced by —CO—, —O—, —S—, or —$N(R^c)$—.

In this specification, examples of the alicyclic hydrocarbon group include a cycloalkyl group such as cyclopropyl, cyclobutyl, cyclopentyl, cyclohexyl, cycloheptyl, cyclooctyl, cyclononyl, cyclodecyl, norbonyl, 1-adamantyl, 2-adamantyl and isonorbonyl groups.

Examples of the halogen atom include fluorine, chlorine, bromine or iodine atom.

Examples of the alkyl group include methyl, ethyl, n-propyl, iso-propyl, n-butyl, sec-butyl, tert-butyl, n-pentyl, n-hexyl, heptyl, 2-ethylhexyl, octyl, nonyl, decyl, undecyl, and dodecyl groups.

Examples of the alkoxyl group include methoxy, ethoxy, n-propoxy, iso-propoxy, n-butoxy, sec-butoxy, tert-butoxy, n-pentoxy, n-hextoxy, heptoxy, octyloxy, 2-ethylhexyloxy, nonyloxy, decyloxy, undecyloxy and dodecyloxy groups.

Examples of the aryl group include phenyl, naphthyl, anthranyl, p-methylphenyl, p-tert-bntylphenyl, p-adamantylphenyl; tolyl, xylyl, cumenyl, mesityl, biphenyl, anthryl, phenanthryl, 2,6-diethylphenyl, and 2-methyl-6-ethylphenyl groups.

Examples of the aralkyl group include benzyl, phenethyl, phenylpropyl, trityl, naphthylmethyl and naphthylethyl groups.

Examples of the acyl group include acetyl, propionyl and butyryl groups.

Examples of the alkoxylcarbonyl group include a group which is a alkoxyl group bonded with carbonyl group, such as methoxycarbonyl and ethoxycarbonyl groups.

Examples of the alkanoyloxyalkyl group include acetyloxymethyl, propionyloxymethyl, butyryloxymethyl, acetyloxyethyl, propionyloxyethyl, butyryloxyethyl, acetyloxypropyl, propionyloxypropyl and butyryloxypropyl groups.

Examples of the saturated hydrocarbon group include linear or branched chain alkylene groups. Examples of the alkylene group include methylene, dimethylene, trimethylene, tetramethylene, pentamethylene, hexamethylene, heptamethylene, octamethylene, nonamethylene, decamethylene, undamethylene, dodecamethylene, tridecamethylene, tetradecamethylene, pentadecamethylene, hexadecamethylene, heptadecamethylene, ethylene, propylene, isoprpoylene, sec-butylene, tert-butylene and propylidene groups.

Furthermore, in the chemical structure formulas of the present specification, unless otherwise specified, the suitable choice of carbon number made for the exemplified substituents are applicable in all of the chemical structure formulas that have the same substituents. Unless otherwise specified, these can include any of linear chain, branched chain or cyclic, and moreover, linear chain, branched chain or cyclic structures can also be combined in the same group.

The term "(meth)acrylic acid", "(meth)acrylate" and "(meth)acryloyl-" mean a compound or a group including a structure "$CH_2$═CH—CO—" or "$CH_2$═C($CH_3$)—CO—", respectively.

In the compound represented by the formula (aa), T is suitably a group represented by the formula (T0), and in particular, preferably a group represented by the formula (T0a).

Further, T is preferably a group represented by the formula (T1), and in particular, more preferably a group represented by the formula (T1a).

Furthermore, T is more preferably a group represented by the formula (T2), and in particular, still more preferably a group represented by the formula (T2a).

(T0)

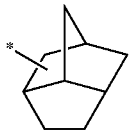

(T0a)

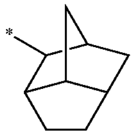

(T1)

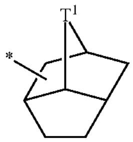

(T1a)

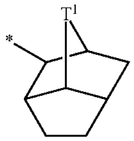

(T2)

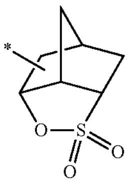

(T2a)

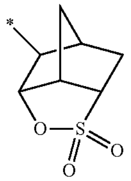

where the hydrogen atom contained in the ring may be replaced by a halogen atom, a hydroxyl group, a $C_1$ to $C_{12}$ alkyl group optionally substituted with a halogen atom or a hydroxyl group, a $C_1$ to $C_{12}$ alkoxyl group, a $C_6$ to $C_{12}$ aryl group, a $C_7$ to $C_{12}$ aralkyl group, a glycidyloxy group, a $C_2$ to $C_4$ acyl group, an alkoxycarbonyl group, an alkanoyloxyalkyl group or a cyano group, and the —$CH_2$— contained in the ring is replaced by at least one —$SO_2$— and furthermore may be replaced by —CO—, —O—, —S—, $SO_2$— or —N($R^c$)—;

$R^c$ represents the same meaning as defined above;

* represents a bond to an oxygen atom; and $T^1$ represents an oxygen atom or a methylene group.

$R^1$ is preferably a hydrogen atom or a methyl group.

The —$CH_2$— contained in $Z^1$ is preferably replaced by —O—, —CO—, —S— or —N($R^c$)—. $R^c$ is preferably a hydrogen atom.

Examples include —O—$X^{11}$—, —$X^{11}$—O—, —$X^{11}$—CO—O—, —$X^{11}$—O—CO—, —$X^{11}$—O—$X^{12}$—, —NH—$X^{11}$—, —$X^{11}$—NH—. It is preferably —O—$X^{11}$—, —$X^{11}$—O—, —$X^{11}$—CO—O—, —NH—$X^{11}$— and —$X^{11}$—NH—, and more preferably —O—$X^{11}$— and —NH—$X^{11}$—. In particularly, it is more preferably —O—$CH_2$— for $Z^1$.

Here, $X^{11}$ and $X^{12}$ independently represent a single bond, or a linear or branched chain $C_1$ to $C_{15}$ alkylene group. Provided that, for the group that replaces the methylene group contained in the alkylene group, a suitable number of atoms to constitute the main chain in the abovementioned group is 1 to 17, preferably 1 to 10, and more preferably 1 to 5.

Specific examples of T include the followings. The * represents the position of a bond to an oxygen atom.

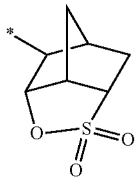
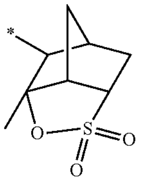
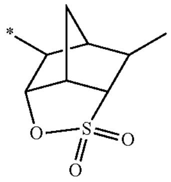
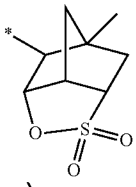
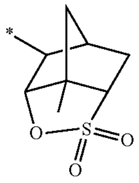
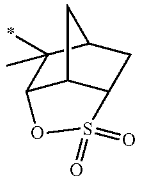
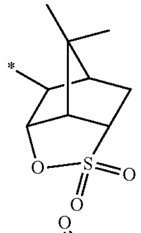
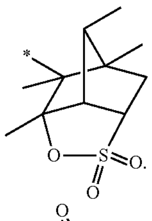
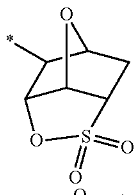
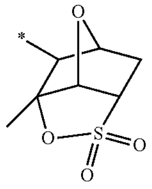
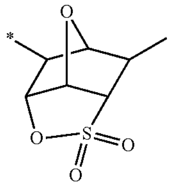
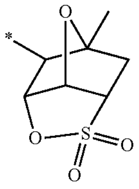

-continued

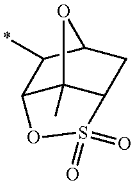 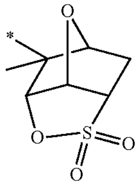 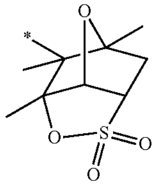

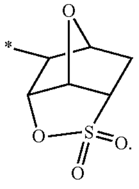 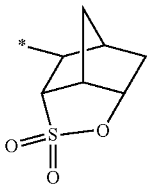 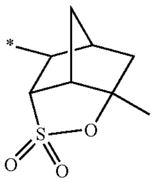

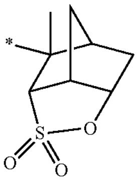 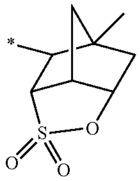 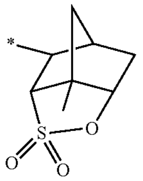

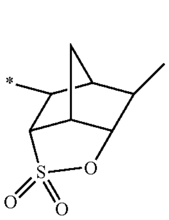 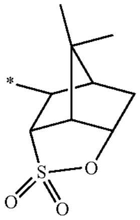 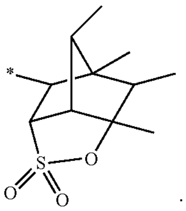

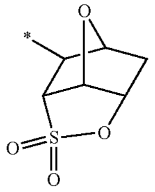 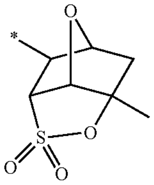 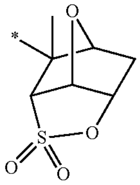

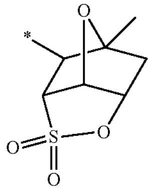 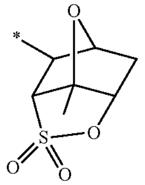 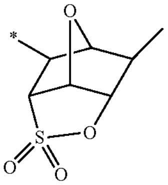

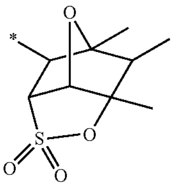 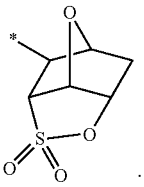

In addition to the examples of groups shown above, moreover, T may be substituted with a halogen atom, a hydroxyl group, a $C_1$ to $C_{12}$ alkyl group optionally substituted with a halogen atom or a hydroxyl group, a $C_1$ to $C_{12}$ alkoxyl group, a $C_6$ to $C_{12}$ aryl group, a $C_7$ to $C_{12}$ aralkyl group, a glycidyloxy group, a $C_2$ to $C_4$ acyl group, an alkoxycarbonyl group, an alkanoyloxyalkyl group or a cyano group as shown in the compounds below.

Examples of the compound represented by the formula (aa) include the followings.

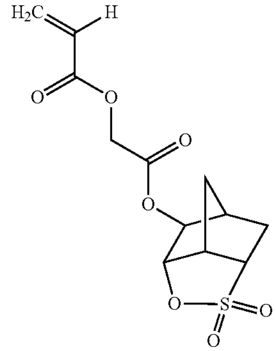 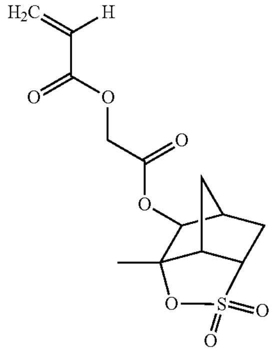

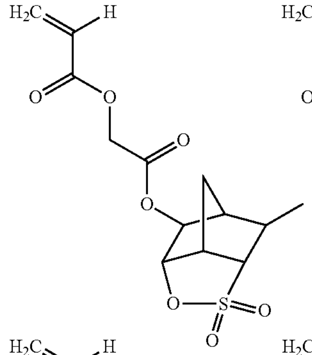 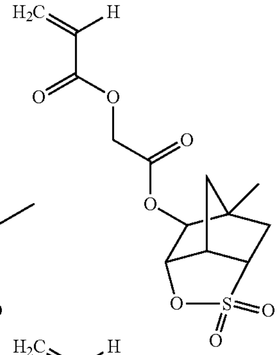

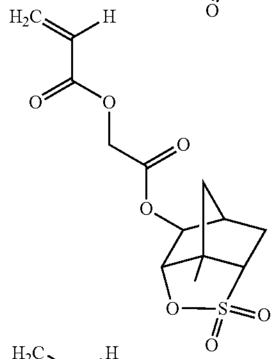 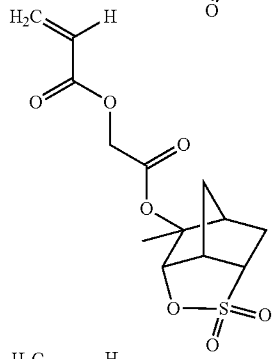

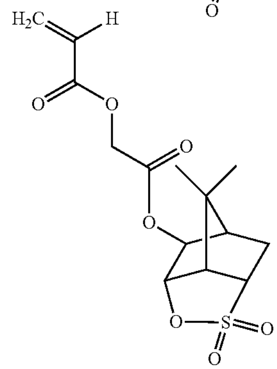 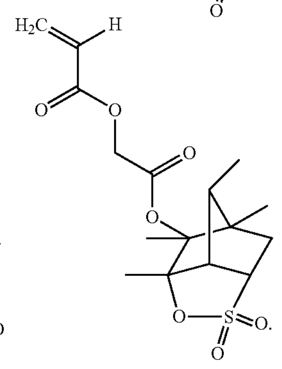

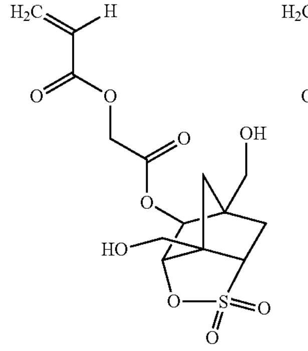 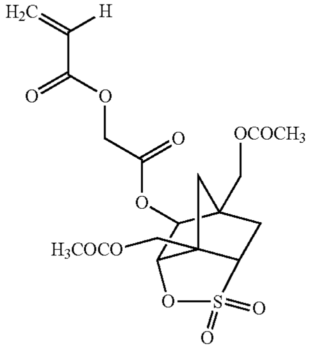

-continued
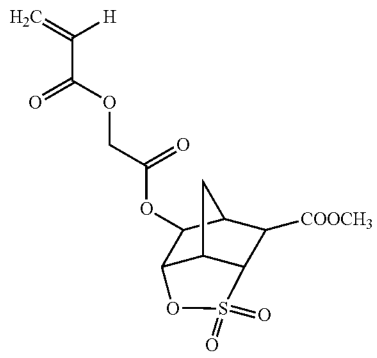
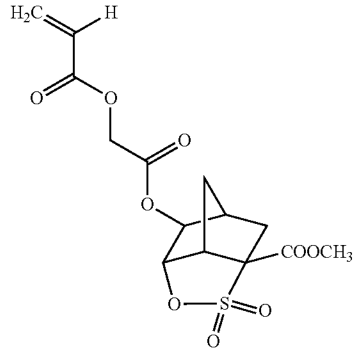
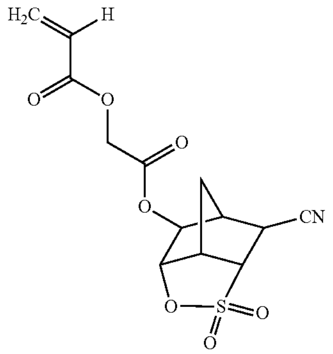
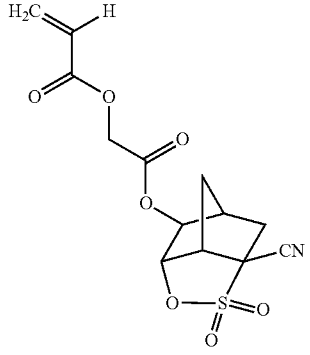
-continued
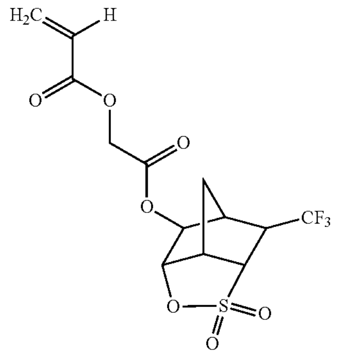
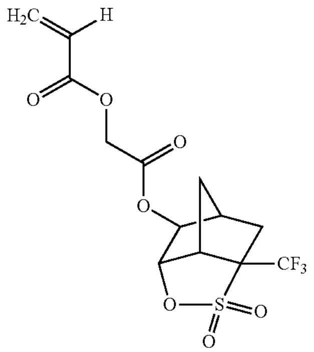
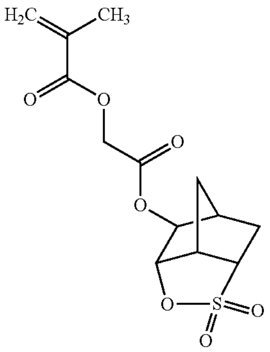
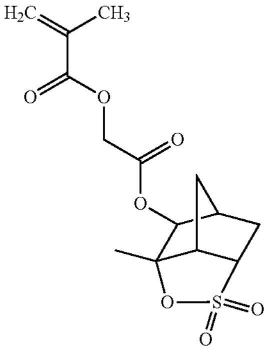
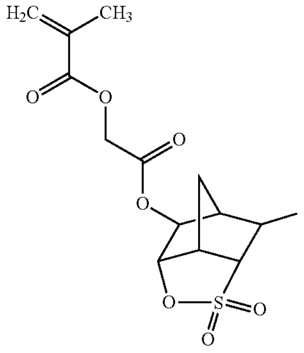
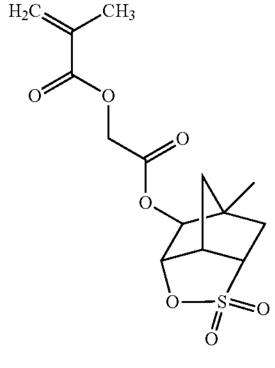
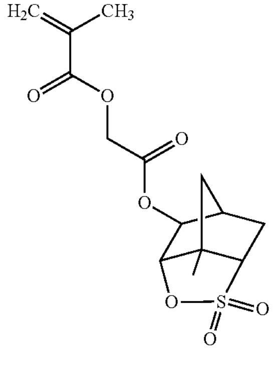

-continued
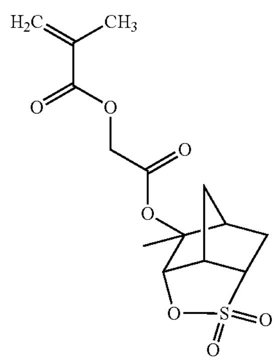
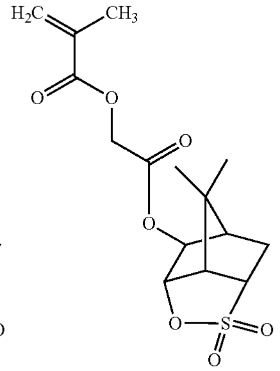
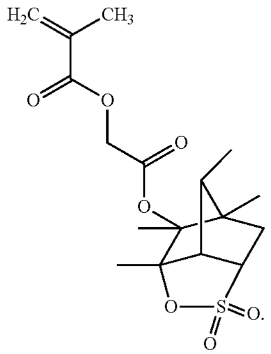
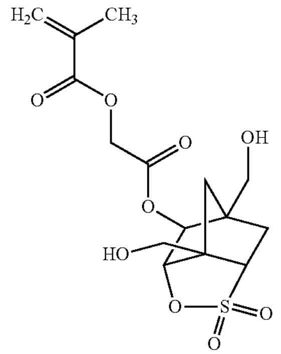
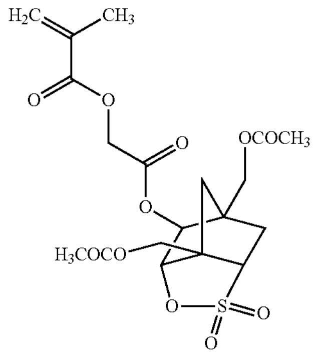
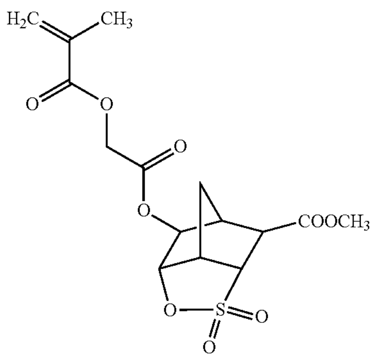
-continued
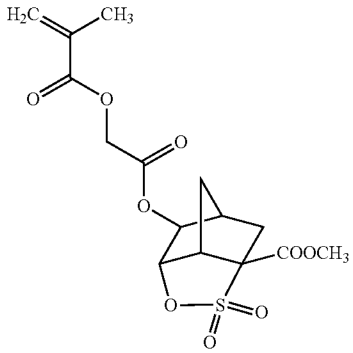
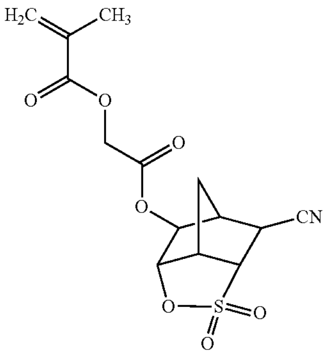
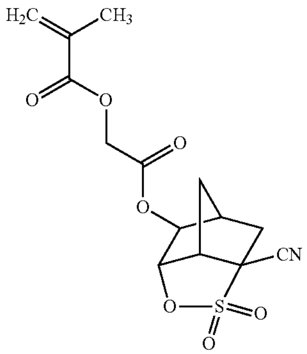
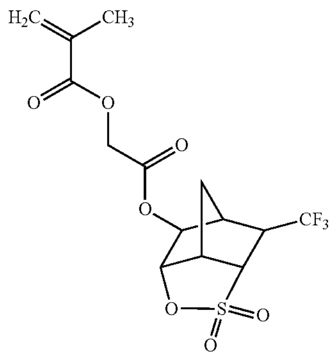

-continued
-continued
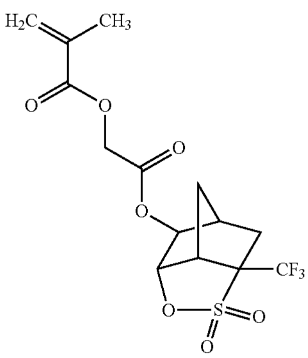
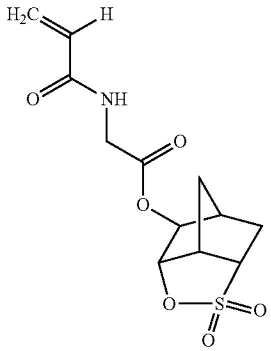
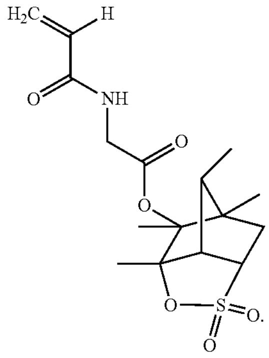
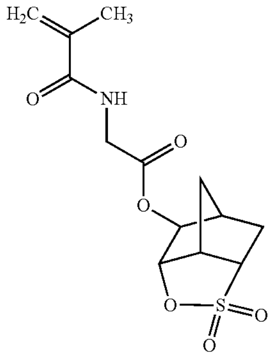
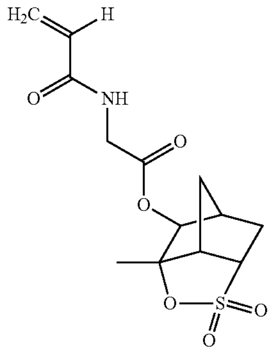
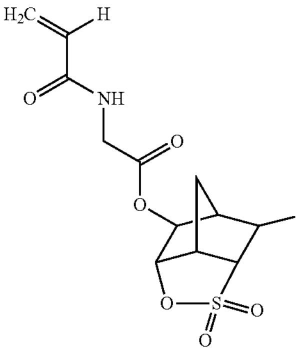
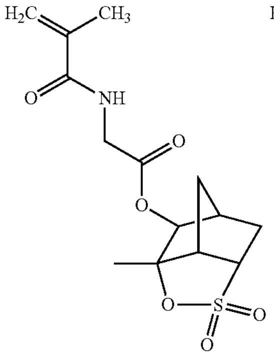
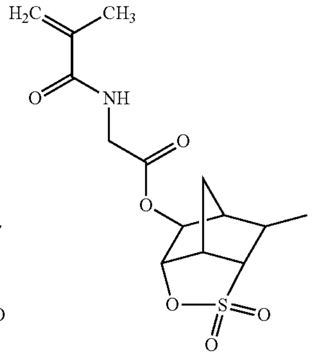
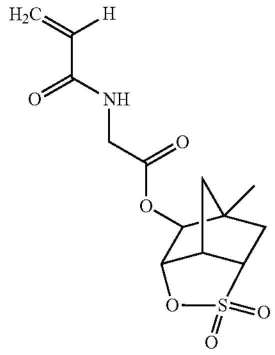
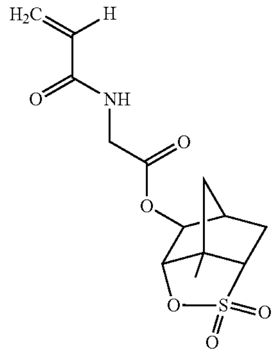
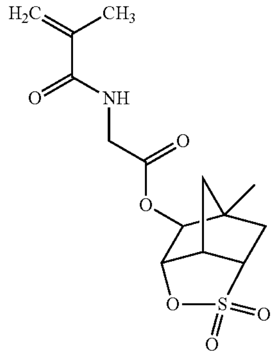
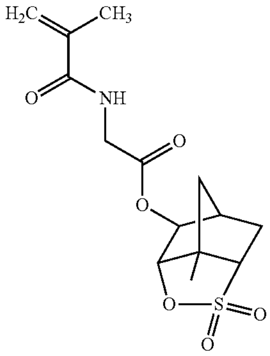
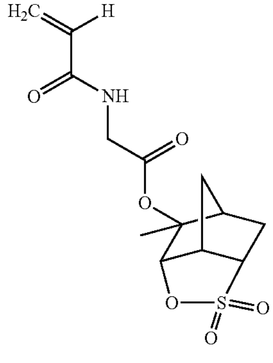
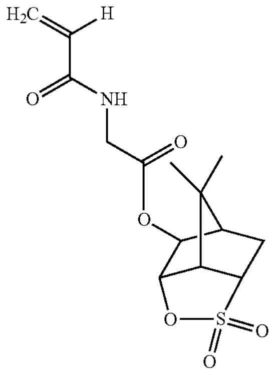
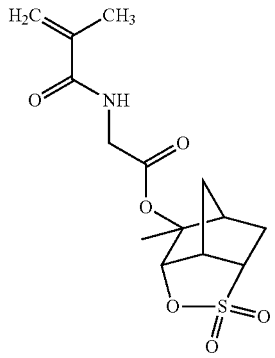
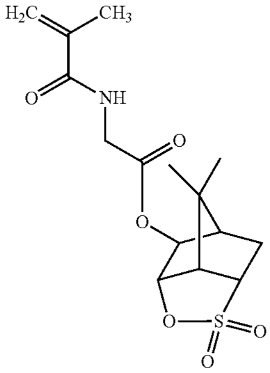

-continued
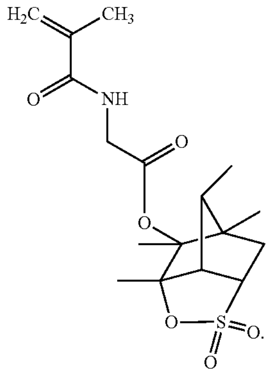
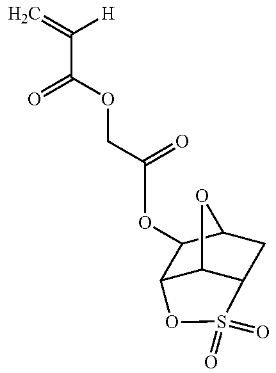
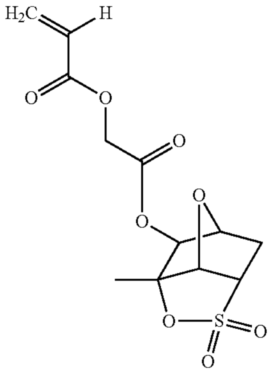
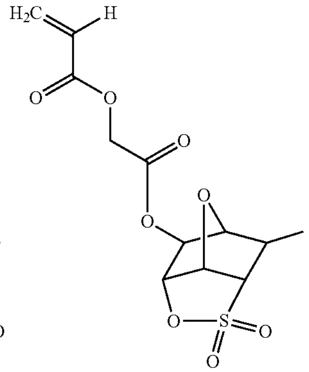
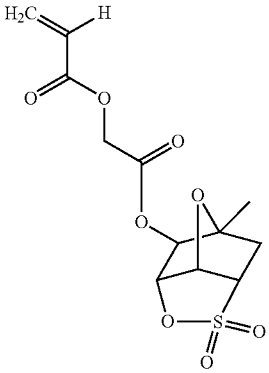
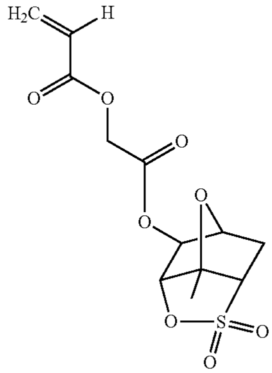
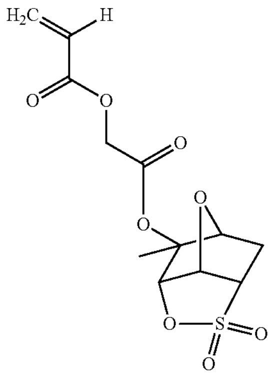
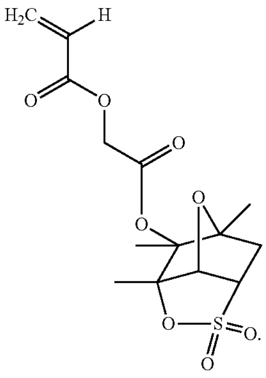
-continued
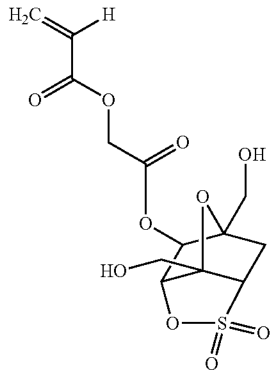
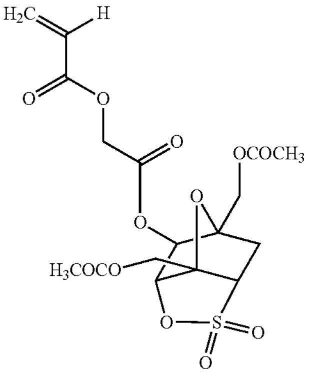
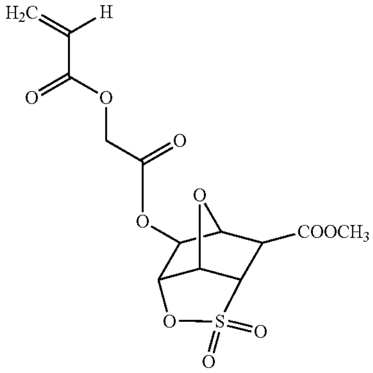
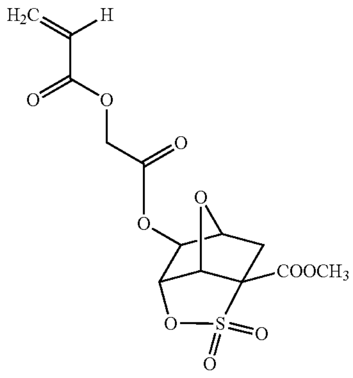

-continued
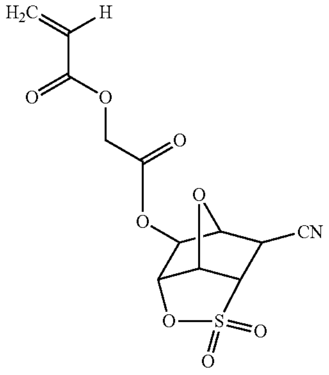
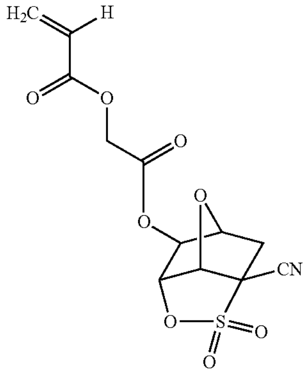
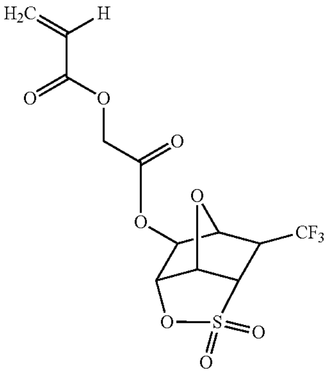
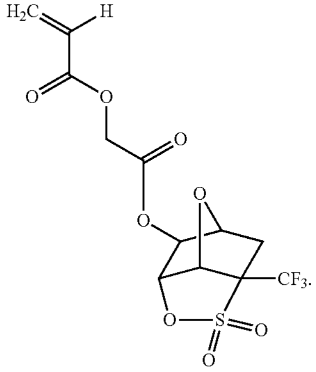
-continued
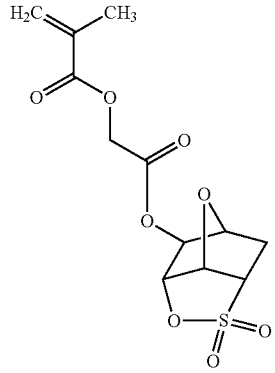
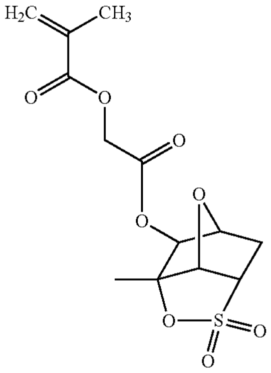
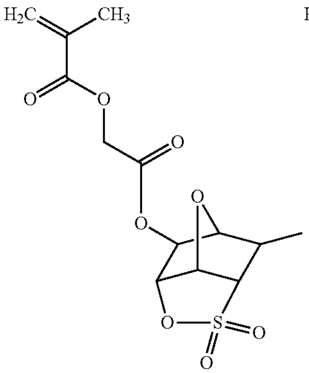
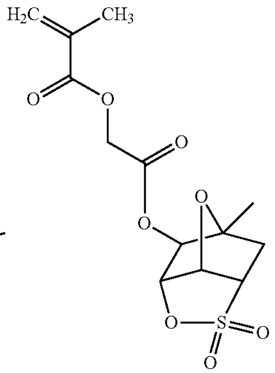
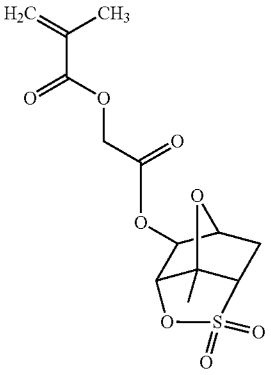
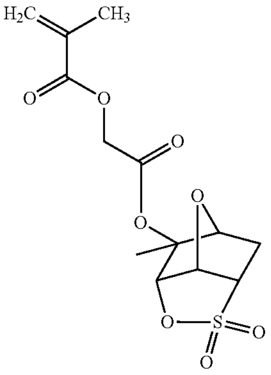
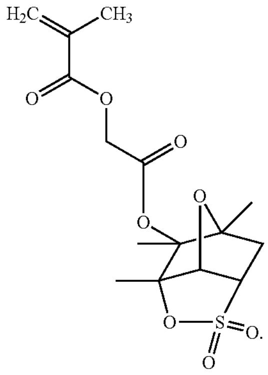
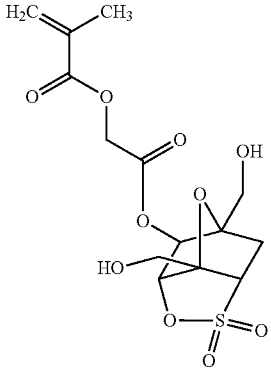

-continued
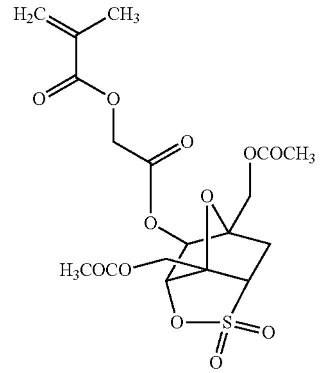
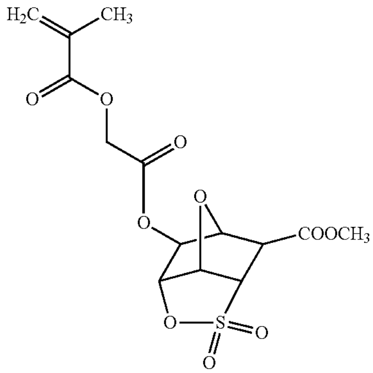
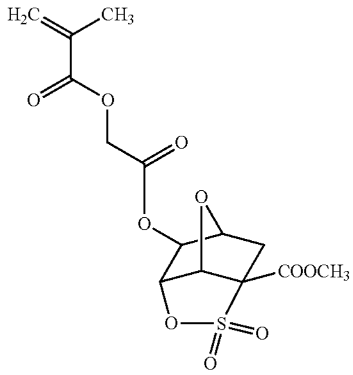
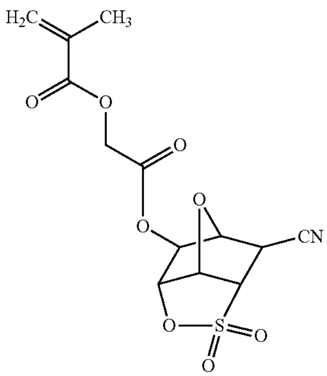
-continued
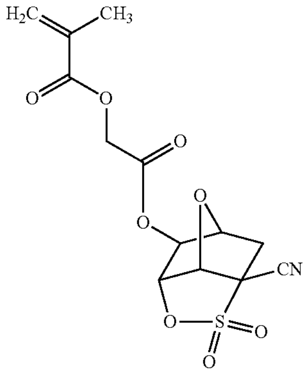
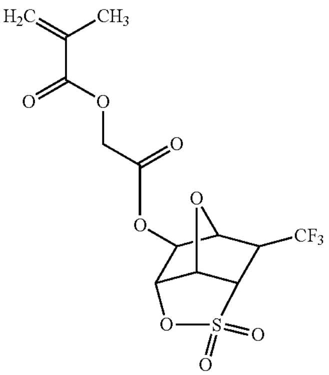
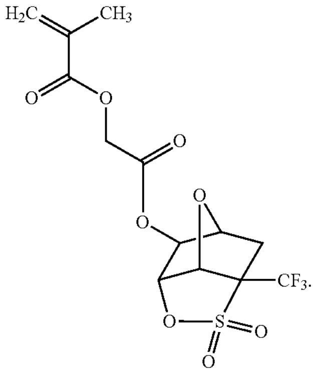
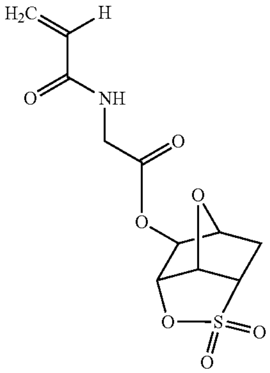
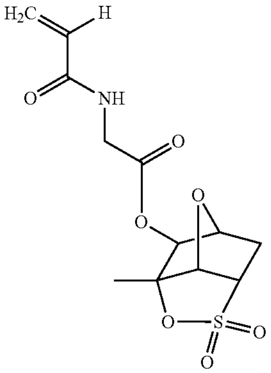

-continued
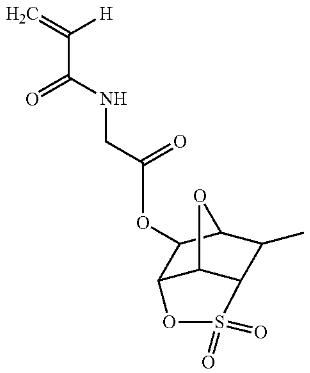
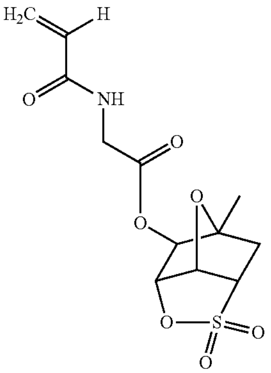
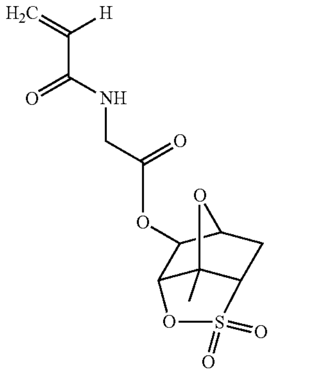
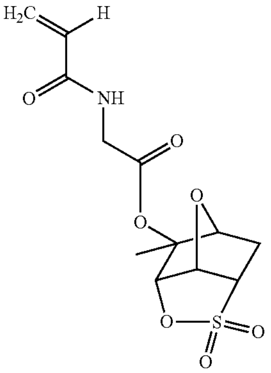
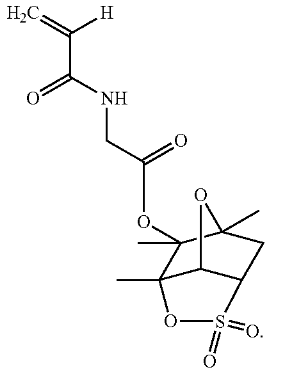
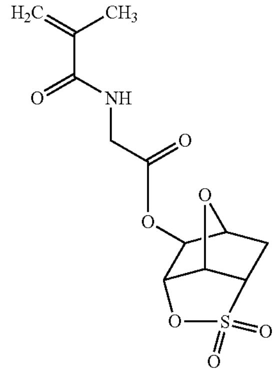
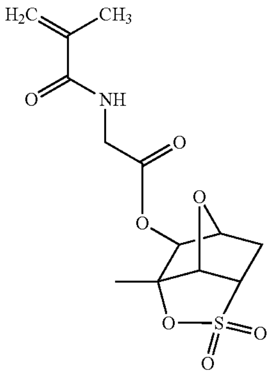
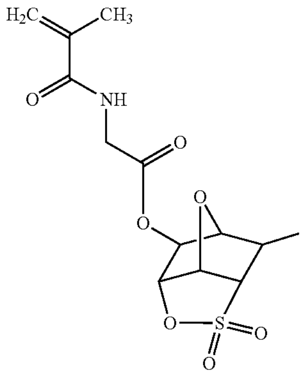
-continued
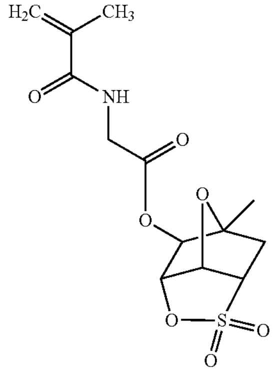
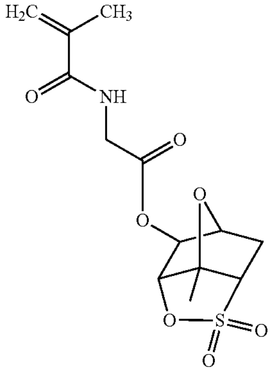
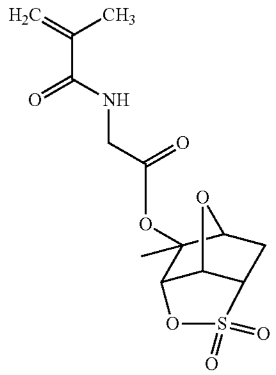
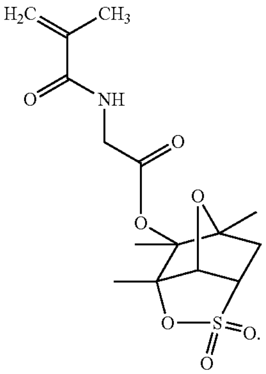
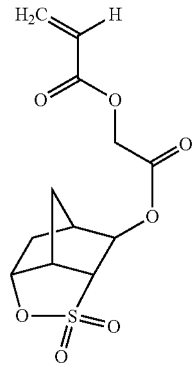
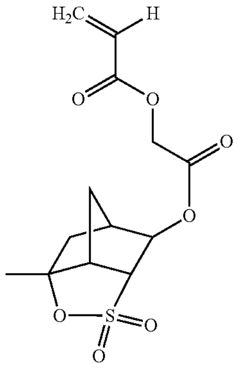
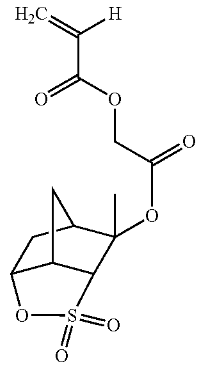

-continued
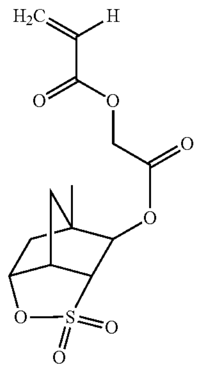
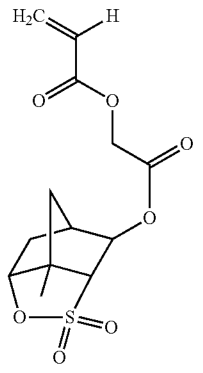
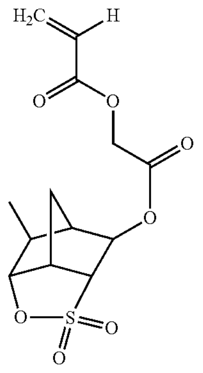
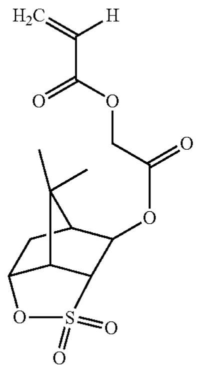
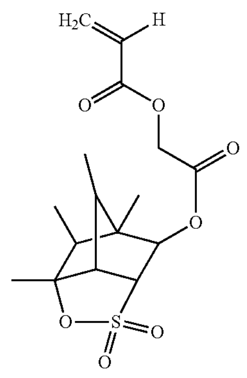
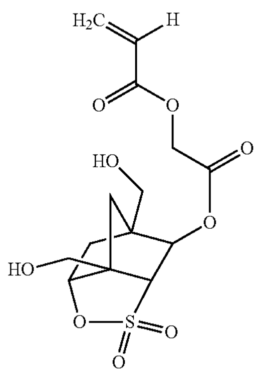
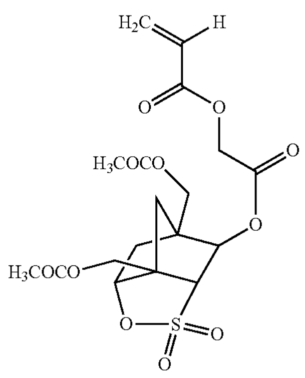
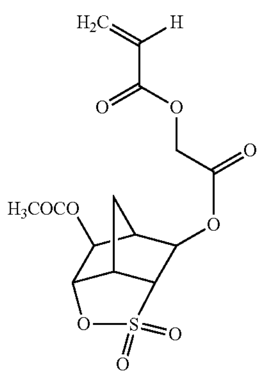
-continued
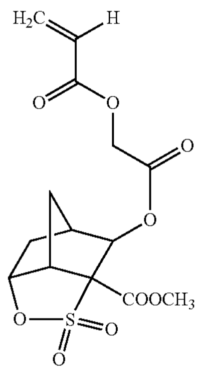
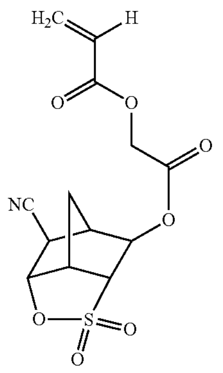
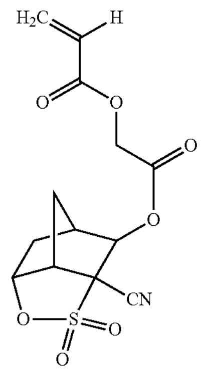
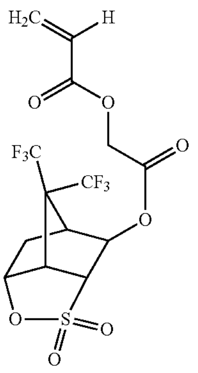
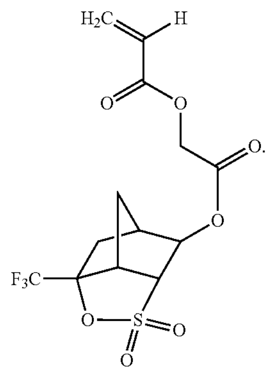
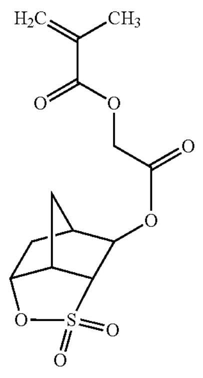
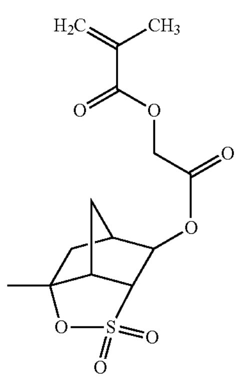
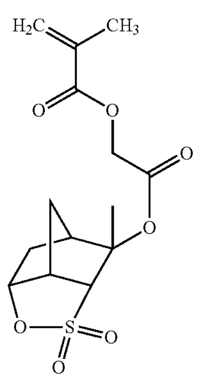

-continued
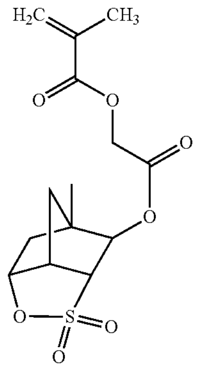
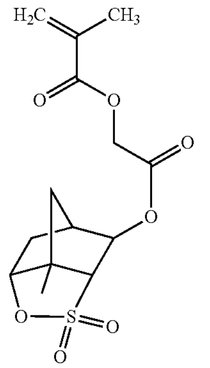
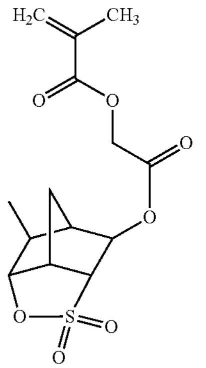
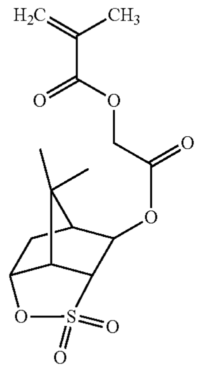
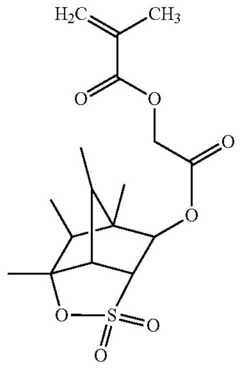
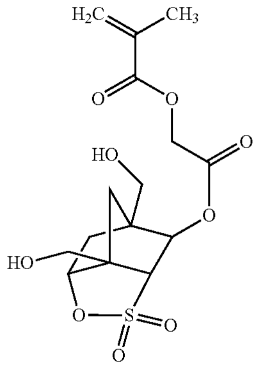
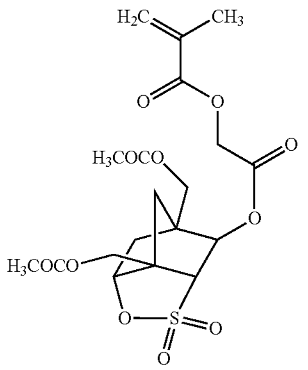
-continued
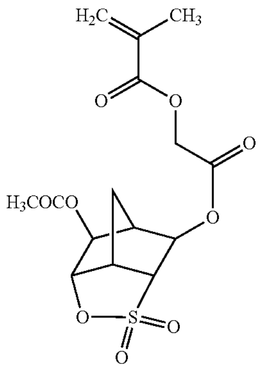
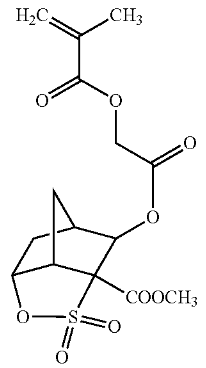
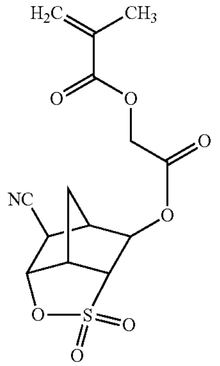
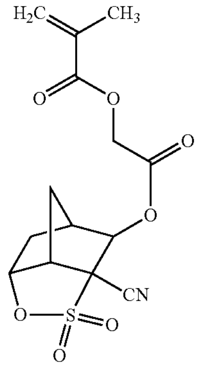
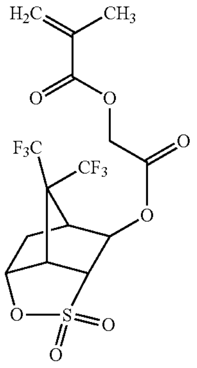
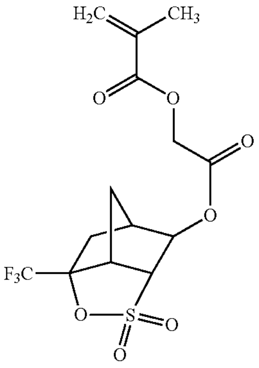
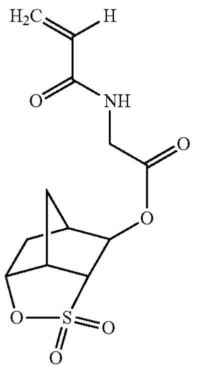
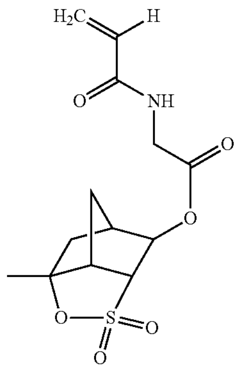

-continued
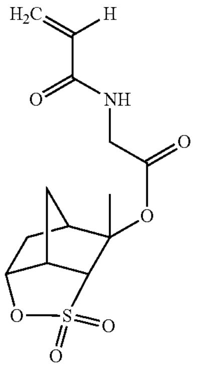
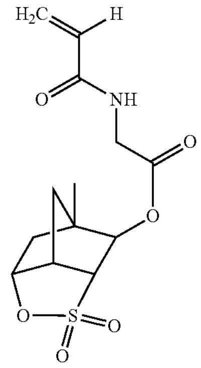
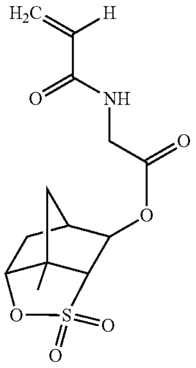
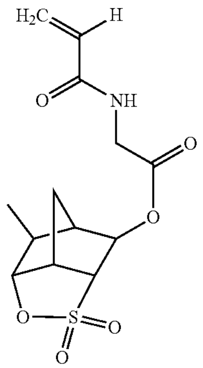
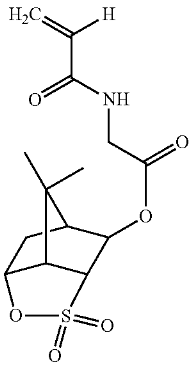
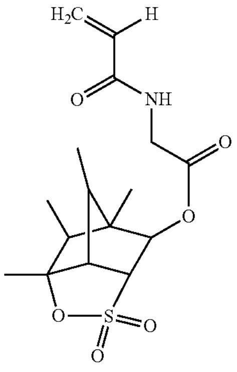
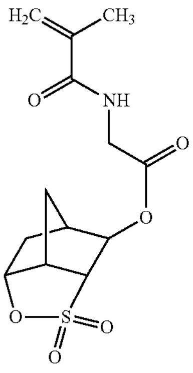
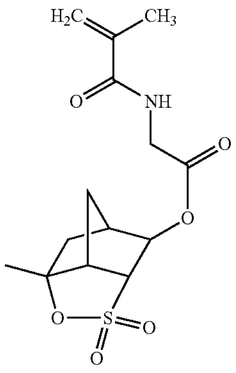
-continued
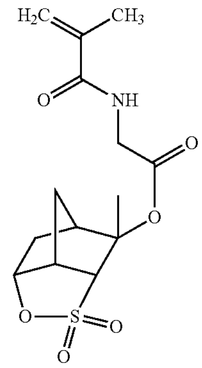
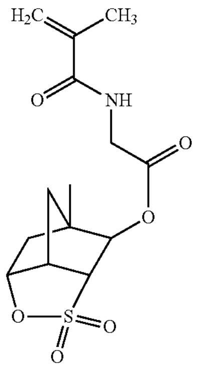
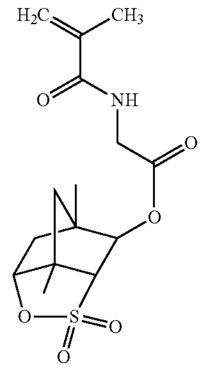
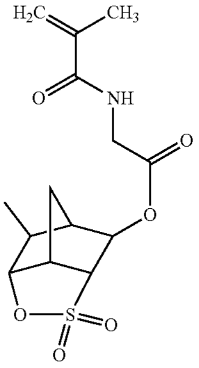
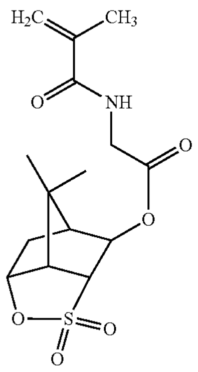
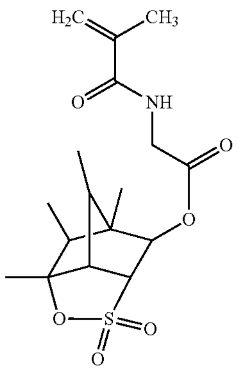
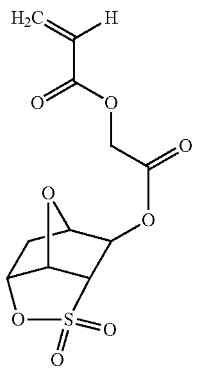
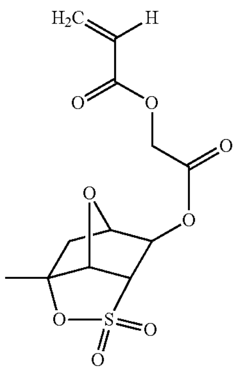

-continued
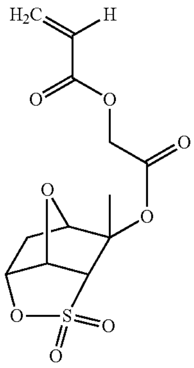
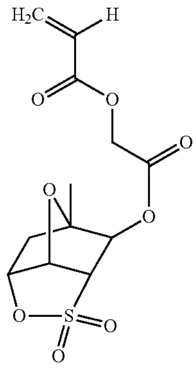
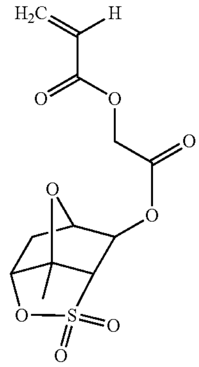
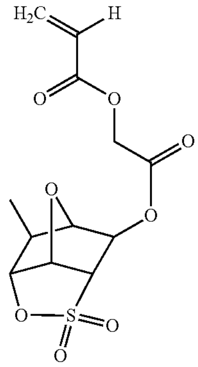
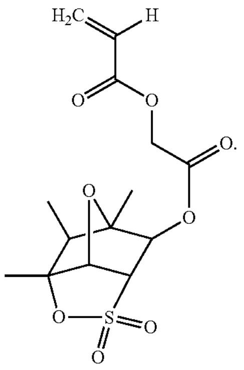
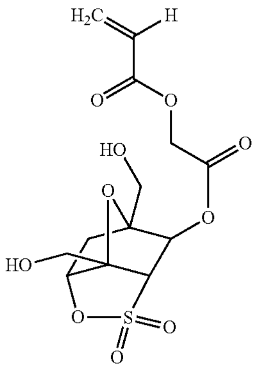
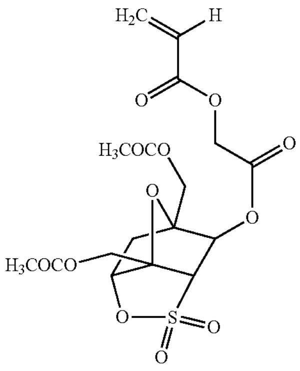
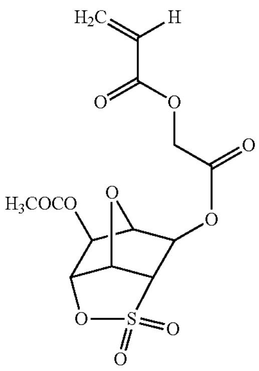
-continued
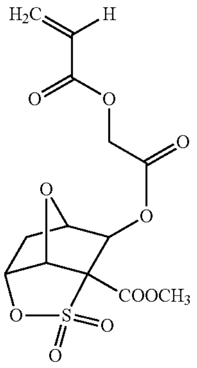
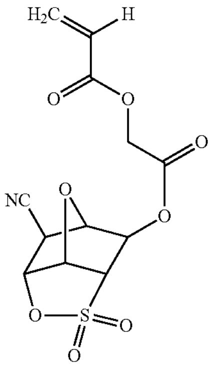
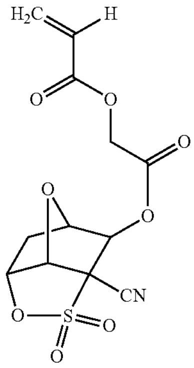
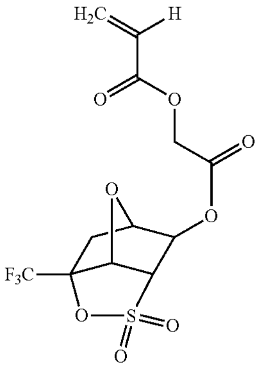
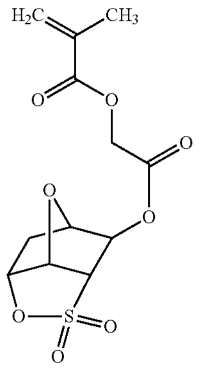
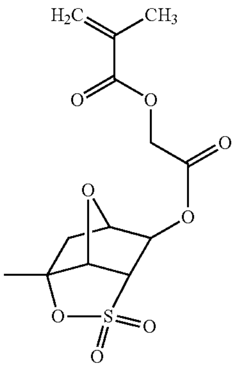
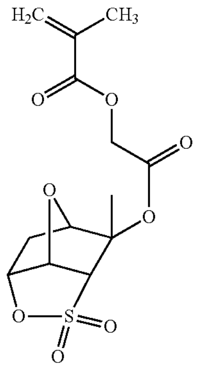
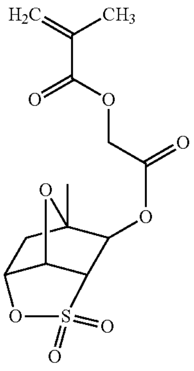

-continued
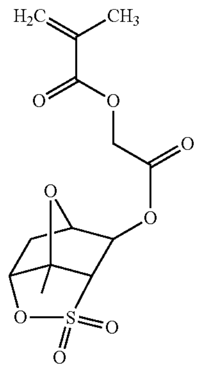
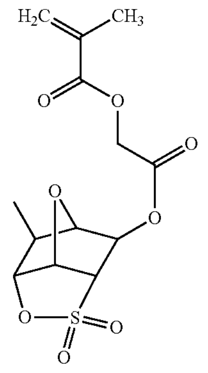
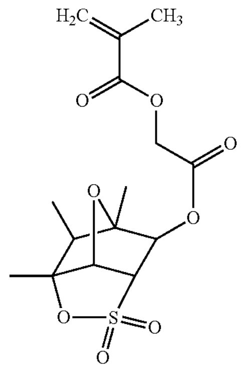
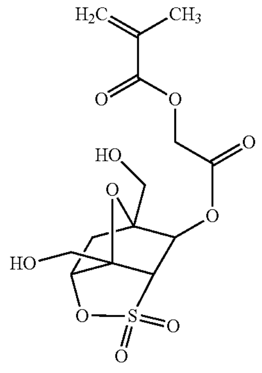
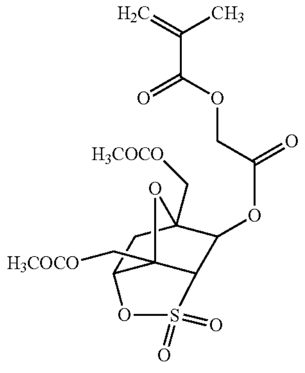
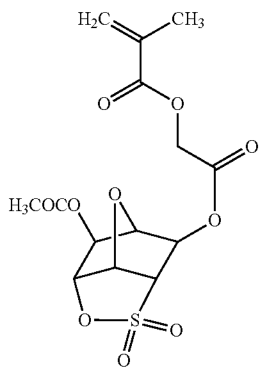
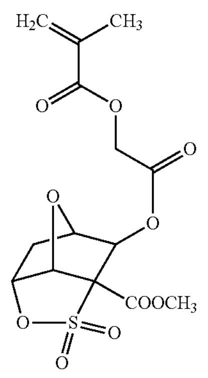
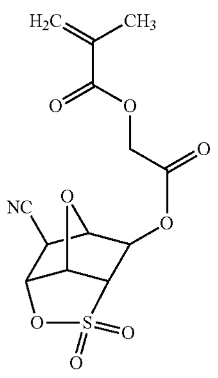
-continued
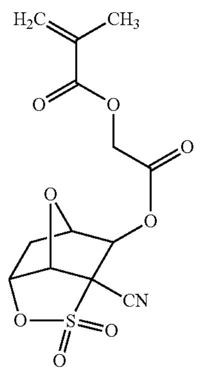
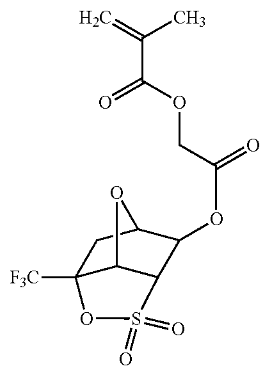
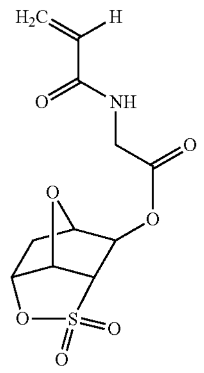
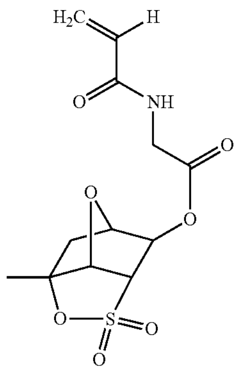
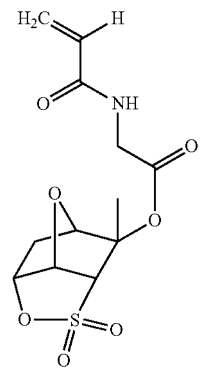
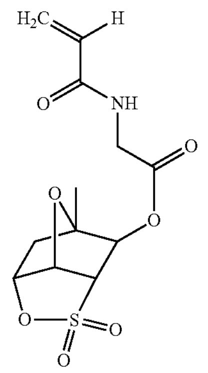
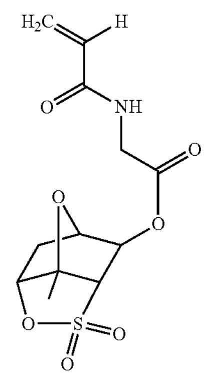
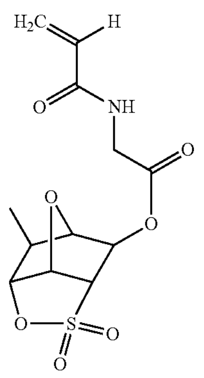

-continued

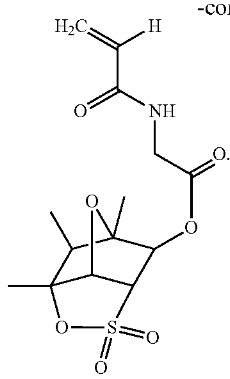
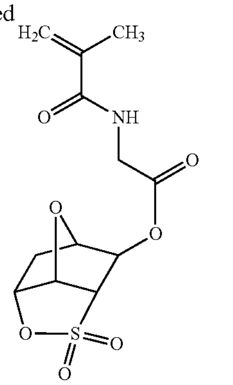
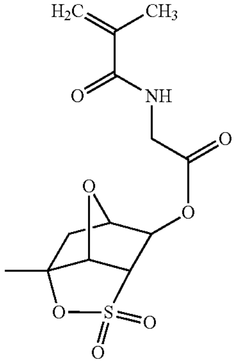
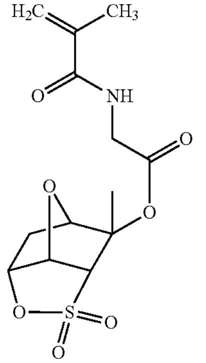
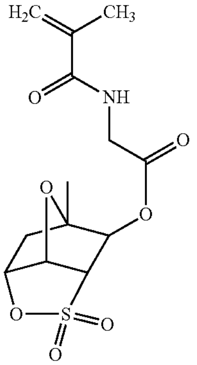
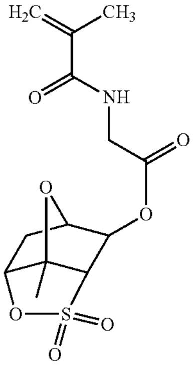
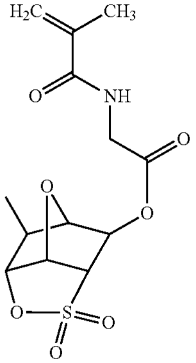
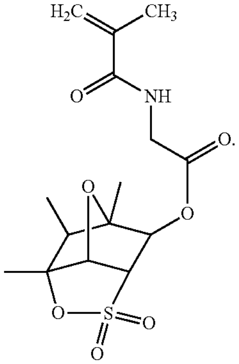

The compounds represented by the abovementioned the formula (aa) can be produced using methods known in the art.

The content of the structural unit derived from the compound represented by the formula (aa) in the resin is generally a range of 2 to 40 mol %, preferably 3 to 35 mol %, and more preferably 5 to 30 mol %, with respect to the total structural units constituting the resin.

In addition to the structural units derived from the compound represented in the formula (aa), resin (B) preferably contains a structural unit derived from a compound that has a norbornane lactone structure.

Examples of the compound having the norbornane lactone structure include a compound represented by the formula (bb).

(bb)

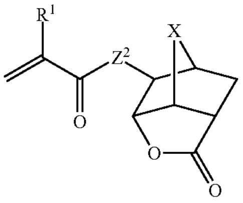

wherein $R^1$ is the same meaning as defined above;

$Z^2$ represents an optionally substituted $C_1$ to $C_{17}$ saturated hydrocarbon group, and the $-CH_2-$ contained in the saturated hydrocarbon group may be replaced by $-CO-$, $-O-$, $-S-$ or $-SO_2-$;

X represents $-O-$, or $-S-$ or $-CH_2-$.

$R^1$ is preferably a hydrogen atom or a methyl group.

Examples of the compound represented by the formula (bb) include the followings.

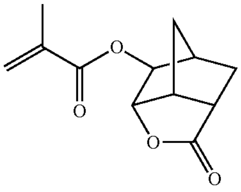
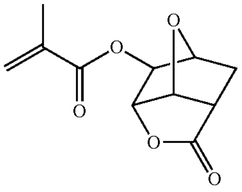
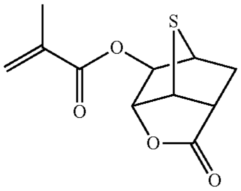
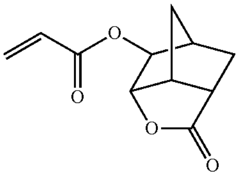
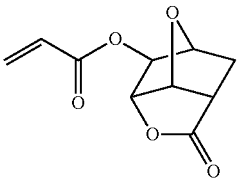
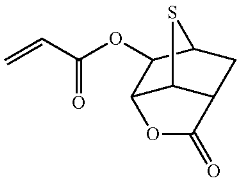
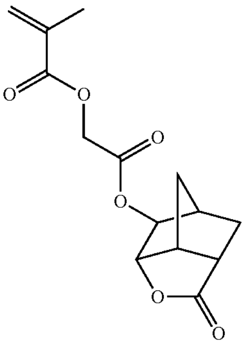
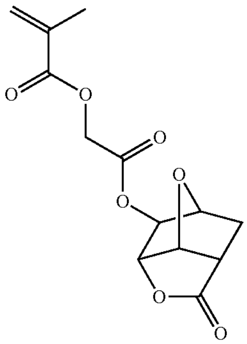

-continued
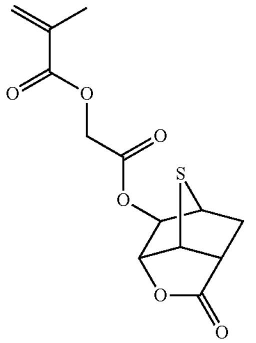
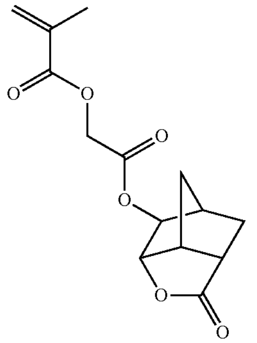
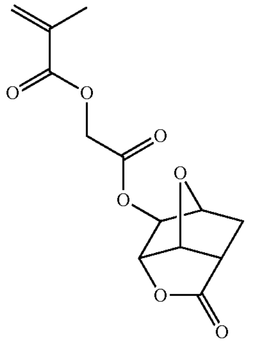
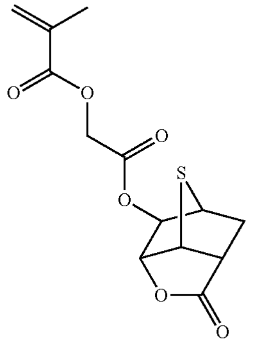
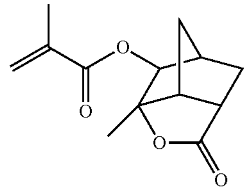
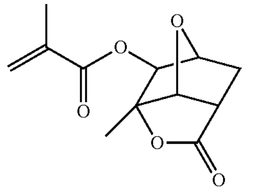
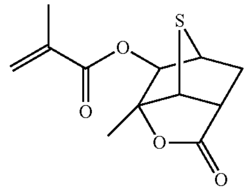
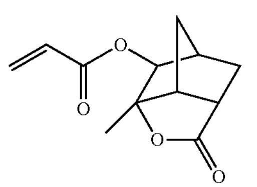
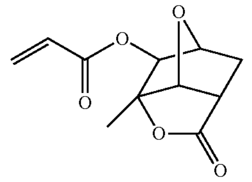
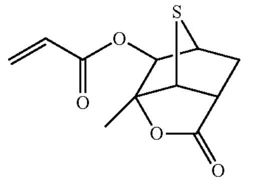
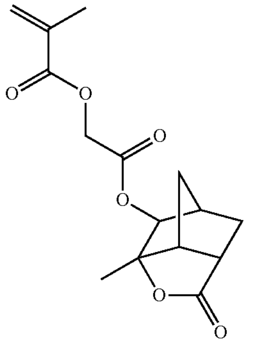
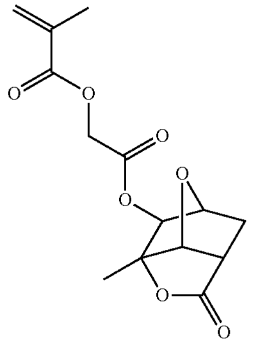
-continued
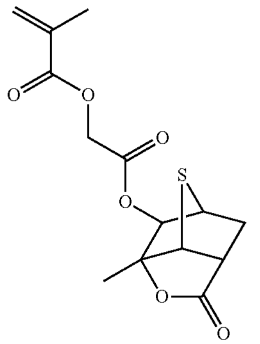
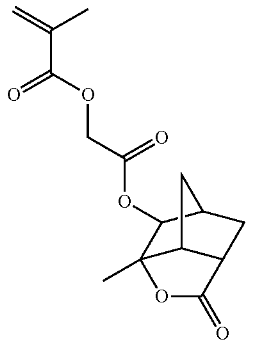
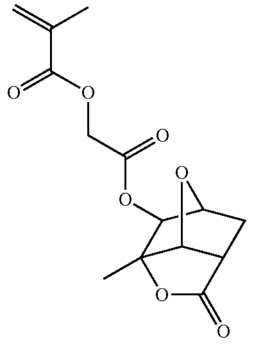
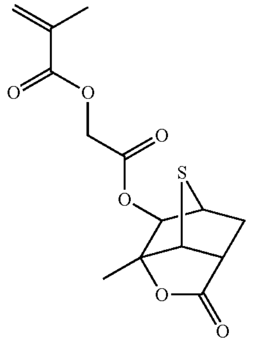
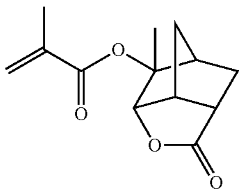
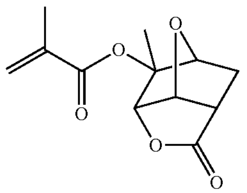
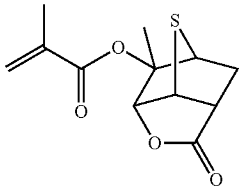
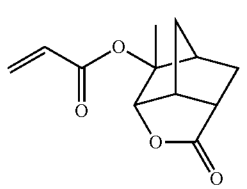
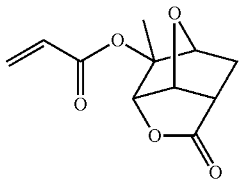
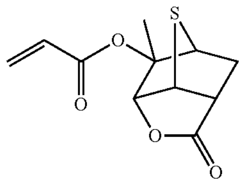
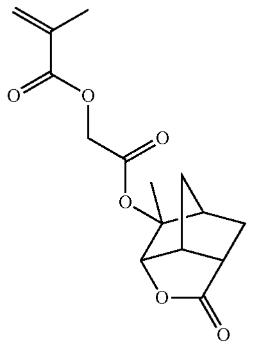
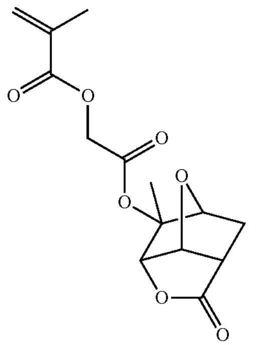

-continued
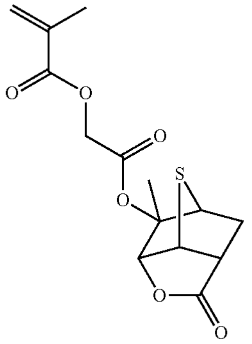
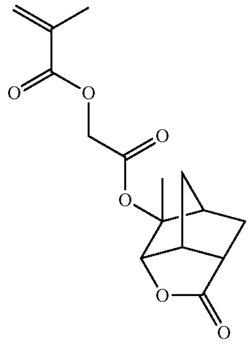
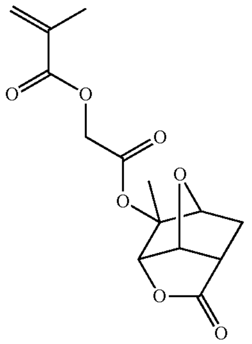
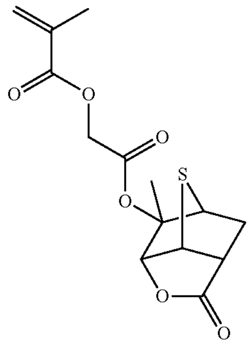
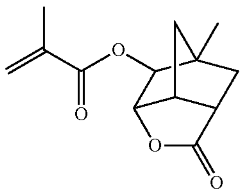
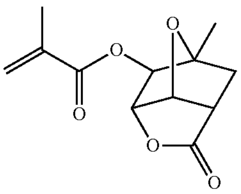
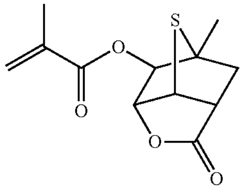
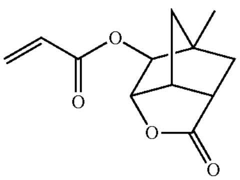
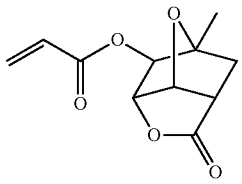
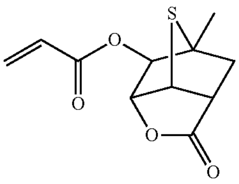
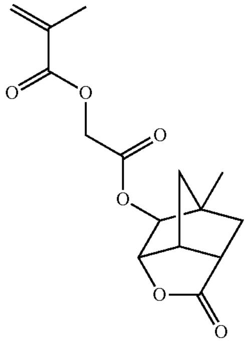
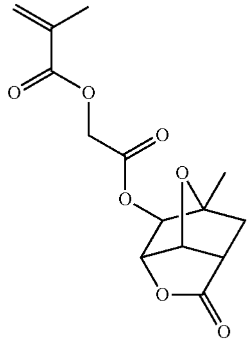
-continued
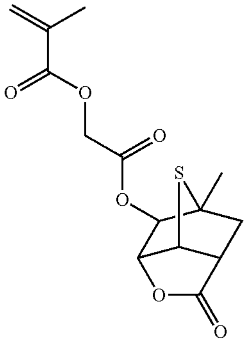
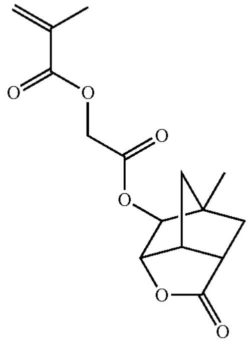
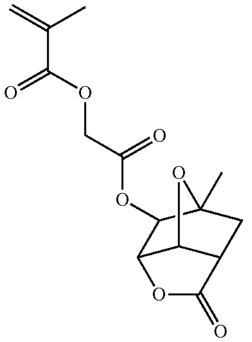
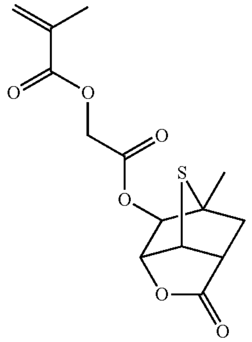
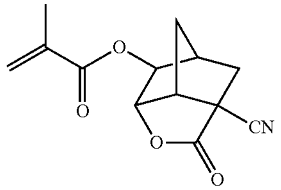
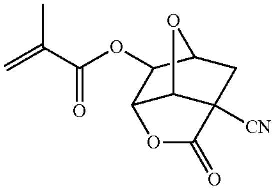
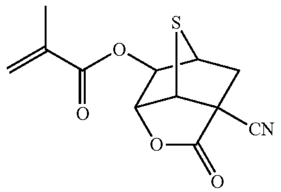
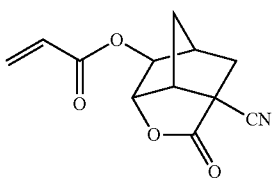
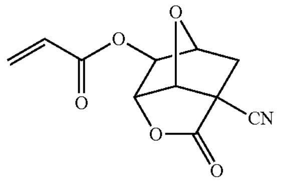
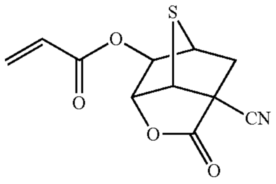
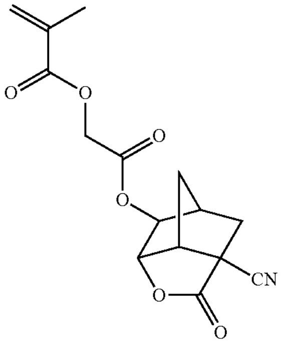
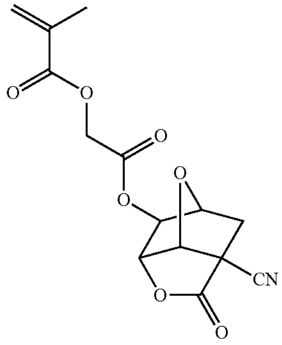

-continued
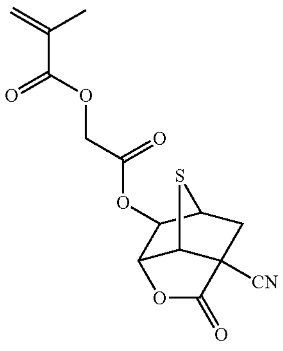
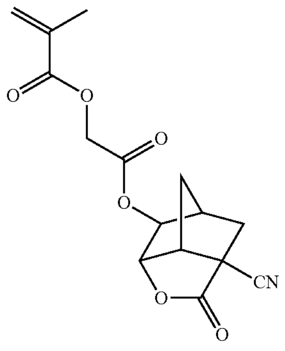
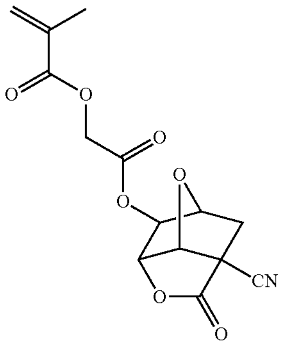
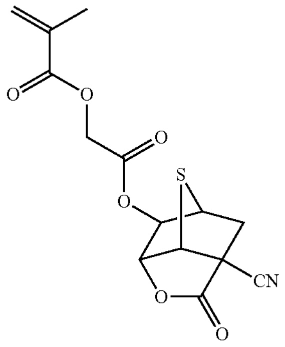
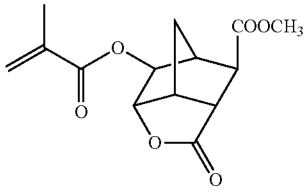
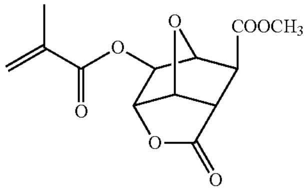
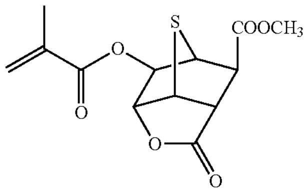
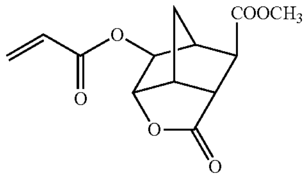
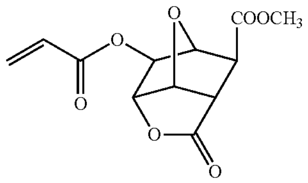
-continued
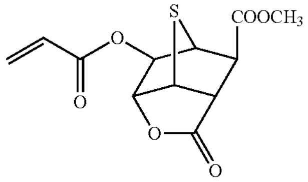
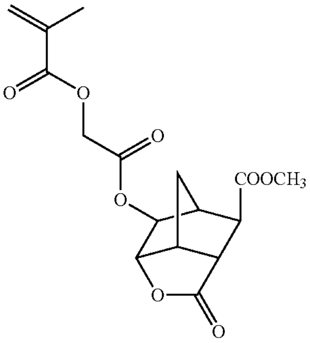
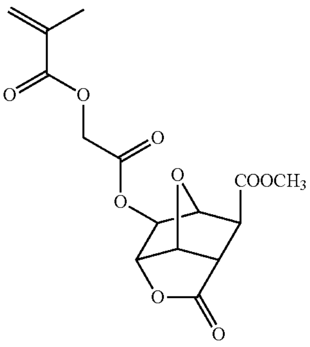
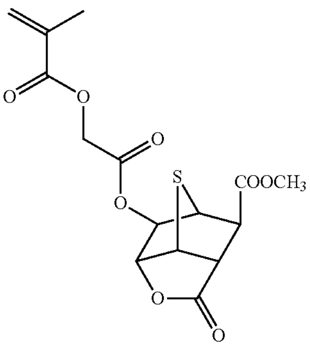
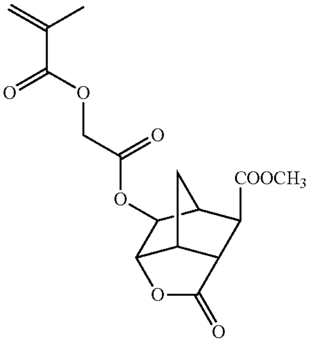

-continued

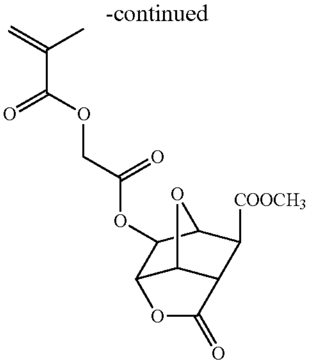

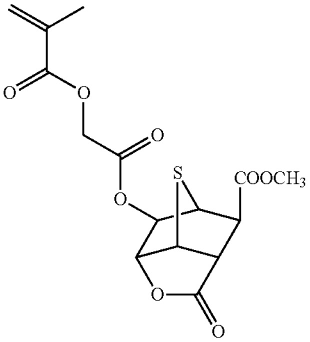

The content of the structural unit derived from a compound represented by the formula (bb) in the resin is generally 5 to 50 mol %, preferably 10 to 45 mol %, and more preferably 15 to 40 mol %, with respect to the total structural units constituting the resin.

The resin further preferably includes a structural unit derived from a compound having an adamantyl group substituted with at least one hydroxyl group.

Examples of the compound having an adamantyl group substituted with at least one hydroxyl group include a compound represented by the formula (cc).

(cc)

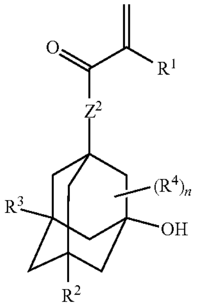

wherein $R^1$ and $Z^2$ represent the same meaning as defined above;

$R^2$ and $R^3$ independently represent a hydrogen atom, a methyl group or a hydroxyl group;

$R^4$ is independently in each occurrence a $C_1$ to $C_6$ alkyl group; and n represents an integer of 0 to 10.

$R^1$ is preferably a hydrogen atom or a methyl group.

The compound represented by the formula (cc) is preferably a compound having an adamantyl group substituted with at least two hydroxyl groups in which either $R^2$ or $R^3$ is substituted with a hydroxyl group.

Examples of the compound represented by the formula (cc) include the followings.

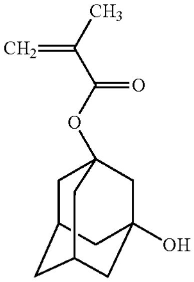
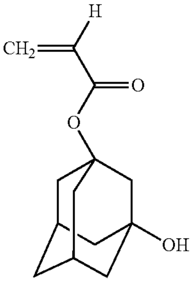

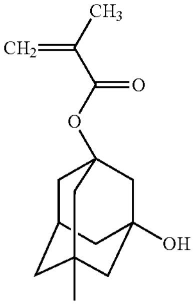
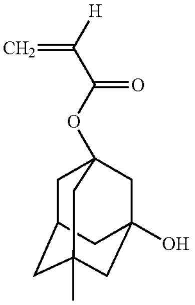

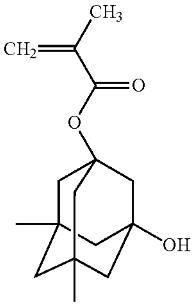
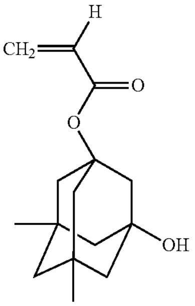

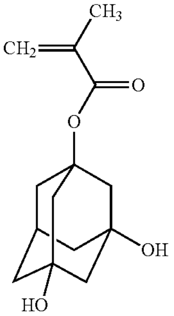
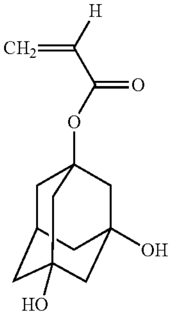

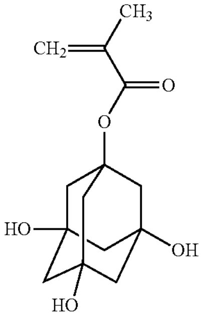
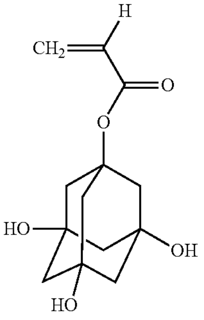

-continued
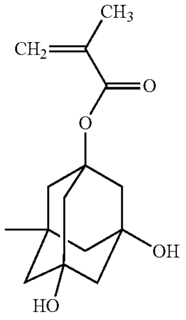
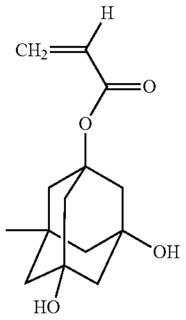
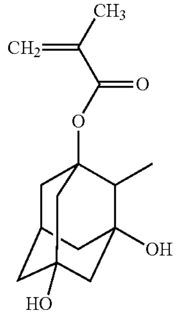
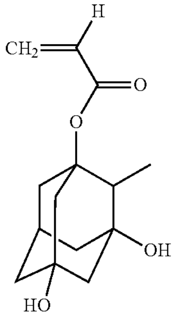
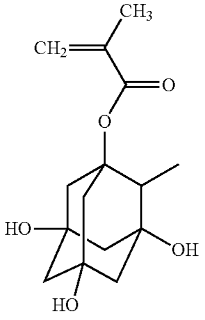
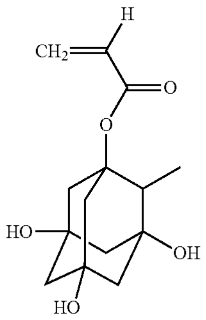
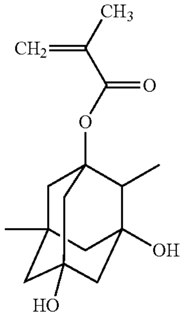
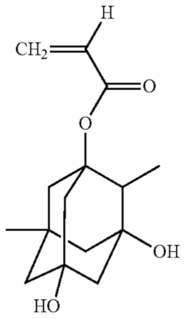
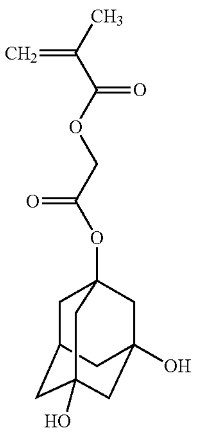
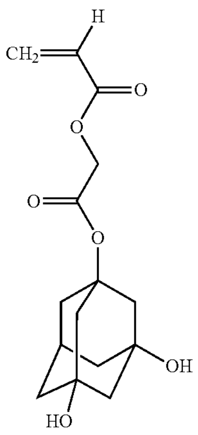
-continued
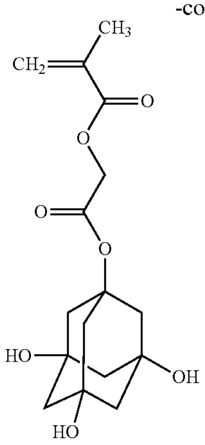
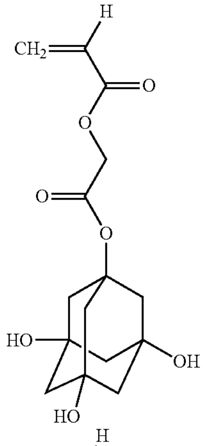
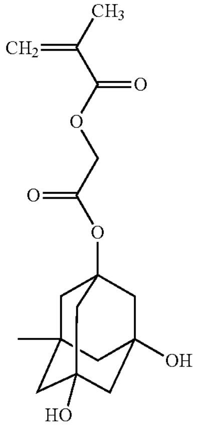
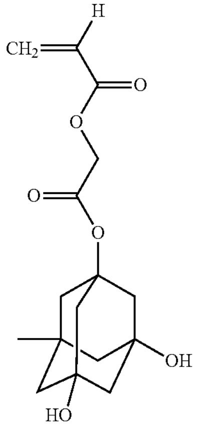
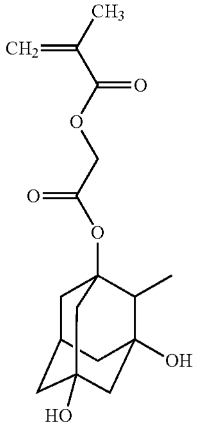
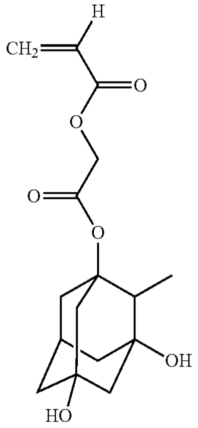
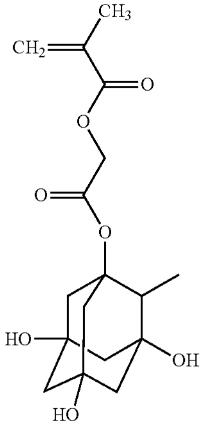
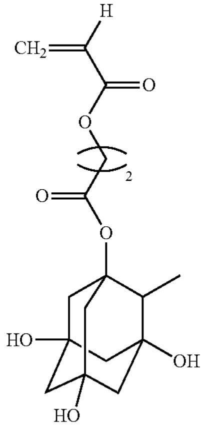

The content of the structural unit derived from the compound represented by the formula (cc) in the resin is generally 3 to 40 mol %, preferably 5 to 35 mol %, and more preferably 5 to 30 mol %, with respect to the total structural units constituting the resin.

The resin furthermore preferably has an acid-labile group, is insoluble or poorly soluble in aqueous alkali solution, and dissolves in aqueous alkali solution by the action of acid.

Examples of the acid-labile group include a group having alkyl ester in which a carbon atom adjacent to the oxygen atom is quaternary carbon atom, a group having carboxylic acid ester such as an alicyclic ester group, a lactone ester group in which a carbon atom adjacent to the oxygen atom is quaternary carbon atom.

The "quaternary carbon atom" means a carbon atom unbonded to a hydrogen atom and bonded to four substituents other than hydrogen atom. As the acid-labile group, it is preferable a quaternary carbon atom in which a carbon atom adjacent to the oxygen atom of ether bond is bonded to three carbon atoms.

If an R ester of —COOR may be described as a group having ester of carboxylic acid which is one of the acid-labile group, and may also be abbreviated "—COOC$(CH_3)_3$" as "tert-butyl ester", examples include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxyl)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom, such as an isobornyl ester, 1-alkylcycloalkyl ester, 2-alkyl-2-adamantyl ester and 1-(1-adamantyl)-1-alkylalkyl ester group.

Examples of the group having ester of carboxylic acid include a group having an ester of (meth)acrylic acid, norbornene carboxylic acid, tricyclodecenecarboxylic acid or tetracyclodecenecarboxylic acid.

The resin of the present invention can be produced by conducting addition polymerization reaction of a monomer or monomers having the acid-labile group and an olefinic double bond.

Among the monomers, as the acid-labile group, those having a bulky group such as an alicyclic structure (e.g. a 2-alkyl-2-adamantyl and a 1-(1-adamantyl)-1-alkylalkyl groups) are preferable, since excellent resolution tends to be obtained when the resin obtained is used.

Examples of such monomer containing the bulky group include a 2-alkyl-2-adamantyl(meth)acrylate, 1-(1-adamantyl)-1-alkylalkyl(meth)acrylate, a 2-alkyl-2-adamantyl 5-norbornene-2-carboxylate, a 1-(1-adamantyl)-1-alkylalkyl 5-norbornene-2-carboxylate, a 2-alkyl-2-adamantyl α-chloroacrylate and a 1-(1-adamantyl)-1-alkylalkyl α-chloroacrylate.

Particularly, when the 2-alkyl-2-adamantyl(meth)acrylate or the 2-alkyl-2-adamantyl α-chloroacrylate is used as the monomer, the resist composition having excellent resolution tend to be obtained.

Specific examples of the 2-alkyl-2-adamantyl(meth)acrylate include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantyl acrylate, 2-n-butyl-2-adamantyl methacrylate. Specific examples of the 2-alkyl-2-adamantyl α-chloro(meth)acrylate include 2-methyl-2-adamantyl α-chloroacrylate and 2-ethyl-2-adamantylα-chloroacrylate.

Among these, 2-ethyl-2-adamantyl(meth)acrylate or 2-isopropyl-2-adamantyl(meth)acrylate is preferably because of the resist composition having excellent sensitivity and heat resistance tends to be obtained.

The 2-alkyl-2-adamantyl(meth)acrylate can be generally produced by reacting a 2-alkyl-2-adamantanol or a metal salt thereof with an acrylic halide or methacrylic halide.

In addition, examples of monomers that have an acid-labile group other than the abovementioned include a monomer (g) that has an unstable acetal group represented by the formula (g).

(g)

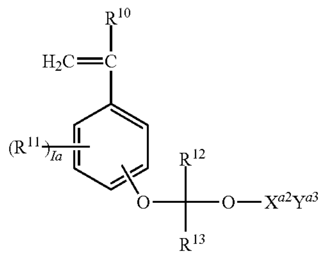

wherein $R^{10}$ represents a hydrogen atom, a halogen atom or a $C_1$ to $C_6$ alkyl group that optionally has a halogen atom;

$R^1$ is independently in each occurrence a halogen atom, a hydroxyl group, a $C_1$ to $C_6$ alkyl group, a $C_1$ to $C_6$ alkoxyl group, a $C_2$ to $C_4$ acyl group, a $C_2$ to $C_4$ acyloxy group, an acryloyl group or a methacryloyl group;

$1^a$ represents an integer of 0 to 4;

$R^{12}$ and $R^{13}$ independently represent a hydrogen atom or a $C_1$ to $C_{12}$ hydrocarbon group;

$X^{a2}$ represents a single bond or an optionally substituted $C_1$ to $C_{17}$ saturated hydrocarbon group, and the $—CH_2—$ contained in the saturated hydrocarbon group may be replaced by —CO—, —O—, —S— or $—N(R^c)—$;

$R^c$ represents a hydrogen atom or $C_1$ to $C_6$ alkyl group; and $Y^{a3}$ represents a $C_1$ to $C_{12}$ aliphatic hydrocarbon group, a $C_3$ to $C_{18}$ saturated cyclic hydrocarbon group or a $C_6$ to $C_{18}$ aromatic hydrocarbon group, and the aliphatic hydrocarbon group, the saturated cyclic hydrocarbon group and the aromatic hydrocarbon group can optionally have substituents.

Examples of the alkyl group which may have a halogen atom include perfluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

$Q^1$ and $Q^2$ preferably independently represent perfluoromethyl or a fluorine atom, and more preferably a fluorine atom.

The alkyl group and the alkoxy group preferably a group having 1 to 4 carbon atoms, and more preferably 1 to 2 carbon atoms, and even more preferably a carbon atom.

Examples of the acyloxy group include acethyloxy, propyonyloxy and butylyloxy.

The hydrocarbon group includes an aliphatic hydrocarbon group, an alicyclic hydrocarbon group, an aromatic hydrocarbon group or a combination thereof. Among these, it is preferable the alkyl group such as methyl, ethyl, n-propyl, isopropyl, n-butyl, sec-butyl, tert-butyl, pentyl, hexyl, octhyl, 2-ethylhexyl groups, and the alicyclic hydrocarbon group such as cyclohexyl, adamantyl, 2-alkhyl-2-adamantlyl, 1-(1-adamantlyl)-1 alkyl and isobornyl groups.

The saturated cyclic hydrocarbon group can be monocyclic or polycyclic. Examples of the monocyclic saturated hydrocarbon group include a cycloalkyl group such as cyclopropyl group, cyclobutyl group, cyclopentyl group, cyclohexyl group, methylcyclohexyl group, dimethylcyclohexyl group, cycloheptyl group, methylcycloheptyl group, cyclooctyl group, cyclononyl group, cyclodecyl group. Examples of the polycyclic saturated hydrocarbon group include a group obtained via the hydrogenation of a condensed aromatic hydrocarbon group such as hydronaphthyl group, a bridged cyclic hydrocarbon group such as 1-adamantyl, 2-adamantyl, norbornyl, methylnorbornyl and isobornyl groups. Furthermore, as shown below, included within the saturated cyclic hydrocarbon group is bridged a ring such as norbornane ring fused with a monocyclic ring (such as a cycloheptane ring and a cyclohexane ring) or a polycyclic ring (such as a decahydronaphthalene ring), and a group with other bridged rings fused to one another.

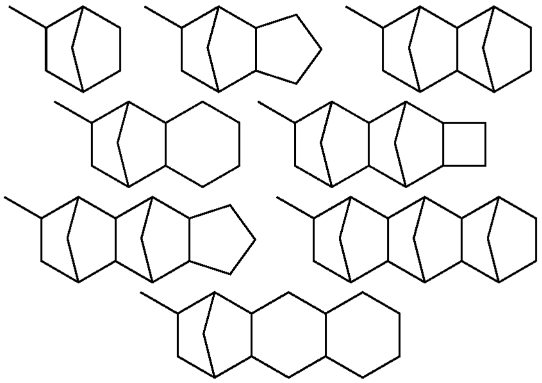

Examples of the substituent of $Y^{a3}$ include a halogen atom, a hydroxyl group, a $C_1$ to $C_{12}$ alkyl group, a $C_1$ to $C_{12}$ alkoxy group, a $C_6$ to $C_{12}$ aryl group, a $C_7$ to $C_{12}$ aralkyl group, a glycidyloxy group, a $C_2$ to $C_4$ acyl group and cyano group.

Examples of monomer (g) include the followings.

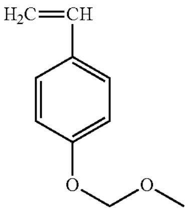

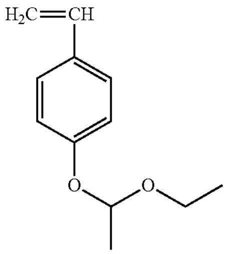

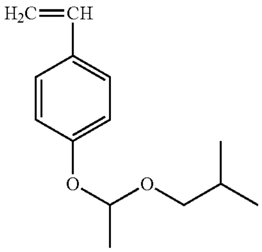

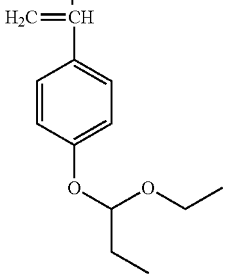

-continued

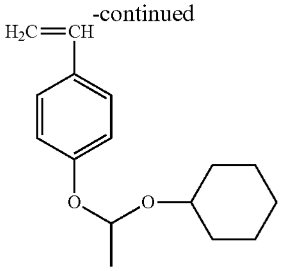

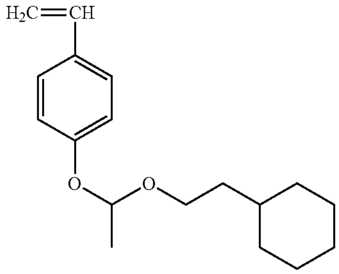

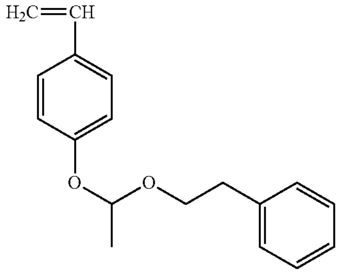

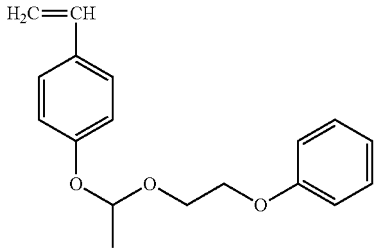

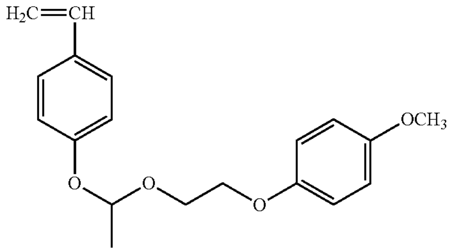

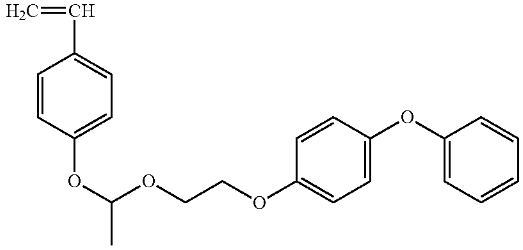

-continued
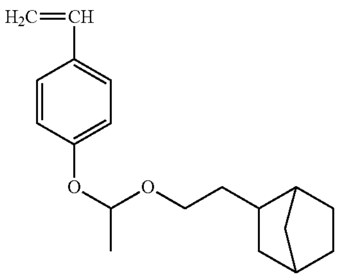
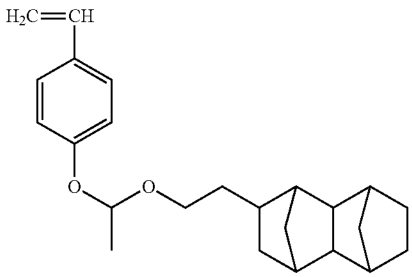
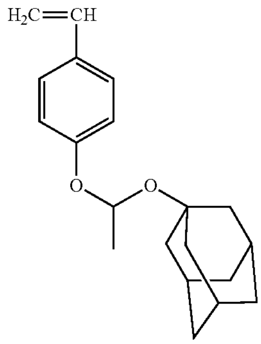
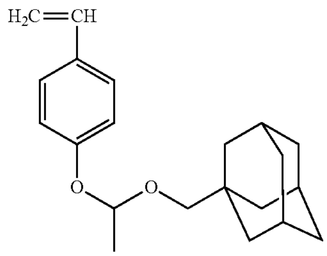
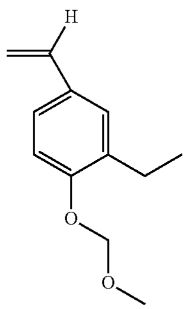
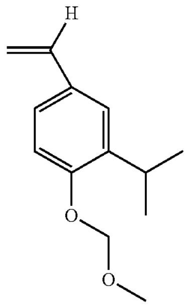
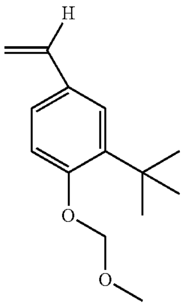
-continued
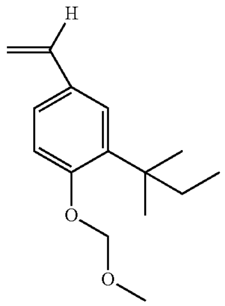
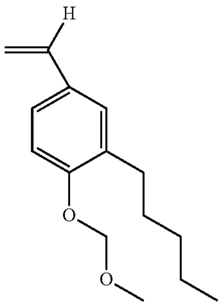
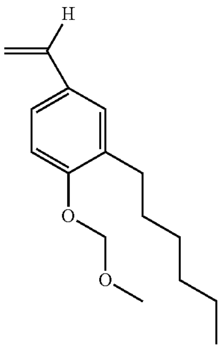
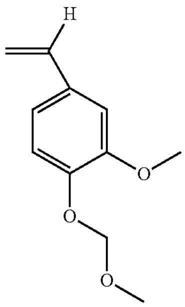
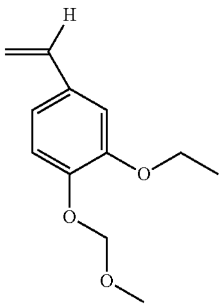
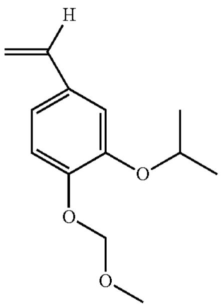
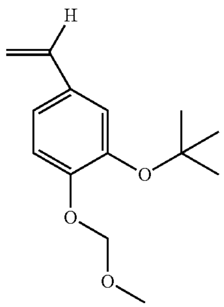
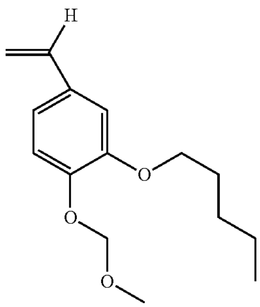
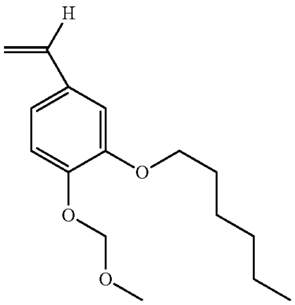
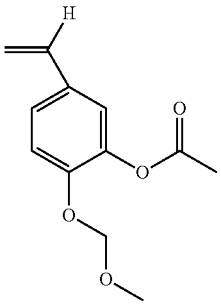

-continued

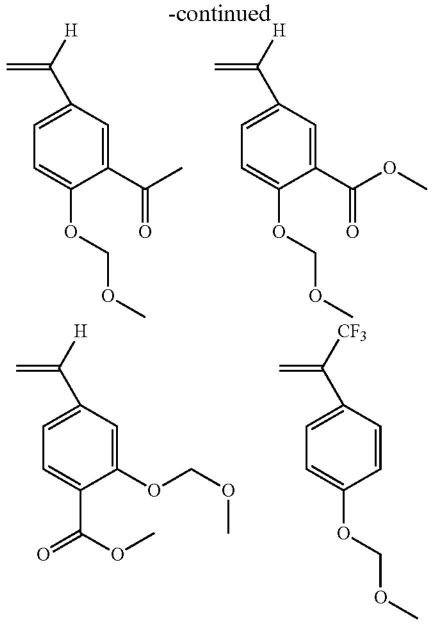

The content of the structural unit derived from the monomer having acid-labile group in the resin is generally 10 to 95 mol %, preferably 15 to 90 mol %, and more preferably about 20 to 85 mol %, with respect to the total structural units constituting the resin.

In addition to structural units derived from compounds represented by the formula (aa) and structural units derived from monomers that have acid-unstable groups, the resin used in the present invention may includes structural units derived from acid-stable monomers. Here, a structure derived from an acid-stable monomer means a structure that is not cleaved by the acid generator mentioned below.

The content of the structural unit derived from the monomer having acid-stable group in the resin is generally 5 to 90 mol %, preferably 10 to 85 mol %, and more preferably 15 to 80 mol %, with respect to the total structural units constituting the resin.

Specific examples include a structural unit derived from a monomer having a free carboxyl group such as acrylic acid and methacrylic acid; a structural unit derived from an aliphatic unsaturated dicarboxylic anhydride such as maleic anhydride and itaconic anhydride; a structural unit derived from 2-norbornene; a structural unit derived from (meth) acrylonitrile; a structural unit derived from a (meth)acrylic ester in which a carbon atom adjacent to oxygen atom is secondary or tertiary carbon atom such as an alkyl ester or 1-adamantl ester; a structural unit derived from a styrene monomer such as p- or m-hydroxystyrene; a structural unit derived from (meth)acryloyloxy-γ-butyrolactone having a lactone ring which may be substituted with an alkyl group. The 1-adamantyl ester is the acid-stable group though the carbon atom adjacent to oxygen atom is the quaternary carbon atom, and the 1-adamantyl ester may be substituted with at least one hydroxyl group.

Specific examples of the acid-stable monomer include 3-hydroxy-1-adamantyl(meth)acrylate, 3,5-dihydroxy-1-adamantyl(meth)acrylate, α-(meth)acryloyloxy-γ-butyrolactone, β-(meth)acryloyloxy-γ-butyrolactone, a monomer giving a structural unit represented by the formula (b2), an alicyclic compound having an olefinic double bond in the molecule such as hydroxystyrene or norbornene, an aliphatic unsaturated dicarboxylic anhyde such as maleic anhydride and itaconic anhydride.

Among these, the resist obtained from a resin having any of a structural unit derived from the styrene monomer such as p- or m-hydroxystyrene, a structural unit derived from 3-hydroxy-1-adamantyl(meth)acrylate, a structural unit derived from 3,5-dihydroxy-1-adamantyl(meth)acrylate, a structural unit represented by the formula (a), a structural unit represented by the formula (b1) and a structural unit represented by the formula (b2) is preferable because the adhesiveness of resist to a substrate and resolution of resist tend to be improved.

(a)

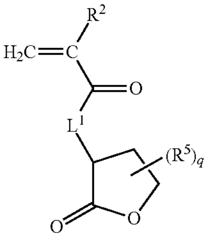

(b1)

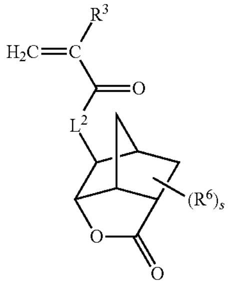

(b2)

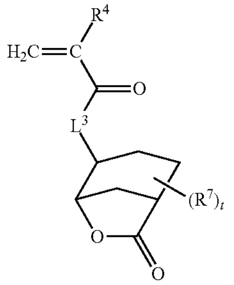

wherein $L^1$ to $L^2$ independently represent an oxygen atom, a carbonyl group, a linear or branched chain $C_1$ to $C_{17}$ alkanediyl group or a combination thereof;

$R^c$ represents a hydrogen atom or a $C_1$ to $C_6$ aliphatic hydrocarbon group;

$R^2$ to $R^4$ independently represent a hydrogen atom or a methyl group;

$R^5$ is independently in each occurrence a $C_1$ to $C_4$ aliphatic hydrocarbon group;

$R^6$ and $R^7$ are independently in each occurrence a carboxylic group, a cyano group or a $C_1$ to $C_4$ aliphatic hydrocarbon group;

q represents an integer of 0 to 5; and s and t independently represent an integer of 0 to 3.

Examples of the linear chain alkanediyl group include methylene, ethylene, propane-1,3-diyl, propane-1,2-diyl, buthane-1,4-diyl, pentane-1,5-diyl, hexane-1,6-diyl, heptane-1,7-diyl, octane-1,8-diyl, nonane-1,9-diyl, decane-1, 10-diyl, undecane-1,11-diyl, dodecane-1,12-diyl, tridecane-1,13-diyl, tetradecane-1,14-diyl, pentadecane-1,15-diyl, hexadecane-1,16-diyl and heptadecane-1,12-diyl groups.

Examples of the branched alkanediyl group include a group in which a linear chain alkanediyl group bonded a side chain of a $C_1$ to $C_4$ alkyl group such as methyl, ethyl, propyl, isopropyl, butyl, sec-butyl, tert-butyl, for example, 1-methyl-1,3-propylne, 2-methyl-1,3-propylene, 2-methyl-1,2-propylene, 1-methyl-1,4-buthylene and 2-methyl-1,4-buthylene groups.

The monomer such as 3-hydroxy-1-adamantyl(meth) acrylate and 3,5-dihydroxy-1-adamantyl(meth)acrylate can be produced, for example, by reacting corresponding hydroxyadamantane with (meth)acrylic acid or its halide, and they are also commercially available.

Further, the monomer such as (meth)acryloyloxy-γ-butyrolactone can be produced by reacting (meth)acrylic acid with corresponding α- or β-bromo-γ-butyrolactone in which the lactone ring can be substituted with an alkyl group, or reacting (meth)acrylic halide with corresponding α- or β-hydroxy-γ-butyrolactone in which the lactone ring can be substituted with an alkyl group.

Examples of the monomers to give structural units represented by the formulae (b1) and (b2) include an (meth) acrylic ester of alicyclic lactones having the hydroxyl group described below, and mixtures thereof. These esters can be produced, for example, by reacting the (meth)acrylic acid with a corresponding alicyclic lactone having the hydroxyl group (see JP 2000-26446 A).

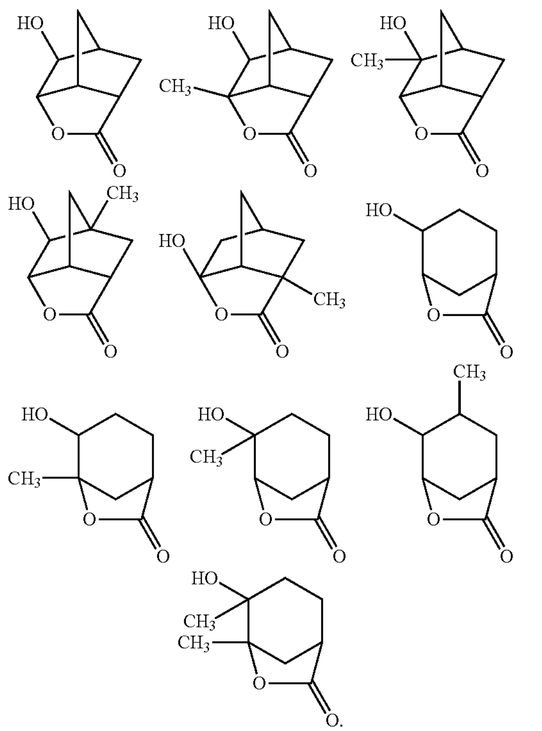

Examples of the (meth)acryloyloxy-γ-butyrolactone include α-(meth)acryloyloxy-γ-butyrolactone, α-(meth) acryloyloxy-β, β-dimethyl-γ-butyrolactone, α-(meth)acryloyloxy-α-methyl-γ-butyrolactone, β-(meth)acryloyloxy-γ-butyrolactone and β-methacryloyloxy-α-methyl-γ-butyrolactone.

The content of the structural unit represented by the formula (a), the structural unit represented by the formula (b1) and the structural unit represented by the formula (b2) in the resin are generally 5 to 50 mol %, preferably 10 to 45 mol %, and more preferably 15 to 40 mol %, with respect to the total structural units constituting the resin.

When KrF lithography and EUV lithography are used, even in the case of using a structure unit derived from a styrene monomer such as p- or m-hydroxystyrene as the structure unit of the resin, the resist composition having sufficient transparency can be obtained. Such copolymer resins can be obtained by radical-polymerizing the corresponding (meth)acrylic ester monomer with acetoxystyrene and styrene followed by de-acetylating them with an acid.

Specific examples of the monomer to give the structural unit derived from styrene monomers include the followings.

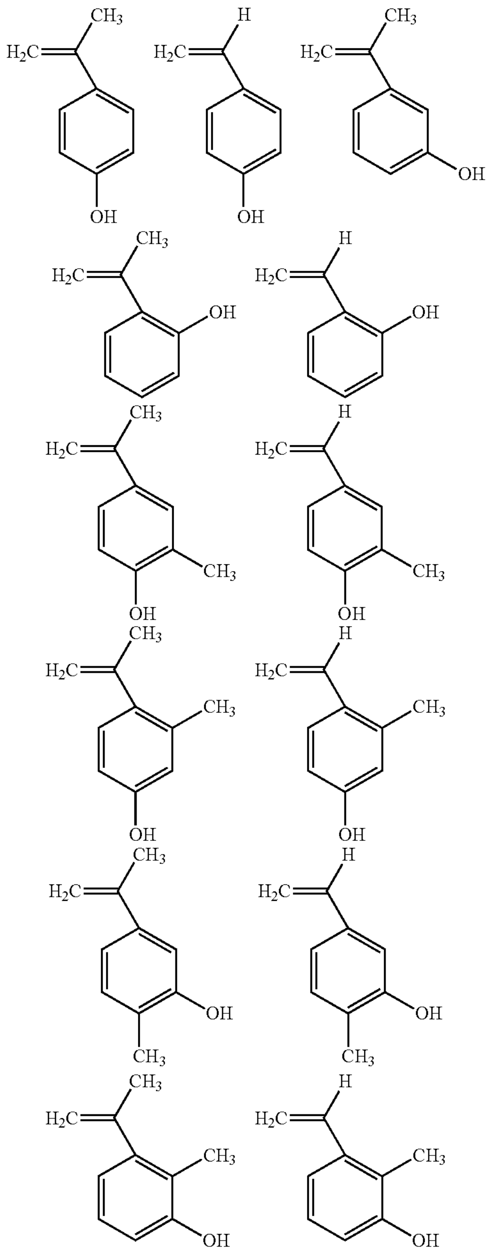

-continued

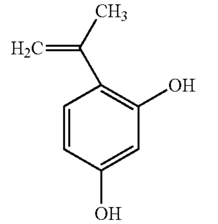
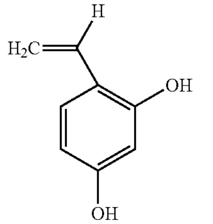
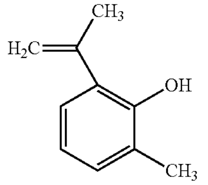
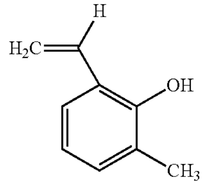
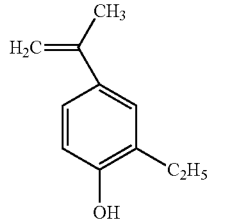
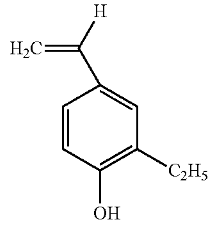
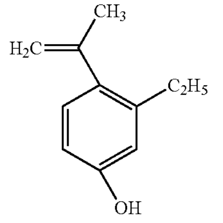
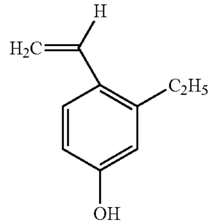
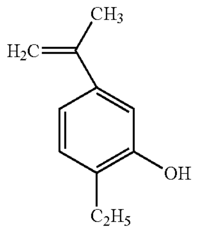
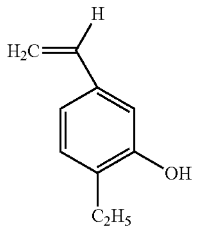

Among monomers of the above, 4-hydroxystyrene or 4-hydroxy-α-methylstyrene is particular preferable.

The content of the structural unit derived from a styrene monomer in the resin is generally 5 to 90 mol %, preferably 10 to 85 mol %, and more preferably 15 to 80 mol %, with respect to the total structural units constituting the resin.

The resin containing a structural unit derived from 2-norbornene shows strong structure because the alicyclic group is directly present on its main chain and shows a property that dry etching resistance is excellent. The structural unit derived from 2-norbornene can be introduced into the main chain by radical polymerization using an aliphatic unsaturated dicarboxylic anhydride such as maleic anhydride and itaconic anhydride together in addition to corresponding 2-norbornene. Therefore, the structural unit formed by opening of double bond of norbornene can be represented by the formula (c), and the structural unit formed by opening of double bond of maleic anhydride and itaconic anhydride can be represented by the formula (d) and (e), respectively.

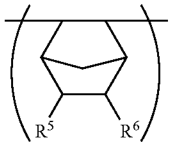
(c)

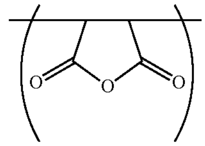
(d)

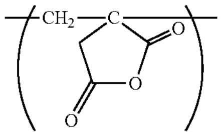
(e)

wherein $R^5$ and $R^6$ in the formula (c) independently represent a hydrogen atom, a $C_1$ to $C_3$ alkyl group, a carboxyl group, a cyano group or —COOU, wherein U represents an alcohol residue, or $R^5$ and $R^6$ are bonded together to form a carboxylic anhydride residue represented by —C(═O)OC(═O)—.

When $R^5$ and $R^6$ form the —COOU group, it is an ester formed from carboxyl group, and examples of the alcohol residue corresponding to U include an optionally substituted $C_1$ to $C_8$ alkyl group and 2-oxooxolan-3- or -4-yl group. The alkyl group may be substituted with a hydroxyl and an alicyclic hydrocarbon residue group.

Specific examples, for when $R^5$ and $R^6$ are alkyl groups, include methyl, ethyl, and propyl groups, and specific examples of the alkyl group to which a hydroxyl group is bonded include hydroxymethyl and 2-hydroxyethyl groups.

Specific examples of monomer giving the acid-stable structural unit which is the norbornene structural represented by the formula (c) include the following compounds;

2-norbornene,
2-hydroxy-5-norbornene,
5-norbornene-2-carboxylic acid,
methyl 5-norbornene-2-carboxylate,
2-hydroxy-1-ethyl 5-norbornene-2-carboxylate,
5-norbornene-2-methanol, and
5-norbornene-2,3-dicarboxylic acid anhydride.

As long as the U of —COOU in the formula (c) is an acid-labile group, such as an aliphatic ester in which the carbon atom bonded to the oxygen side of the carboxyl group is a quaternary carbon atom, the structural unit will have an acid-labile group, despite having a norbornene structure.

Specific examples of the monomer have the norbornene structure and the acid-labile group include t-butyl 5-norbornene-2-carboxylate, 1-cyclohexyl-1-methylethyl 5-norbornene-2-carboxylate, 1-methylcyclohexyl-5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxycyclohexyl)-1-methylethyl 5-norbornene-2-carboxylate, 1-methyl-1-(4-oxocyclohexyl)ethyl 5-norbornene-2-carboxylate, and 1-(1-adamantyl)-1-methylethyl 5-norbornene-2-carboxylate.

The content of the structural units represented by the formulae (c), (d), and (e) in the resin are generally 2 to 40 mol %, preferably 3 to 30 mol %, and more preferably about 5 to 20 mol %, with respect to the total structural units constituting the resin.

Furthermore, the acid-stable group can contain a structural unit as represented by the formula (dd) and a structural unit that contain fluorine atoms.

(dd)

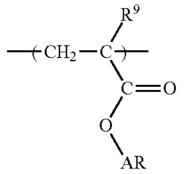

wherein $R^9$ represents a hydrogen atom, a methyl group or a trifluoromethyl group;

AR represents a linear chain, branched chain or cyclic $C_1$ to $C_{30}$ hydrocarbon group, and at least one or more of the hydrogen atoms contained in the hydrocarbon group is replaced with fluorine atom, the $—CH_2—$ contained in the hydrocarbon group may be replaced by —O— —S—, or $—N(R^c)—$, and a hydrogen atom contained in the hydrocarbon group may be replaced by a hydroxyl group or a linear or branched chain $C_1$ to $C_6$ aliphatic hydrocarbon group;

$R^c$ represents the same meaning as defined above.

Specific examples of the structural unit represented by the formula (dd) include the following monomers.

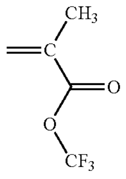 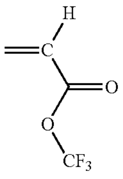 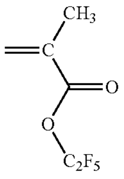 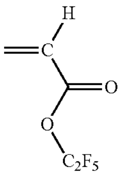

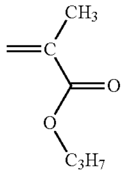 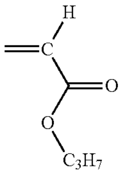 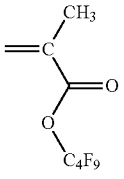 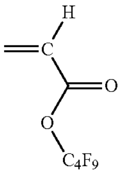

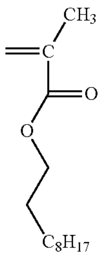 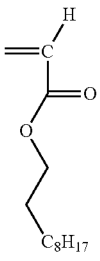 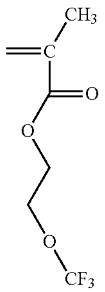 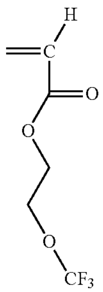

-continued

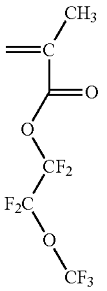 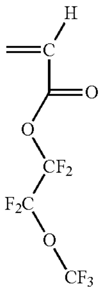 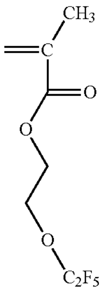 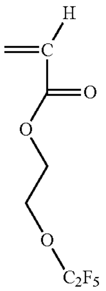

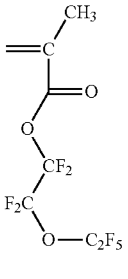 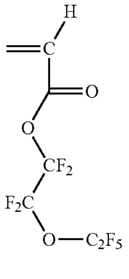 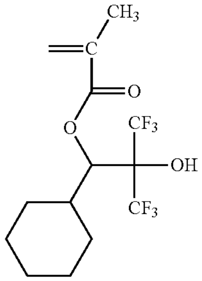

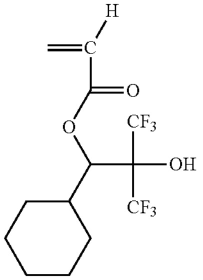 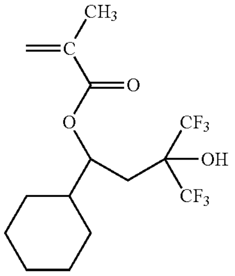

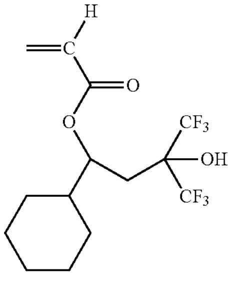 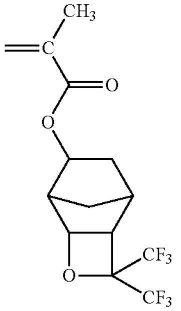

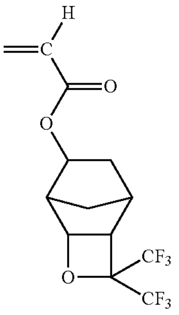 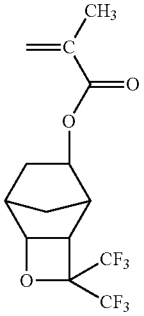 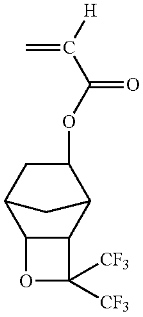

-continued

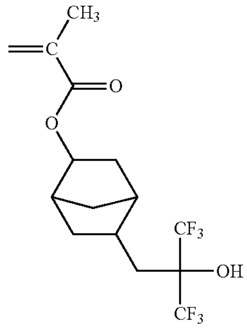
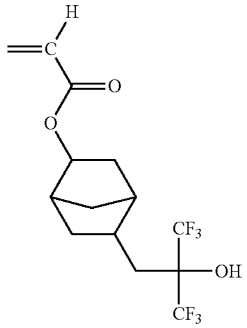
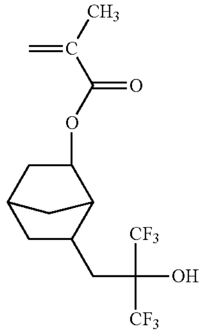
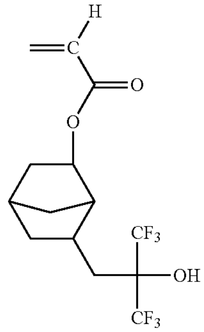
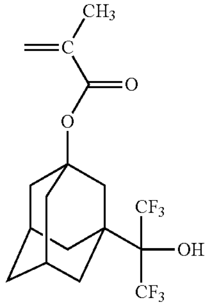
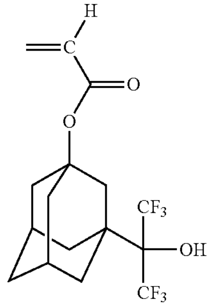
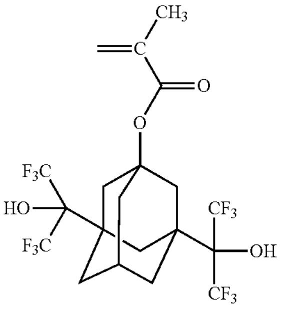
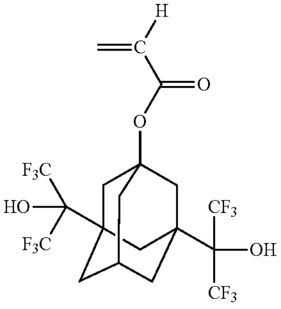

-continued

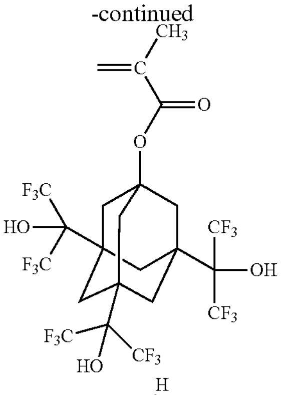
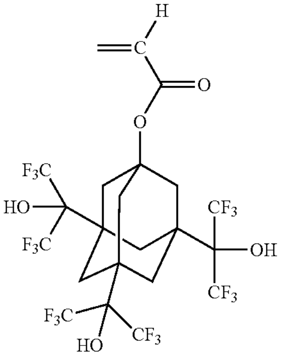
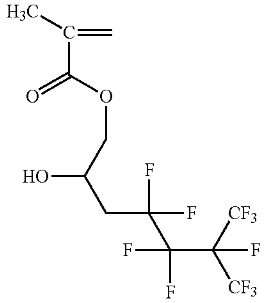
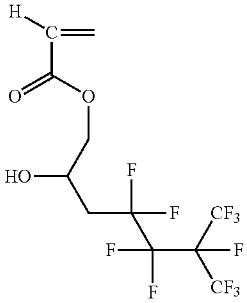
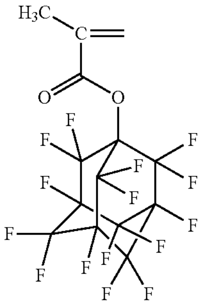
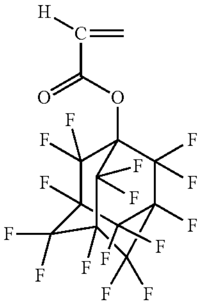

The content of the structural unit represented by the formula (dd) in the resin is generally 1 to 30 mol %, preferably 2 to 20 mol %, and more preferably 3 to 10 mol %, with respect to the total structural units constituting the resin.

When the structural unit derived from 2-alkyl-2-adamantyl(meth)acrylate, 1-(1-adamantyl)-1-alkylalkyl (meth)acrylate or 1-(2-alkyl-2-adamantyloxycarbonyl)alkyl(meth) acrylate is included as the structural unit derived from the monomer with the acid-labile group, adjusting the content to about 15 mol % or more with respect to the total structural units constituting the resin will result in a sturdy structure because the resin will have an alicyclic group, which is advantageous in terms of the dry etching resistance of the resulting resist.

When an alicyclic compound having an olefinic double bond or an aliphatic unsaturated dicarboxylic anhydride is used as the monomer, it is preferably used in excess amounts from the viewpoint of a tendency that the addition polymerization does not easily proceed.

The monomers that are used may be a combination of monomers that have the same olefinic double bond moiety but different acid-labile group, combinations of monomers with the same acid-labile group and different olefinic double bond moiety, and monomers with different combinations of acid-labile group and olefinic double bond moiety.

The weight average molecular weight of the resin is preferably 2500 to 100,000, more preferably 2700 to 50000, and even more preferably 3000 to 40000.

The resist composition of the present invention further includes an acid generator addition to the above resin.

There is no restriction on the acid generator, and it can be used a known acid generator in the field. Examples of the acid generator include a salt represented by the formula (I) as an active ingredient.

(I)

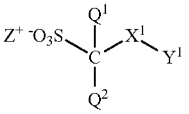

wherein $Q^1$ and $Q^2$ independently represent a fluorine atom or a $C_1$ to $C_6$ perfluoroalkyl group;

$X^1$ represents a single bond or an optionally substituted $C_1$ to $C_{17}$ saturated hydrocarbon group, the $—CH_2—$ contained in the saturated hydrocarbon group may be replaced by —O— or —CO—;

$Y^1$ represents a linear or branched chain $C_1$ to $C_{36}$ aliphatic hydrocarbon group, a $C_3$ to $C_{36}$ alicyclic hydrocarbon group or a $C_6$ to $C_{36}$ aromatic hydrocarbon group, and the aliphatic hydrocarbon group, the alicyclic hydrocarbon group and the aromatic hydrocarbon group may be substituted, provided that the substituent dose not have a fluorine atom;

$Z^+$ represents an organic counter cation.

Examples of the perfluoroalkyl group include perfluoromethyl, perfluoroethyl, perfluoro-n-propyl, perfluoro-isopropyl, perfluoro-n-butyl, perfluoro-sec-butyl, perfluoro-tert-butyl, perfluoro-n-pentyl and perfluoro-n-hexyl groups. Among these, perfluoromethyl group is preferable.

Examples of the $C_1$ to $C_{17}$ saturated hydrocarbon group include a divalent group including a $C_1$ to $C_{17}$ alkylene group or a cycloalkylene group.

Examples of the alkylene group include methylene, dimethylene, trimethylene, tetramethylene, pentamethylene, hexamethylene, heptamethylene, octamethylene, nonamethylene, decamethylene, undecamethylene, dodecamethylene, tridecamethylene, tetradecamethylene, pentadecamethylene, hexadecamethylene, heptadecamethylene, ethylene, propylene, isopuropylene, sec-buthylene and tert-buthylene groups.

Examples of the divalent group including the cycloalkylene group include a group represented by the formula ($X^1$-A) to the formula ($X^1$—C).

($X^1$-A)

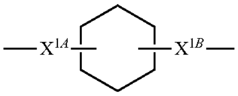

-continued ($X^1$-B)

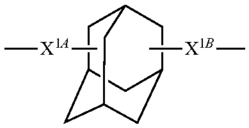

($X^1$-C)

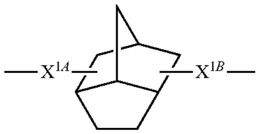

wherein $X^{1A}$ and $X^{1B}$ independently represent a $C_1$ to $C_6$ alkylene group which may be substituted, provided that the groups represented by the formula ($X^1$-A) to the formula ($X^1$—C) have $C_1$ to $C_{17}$.

Examples of the linear or branched chain aliphatic hydrocarbon group include an alkyl group.

Examples of the aromatic hydrocarbon group include an aryl group.

For the anion described as the salt represented in the formula (I) as the active component of an acid generator (referred to below as salt (I)), $Q^1$ and $Q^2$ independently are preferably fluorine atom or $—CF_3$, and fluorine atom is the more preferable of the two.

The $—CH_2—$ contained in the $C_1$ to $C_{17}$ saturated hydrocarbon group may be replaced by —O—, —S—, or —CO—.

Examples of $X^1$ include groups the follows.

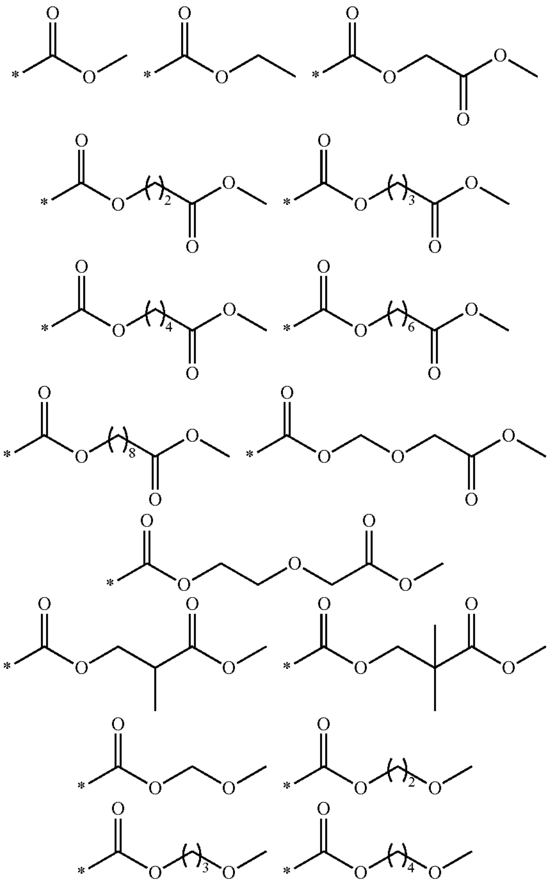

-continued

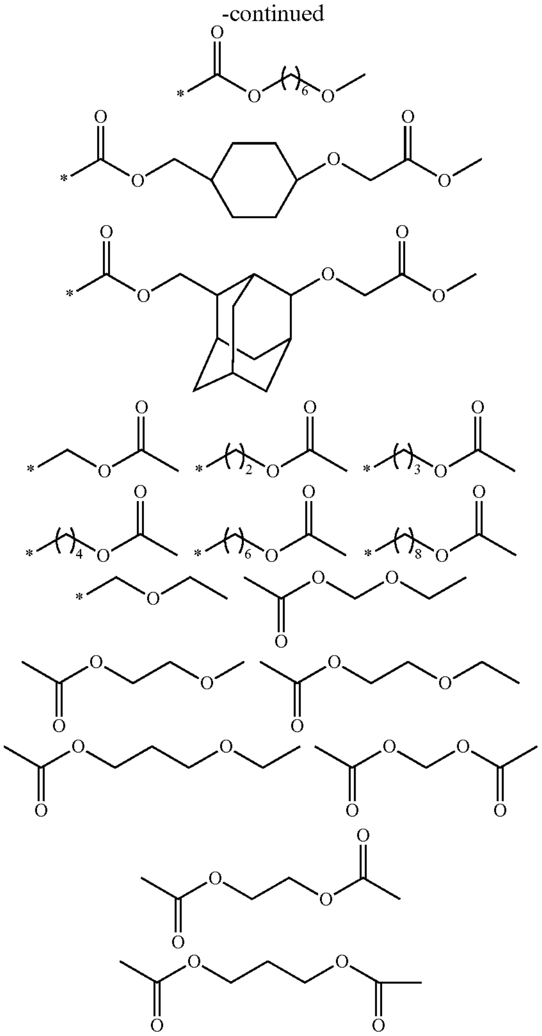

Examples of the $X^1$ are suitably —$X^{10}$—O—, —$X^{10}$—CO—C—. —$X^{10}$—O—CO—, —$X^{10}$—O—$X^{11}$, —CO—O—$X^{10}$—, —CO—O—$X^{10}$—CO—O—, —$X^{10}$—O—CO—, —$X^{10}$—O—$X^{11}$— and —CO—O—($X^{11}$—O)$_y$—$X^{10}$—. Among these, it is preferably —CO—O—$X^{10}$—, —CO—O—$X^{10}$—CO—O— and —CO—O—($X^{11}$—O)$_y$—$X^{10}$—. Provided that $X^{10}$ and $X^{11}$ independently represent a single bond, or a linear or branched chain $C_1$ to $C_{16}$ alkylene group. y represent an integer of 0 to 2.

$Y^1$ is suitably a $C_4$ to $C_{36}$ alicyclic hydrocarbon group which may be substituted.

Examples of the substituent of the optionally substituted the aliphatic hydrocarbon group, the alicyclic hydrocarbon group and the aromatic hydrocarbon group of $Y^1$ include at least one selected from a halogen atom (other than fluorine atom), a hydroxyl group, a linear or branched chain $C_1$ to $C_{12}$ aliphatic hydrocarbon group, a $C_1$ to $C_{12}$ alkoxy group, a $C_6$ to $C_{20}$ aromatic hydrocarbon group, a $C_7$ to $C_{21}$ aralkyl group, a glycidyloxy group and a $C_2$ to $C_4$ acyl group.

Examples of the anion of the salt represented by the formula (I) include the following anions represented by the formulae (IA), (IB), (IC) and (ID). Among these, the anion represented by the formula (IA) and the formula (IB) are suitable.

(IA)

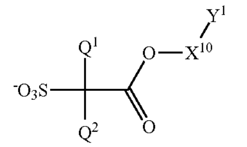

(IB)

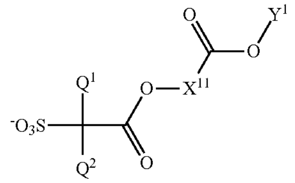

(IC)

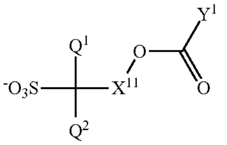

(ID)

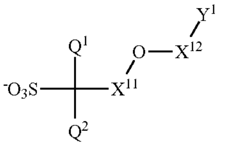

Wherein $Q^1$, $Q^2$, $Y^1$ $X^{10}$, $X^{11}$ and $X^{12}$ represent the same meaning as defined above.

$Y^1$ is preferably a group represented by the formula (Y1).

(Y1)

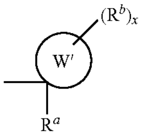

wherein ring W' represents a $C_3$ to $C_{36}$ alicyclic hydrocarbon group, and the —$CH_2$— contained in the alicyclic hydrocarbon group may be replaced by —CO—, —O—, —S—, —$SO_2$— or —N($R^c$)— group;

$R^c$ represents a hydrogen atom or a $C_1$ to $C_6$ alkyl group;

$R^b$ is independently in each occurrence a halogen atom, a linear or branched chain $C_1$ to $C_{12}$ aliphatic hydrocarbon group, a $C_6$ to $C_{20}$ aromatic hydrocarbon group, a $C_7$ to $C_{21}$ aralkyl group, a glycidyloxy group or a $C_2$ to $C_4$ acyl group;

x represents an integer of 0 to 8; and, $R^a$ represents a hydrogen atom or a linear or branched chain $C_1$ to $C_6$ hydrocarbon group, or may be bonded to a carbon atom included in the ring W' to form a ring.

$R^b$ in the formula (Y1) may be a halogen atom, and preferably an atom other than fluorine atom.

x is preferably an integer of 0 to 6, and more preferably an integer of 0 to 4.

Examples of the ring W' include a group represented by the formula (W1) to the formula (W50). Among these, it is preferable the formula (W1) to the formula (W19), and more preferably the formula (W12), (W15), (W16) and (W19).

(W1)

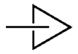

-continued
(W2)
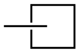
(W3)
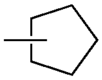
(W4)
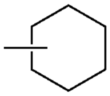
(W5)
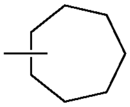
(W6)
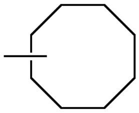
(W7)
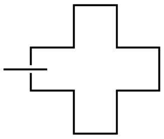
(W8)
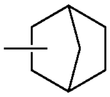
(W9)
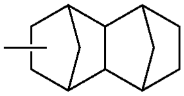
(W10)
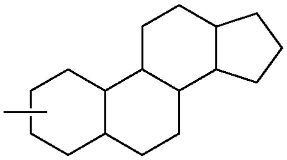
(W11)
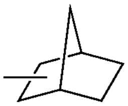
(W12)
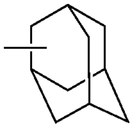
(W13)
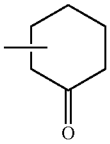
(W14)
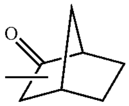
-continued
(W15)
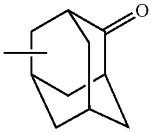
(W16)
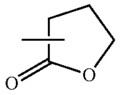
(W17)
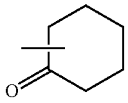
(W18)
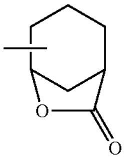
(W19)
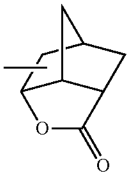
(W20)
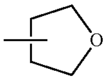
(W21)
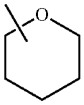
(W22)
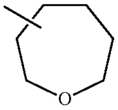
(W23)
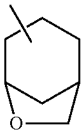
(W24)
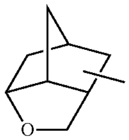
(W25)
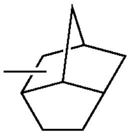

-continued
(W26)
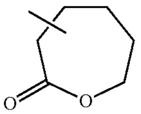
(W27)
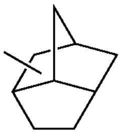
(W28)
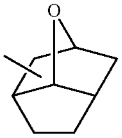
(W29)
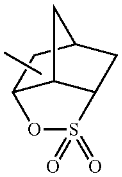
(W30)
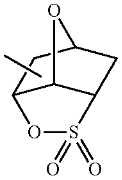
(W31)
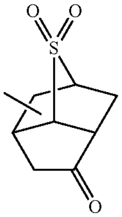
(W32)
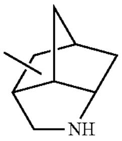
(W33)
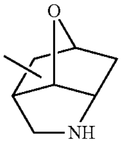
(W34)
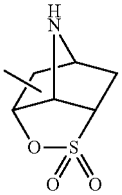
-continued
(W35)
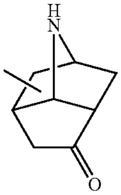
(W36)
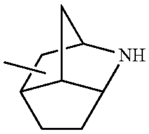
(W37)
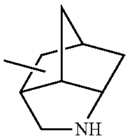
(W38)
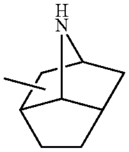
(W39)
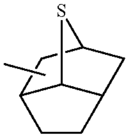
(W40)
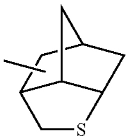
(W41)
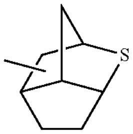
(W42)
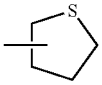
(W43)
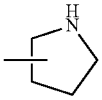
(W44)
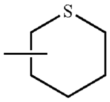
(W45)
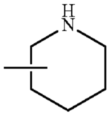

-continued (W46)

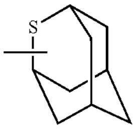

(W47)

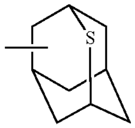

(W48)

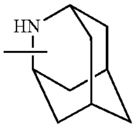

(W49)

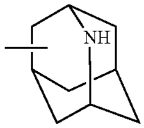

(W50)

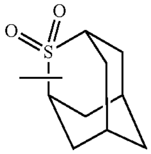

Examples of $Y^1$ group further include;

a group in which a hydrogen atom contained in the ring W' is not replaced or is replaced only by a hydrocarbon group, provided that the —$CH_2$— group contained in the ring W may be replaced by —O—;

a group in which a hydrogen atom contained in the ring W' is replaced by a hydroxyl group or a hydroxyl group-containing group, provided that these containing a lactone structure are excluded;

a group having a lactone structure in which two adjacent —$CH_2$— groups contained in the ring W' are replaced by a —O— and a —CO— group;

a group having a ketone structure in which one —$CH_2$— group contained in the ring W' is replaced by a —CO—;

a group in which a hydrogen atom contained in the ring W' is replaced by an aromatic hydrocarbon group or a group containing a aromatic ring; and a group having an ether structure in which one —$CH_2$— group contained in the ring W' are replaced by a —O—.

Examples of $Y^1$ in which a hydrogen atom contained in the ring W' is not replaced or is replaced only by a hydrocarbon group, provided that the —$CH_2$— group contained in the ring W may be replaced by —O—, include the groups below.

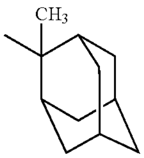
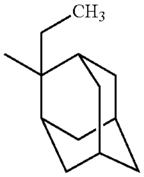
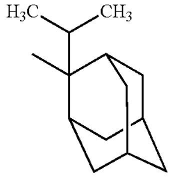

-continued

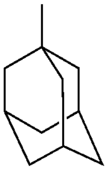
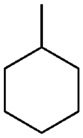

Examples of $Y^1$ in which a hydrogen atom contained in the ring W' is replaced by a hydroxyl group or a hydroxyl group-containing group, provided that these containing a lactone group are excluded, include the groups below.

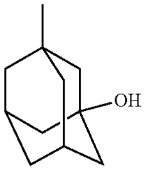
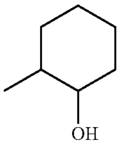
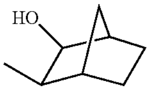

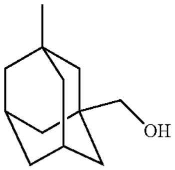

Examples of $Y^1$ having a lactone structure in which two adjacent —$CH_2$— groups contained in the ring W' are replaced by a —O— and a —CO— group include the groups below.

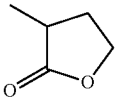
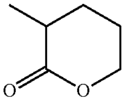
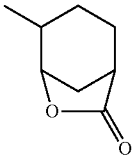
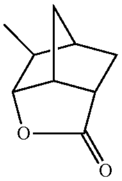

Examples of $Y^1$ having a ketone structure in which one —$CH_2$— contained in the ring W' is replaced by —CO— group include the groups below.

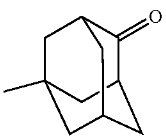
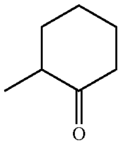
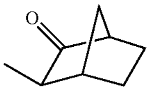

Examples of $Y^1$ in which a hydrogen atom contained in the ring W' is replaced by an aromatic hydrocarbon group or a group containing an aromatic ring include the groups below.

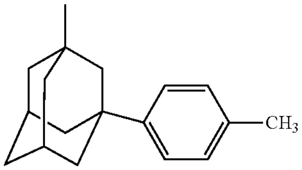

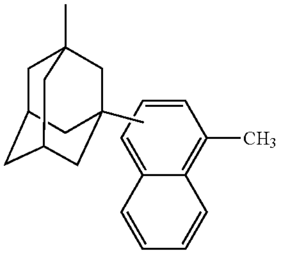

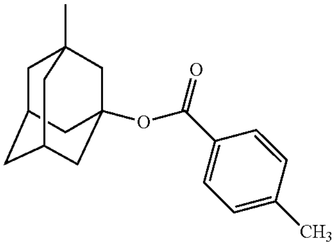

Examples of $Y^1$ having an ether structure in which one $-CH_2-$ contained in the ring W' is replaced by a $-O-$ group include the groups below.

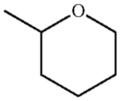

Examples of $Y^1$ in which one $-CH_2-$ contained in the ring W' is replaced by $-SO_2-$ include the groups below.

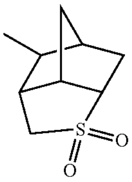
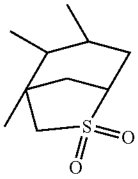
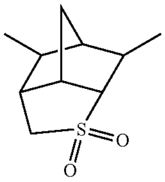

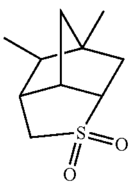
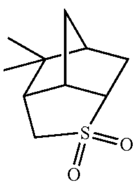
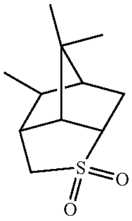

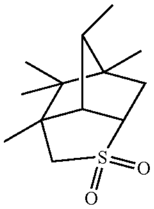
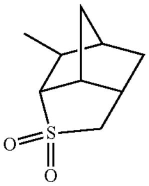
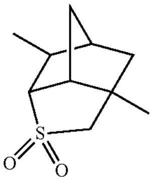

-continued

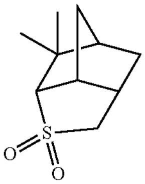
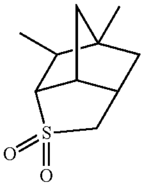
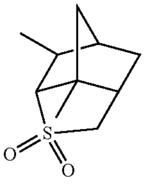

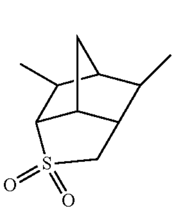
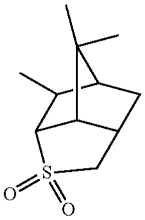
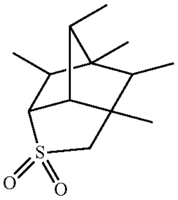

Examples of $Y^1$ in which one $-CH_2-$ contained in the ring W' is replaced by a $-O-$ and one $-CH_2-$ is replaced by a $-SO_2-$ include the groups below.

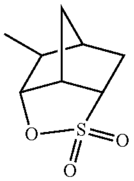
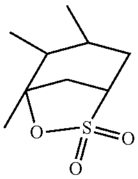
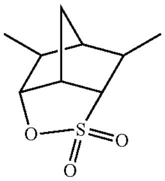

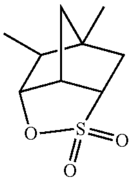
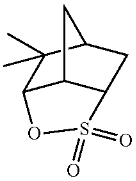
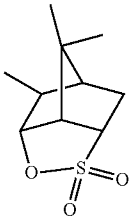

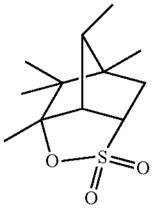
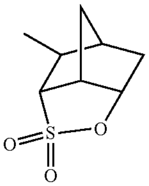
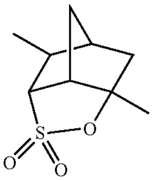

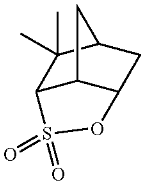
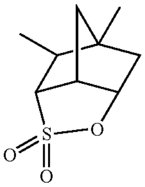
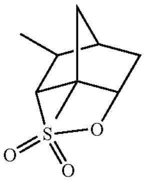

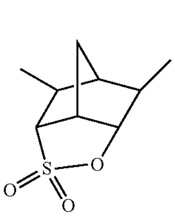
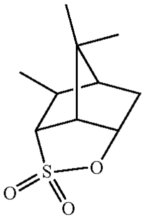
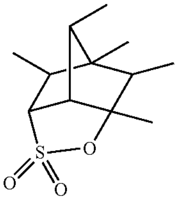

Examples of $Y^1$ in which two $-CH_2-$ contained in the ring W' are replaced by $-O-$ and one $-CH_2-$ is replaced by $-SO_2-$ include the groups below.

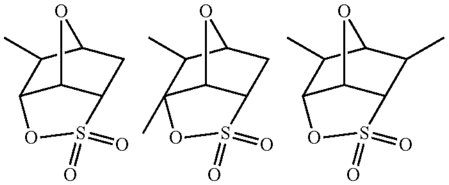
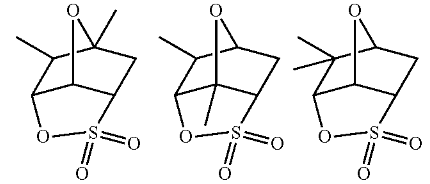
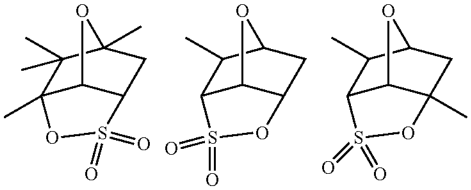
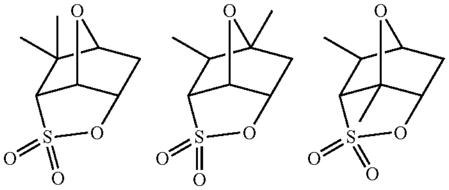
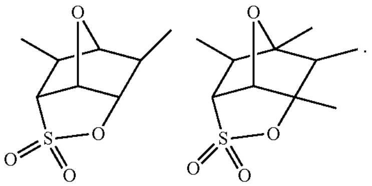

Examples of $Y^1$ in which one $—CH_2—$ contained in the ring W' is replaced by $—N(R^c)—$ include the groups below.

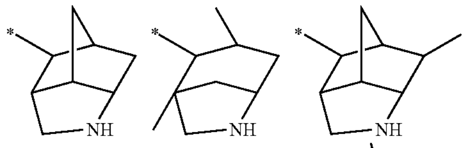
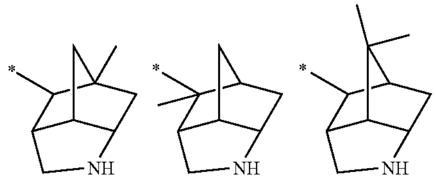
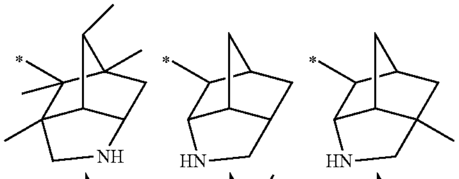
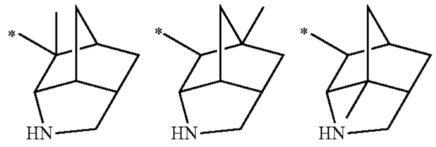

-continued

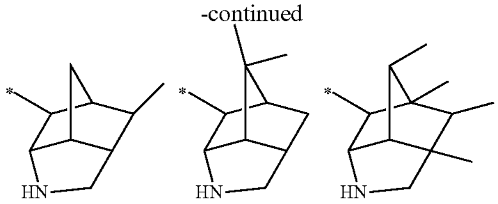
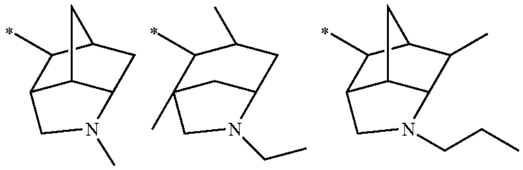
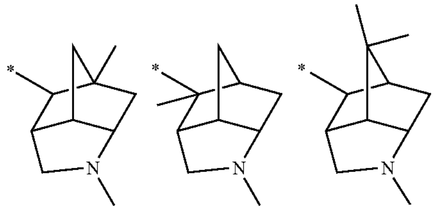
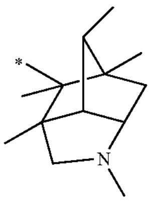

Among these, $Y^1$ is more preferably a group represented by the formula (Y2) or (Y3).

(Y2)

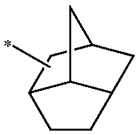

(Y3)

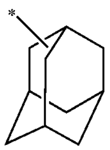

wherein the hydrogen atom in the ring may be replaced by a halogen atom (other than fluorine atom), a hydroxyl group, a $C_1$ to $C_{12}$ alkyl group, a $C_1$ to $C_{12}$ alkoxy group, a $C_6$ to $C_{12}$ aryl group, a $C_7$ to $C_{21}$ aralkyl group, a glycidyloxy group and a $C_2$ to $C_4$ acyl group, and the $—CH_2—$ contained in the ring may be replaced by —CO—, —O—, —S—, $—SO_2—$, or $—N(R^c)—$ group; and

* presents a bond with $X^1$.

In the formula (IA), examples of the anion in which the hydrogen atom contained in ring W' is replaced only by a hydrocarbon group, provided that the $—CH_2—$ contained in the hydrocarbon group may be replaced by —O—, include the anions below.

-continued
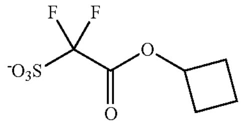
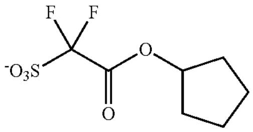
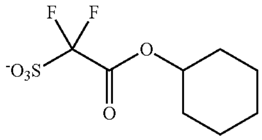
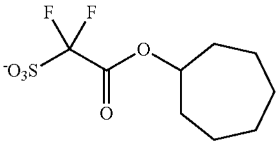
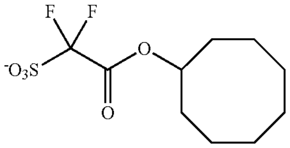
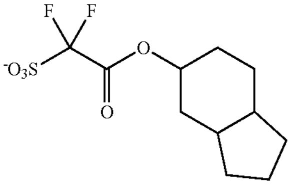
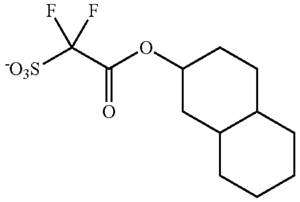
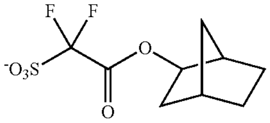
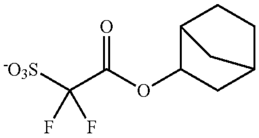
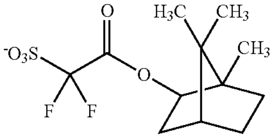
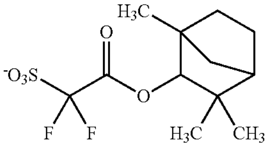
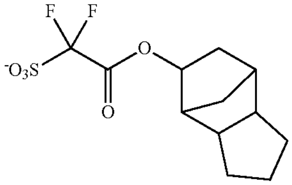
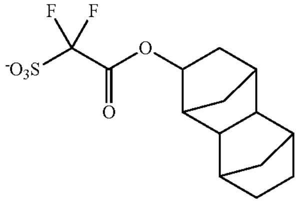
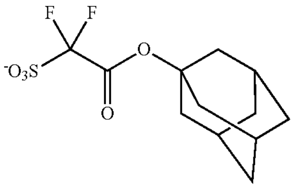
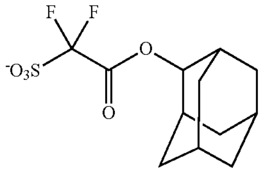
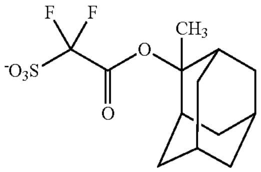
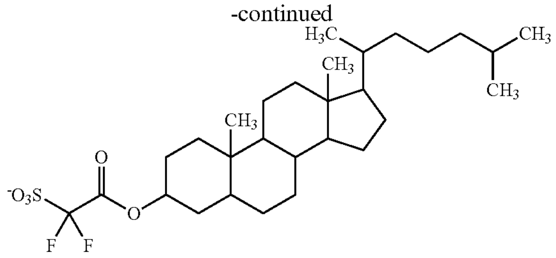
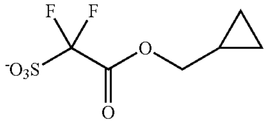
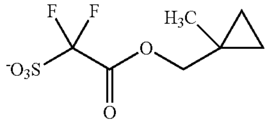
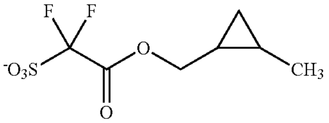
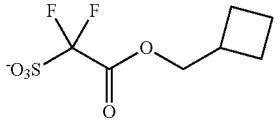
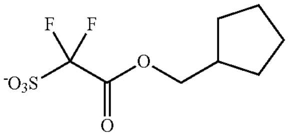
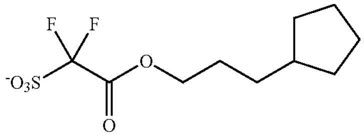
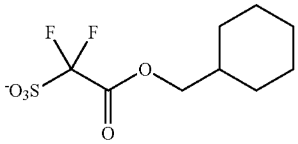
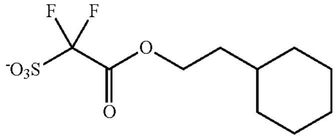
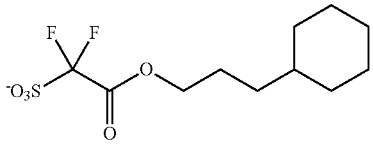
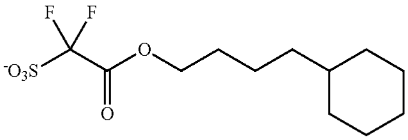
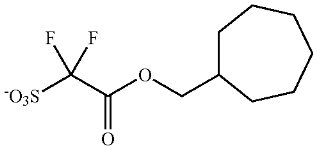
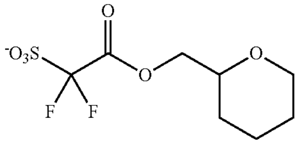

-continued
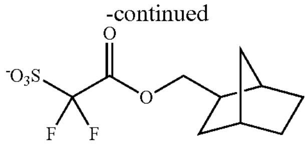
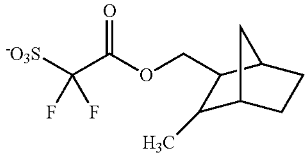
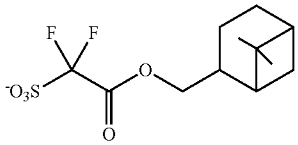
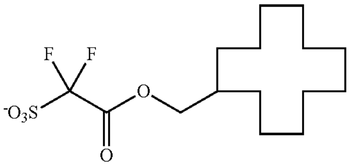
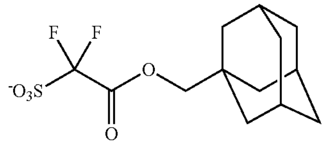
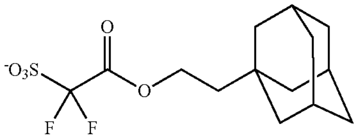
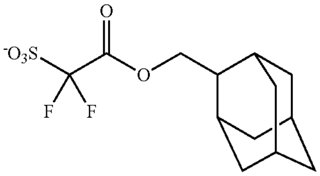
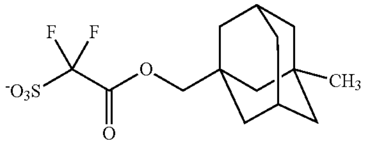
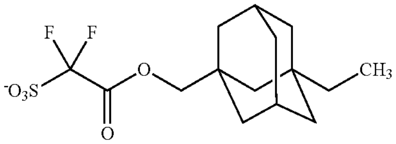
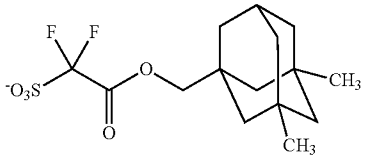
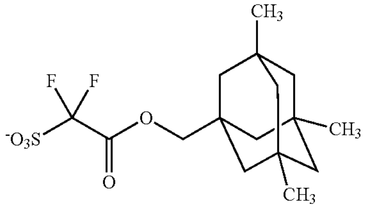
-continued
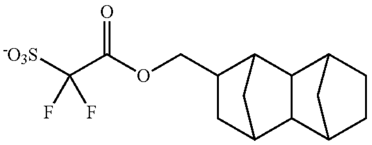
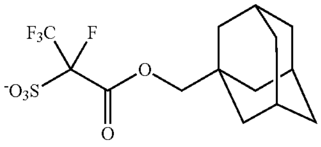
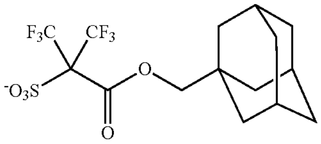
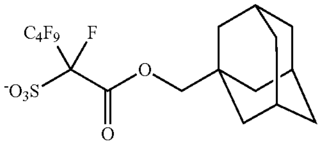
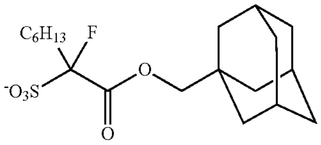
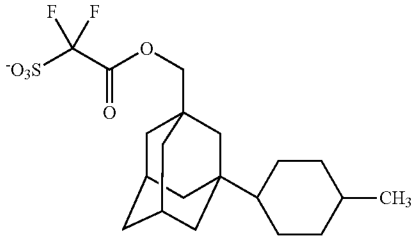
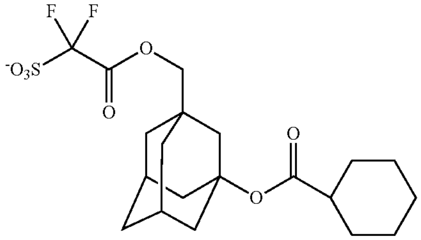
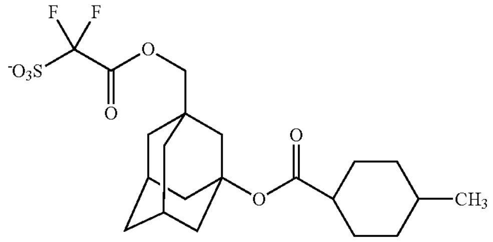
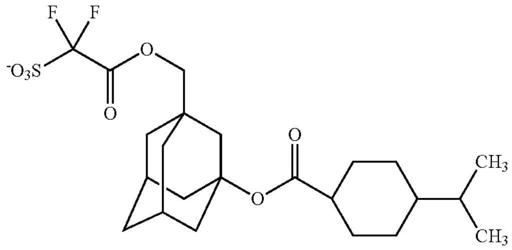

-continued
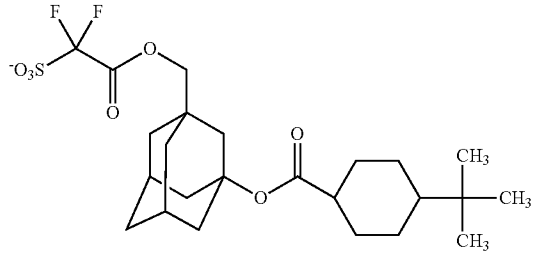
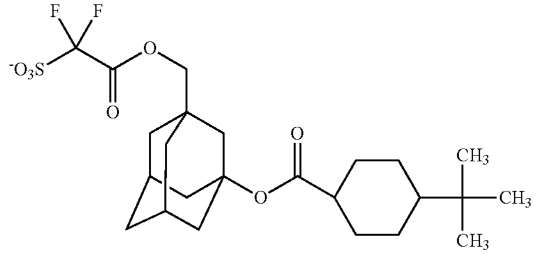
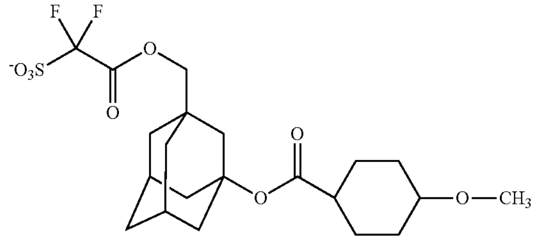
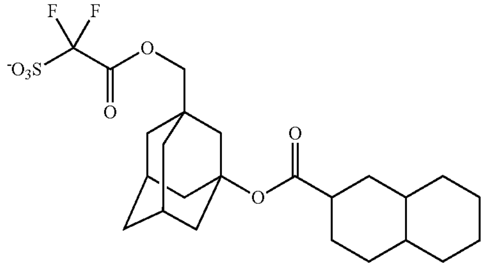
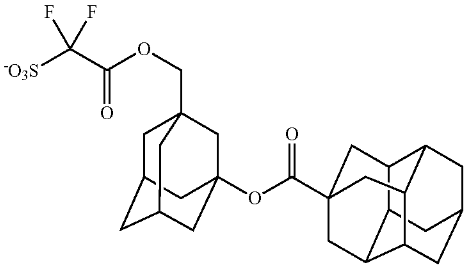
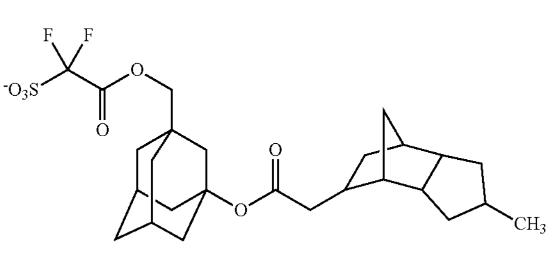
In the formula (IA), examples of the anion in which the hydrogen atom contained in the ring W' is replaced by a hydroxyl group or a hydroxyl group-containing group, provided that these containing a lactone structure are excluded, include the anions below.
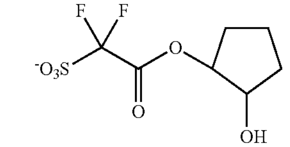
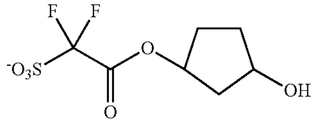
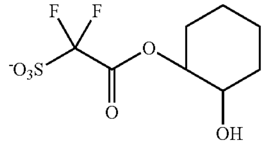
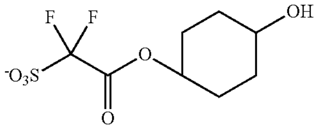
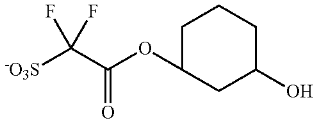
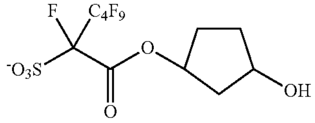
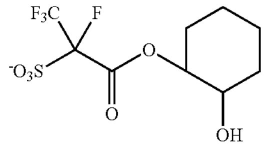
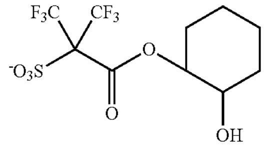
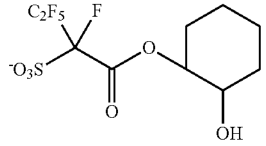
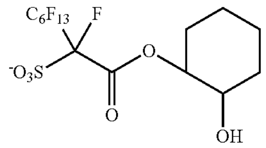
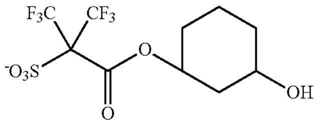
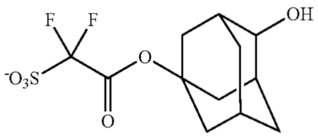

-continued
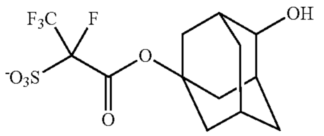
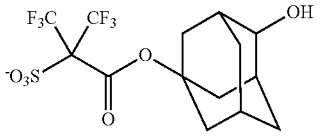
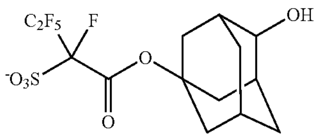
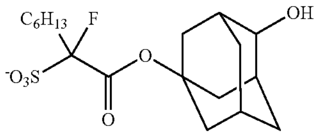
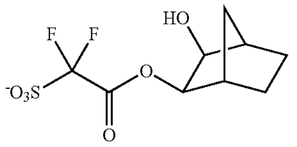
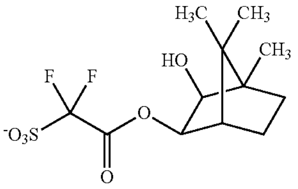
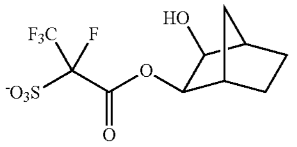
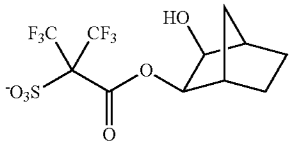
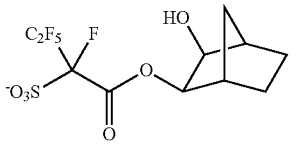
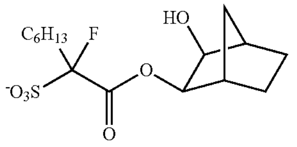
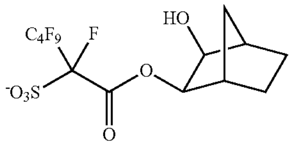
-continued
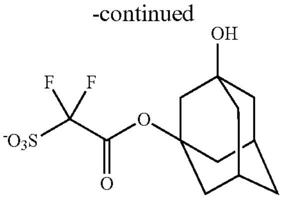
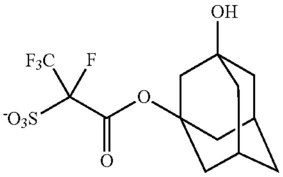
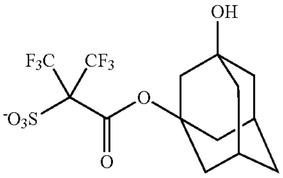
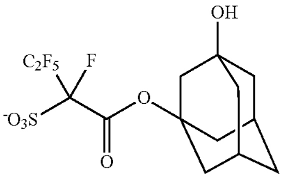
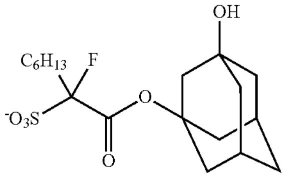
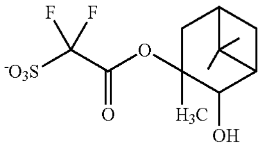
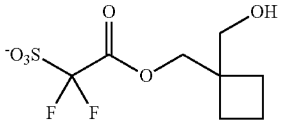
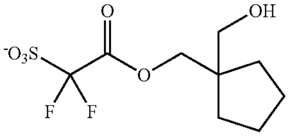
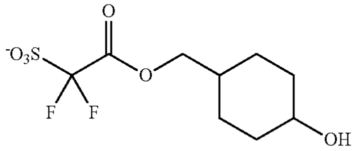
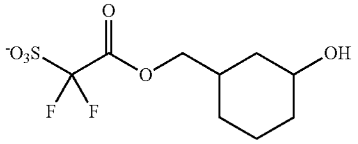
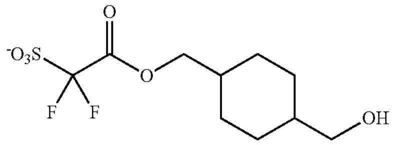
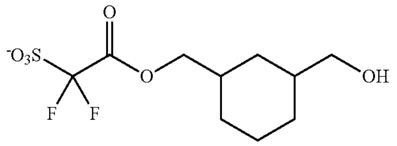

-continued
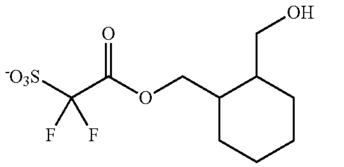
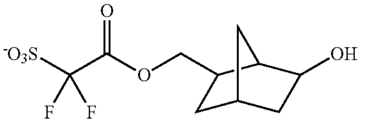
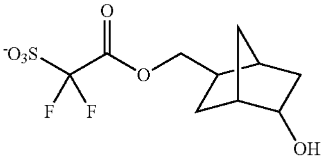
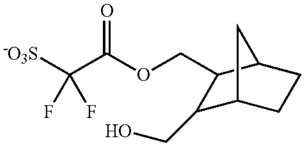
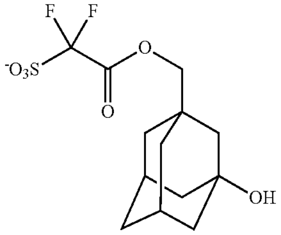
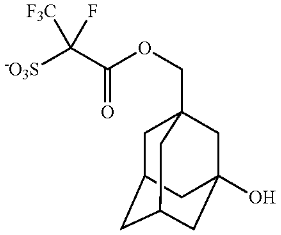
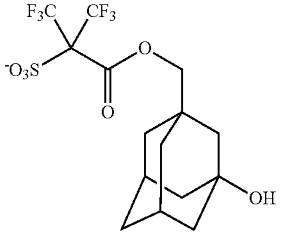
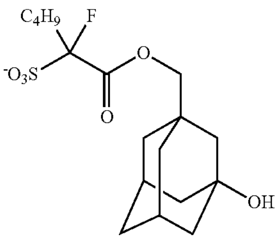
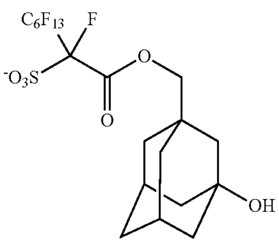
-continued
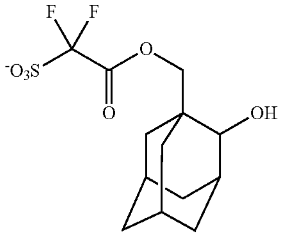
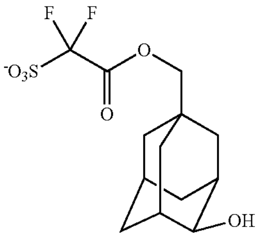
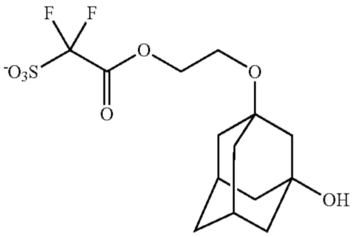
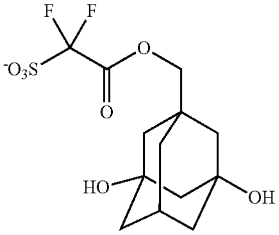
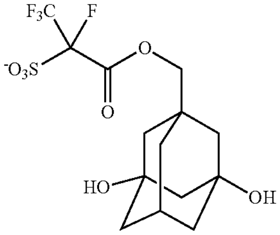
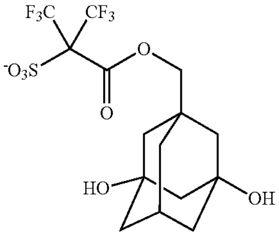
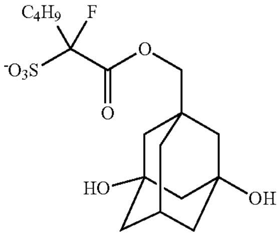
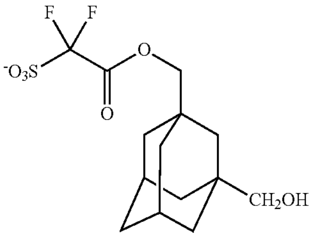
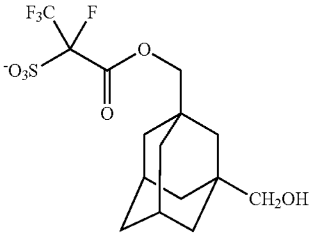
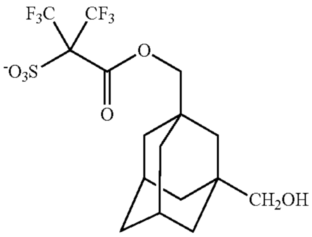

-continued
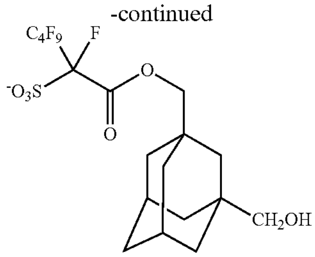
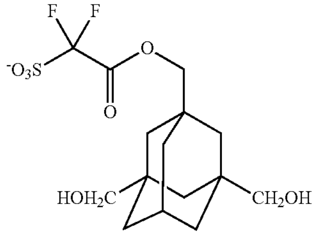
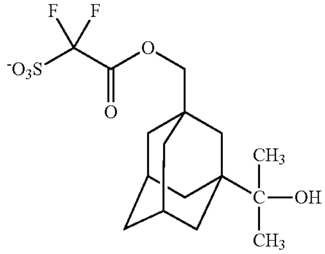
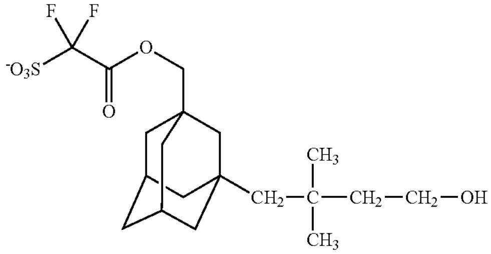
In the formula (IA), examples of the anion having a lactone structure in which two adjacent —$CH_2$— contained in the ring W' are replaced by a —O— and a —CO— group include the anions below.
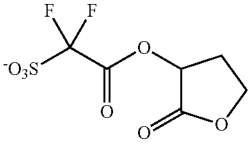
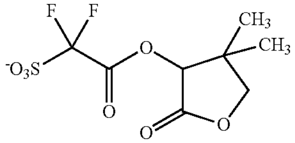
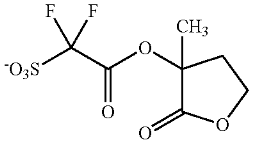
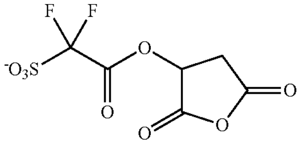
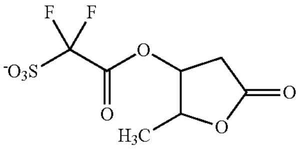
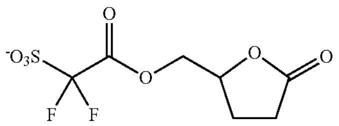
-continued
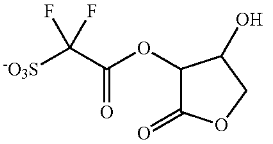
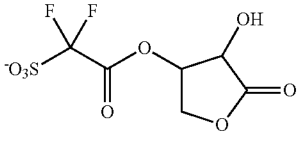
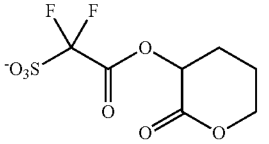
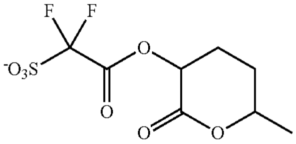
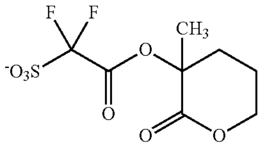
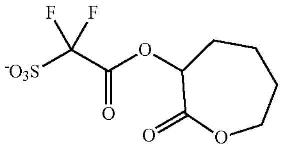
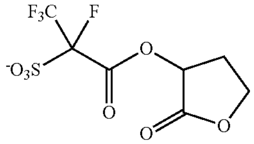
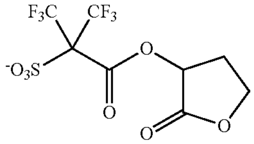
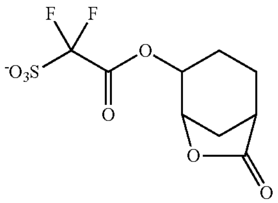
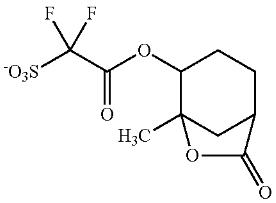
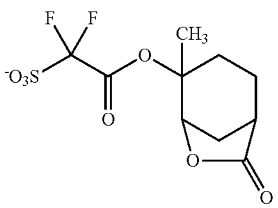
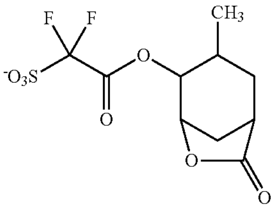
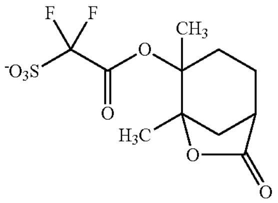
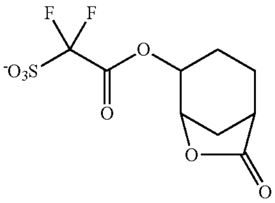
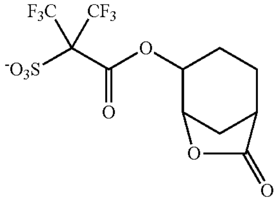
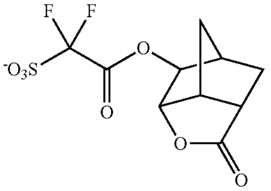
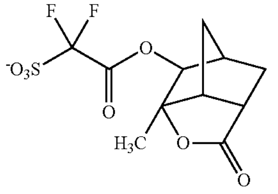
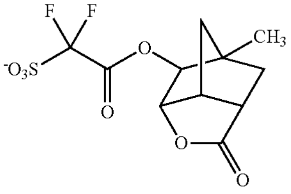

-continued
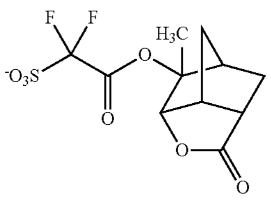
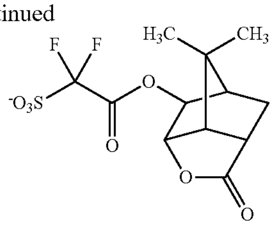
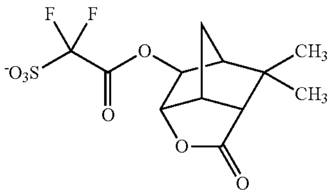
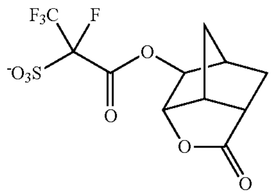
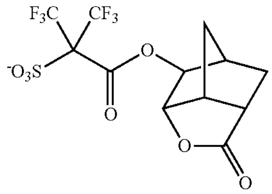
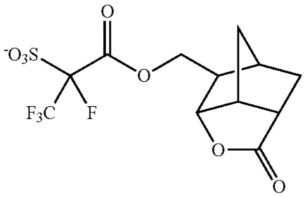
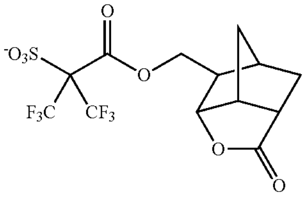
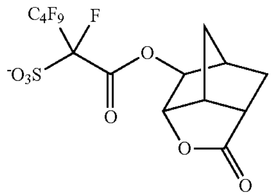
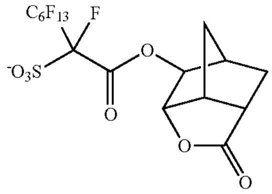
-continued
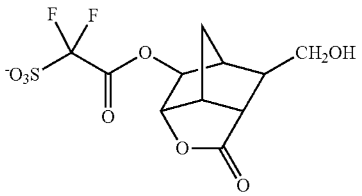
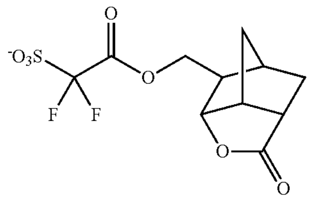
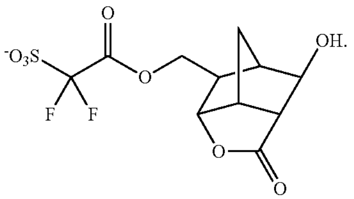
In the formula (IA), examples of the anion having a ketone structure in which the —$CH_2$— contained in the ring W' is replaced by a —CO— group include the anions below.
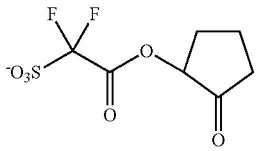
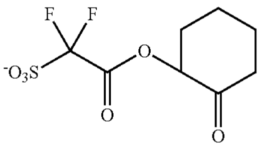
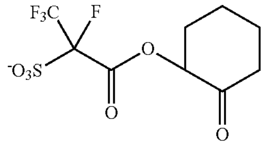
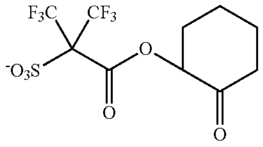
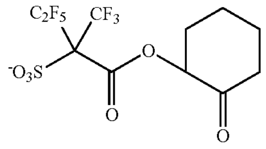
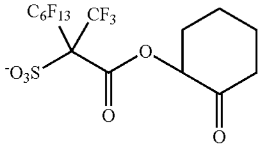
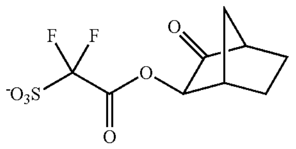
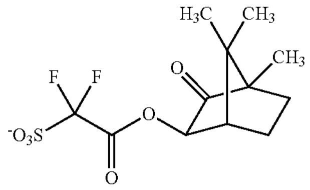
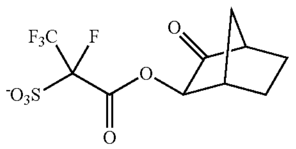

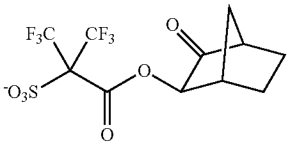
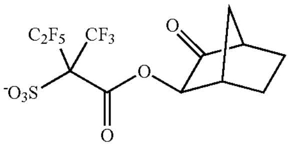
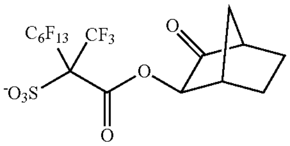
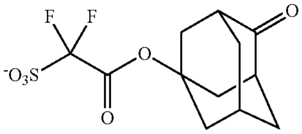
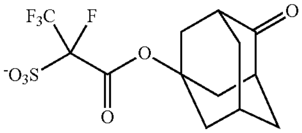
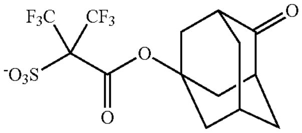
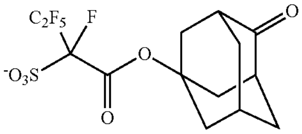
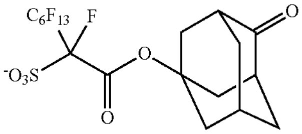
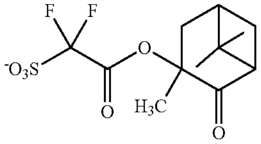
In the formula (IB), examples of the anion in which the hydrogen atom contained in the ring W' is replaced by an aromatic hydrocarbon group or a group containing a aromatic ring include the anions below.
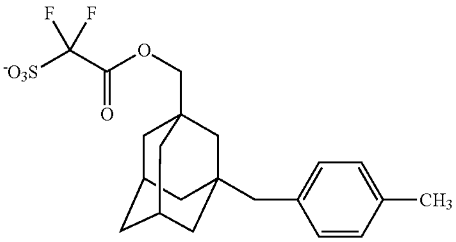
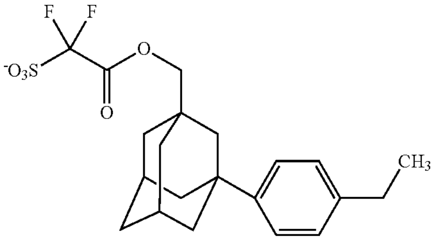
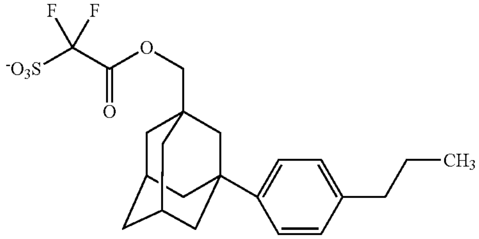
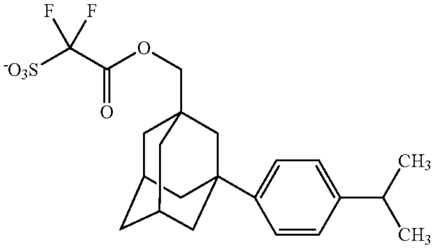
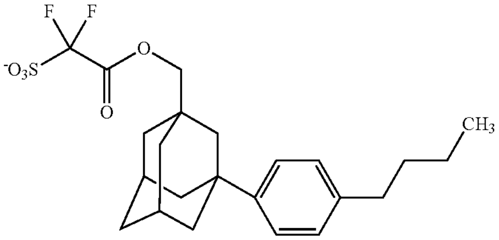
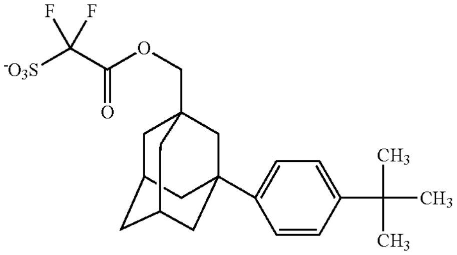
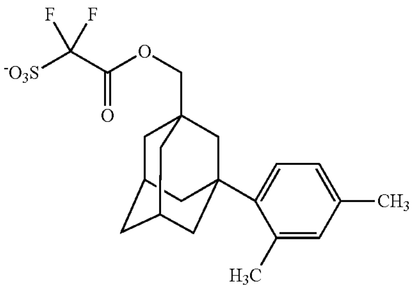

-continued
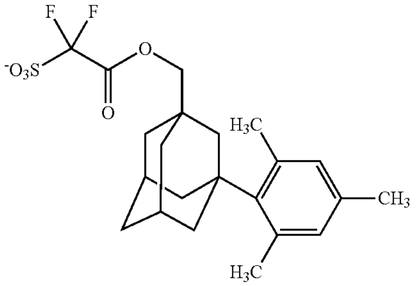
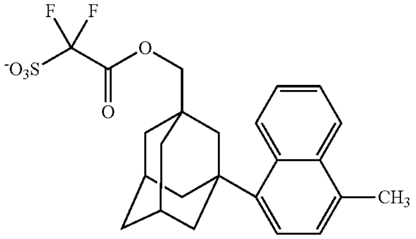
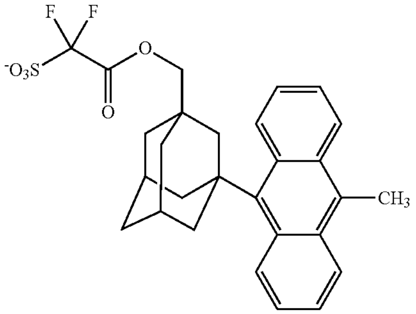
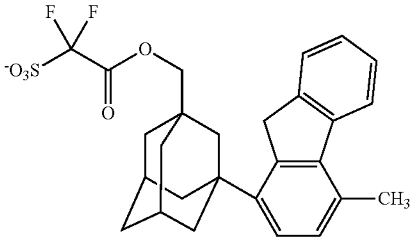
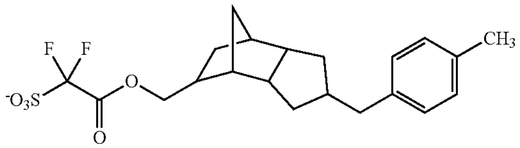
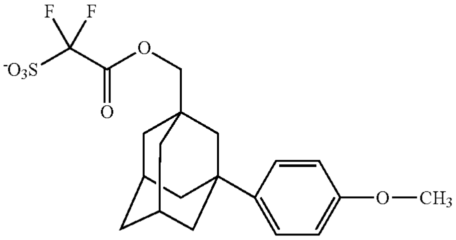
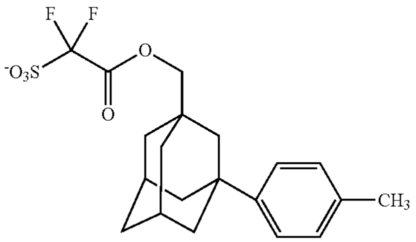
-continued
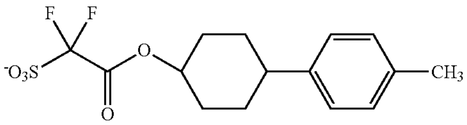
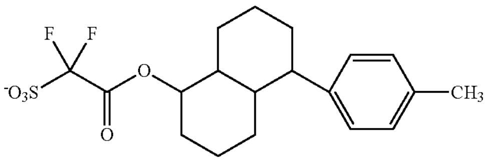
In the formula (IA), examples of the anion having an ether structure in which the —$CH_2$— contained in the ring W' is replaced by —O— include the anions below.
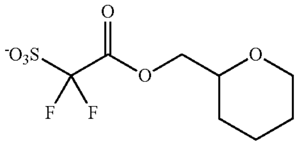
Further, examples of the anion represented by the formula (IA) include the anions below.
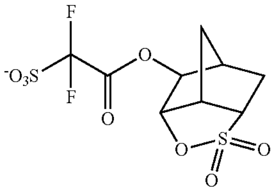
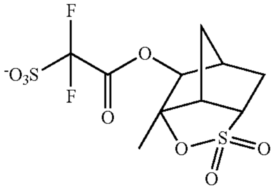
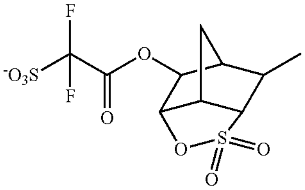
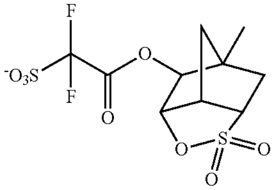
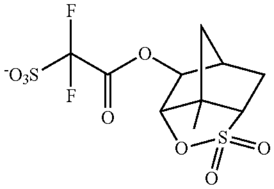

-continued
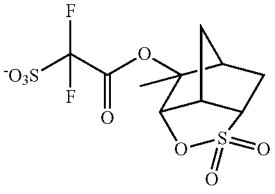
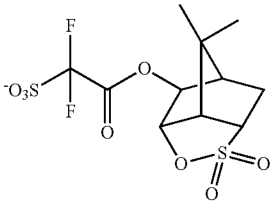
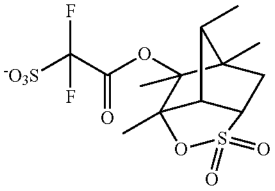
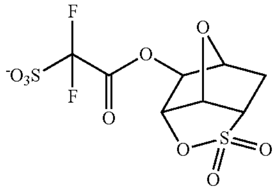
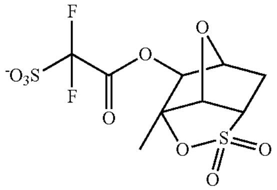
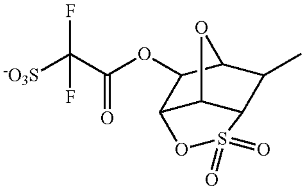
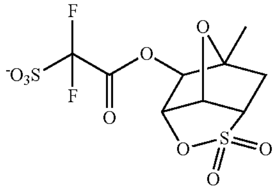
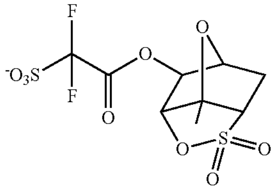
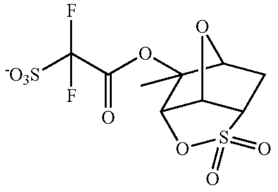
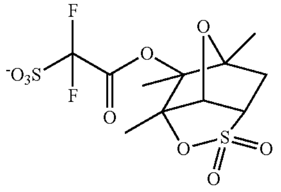
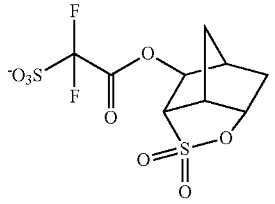
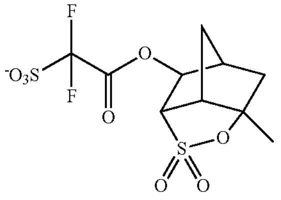
-continued
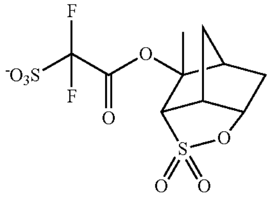
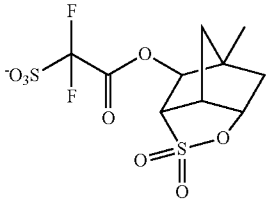
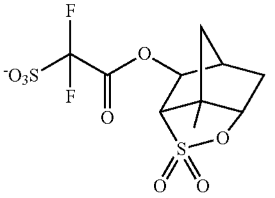
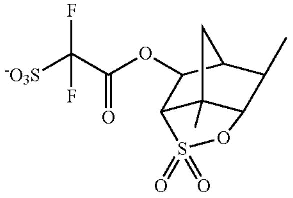
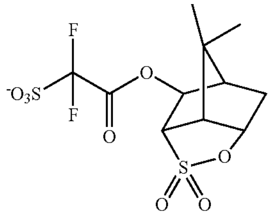
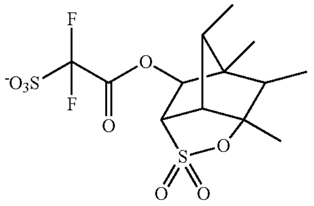
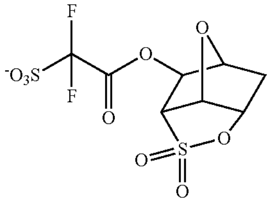
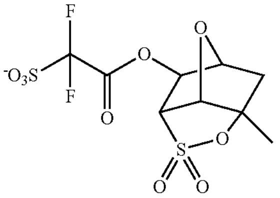
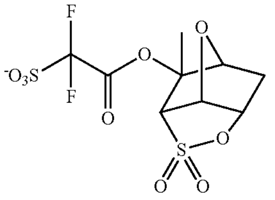
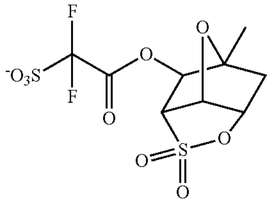
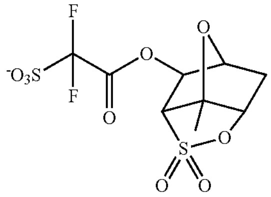
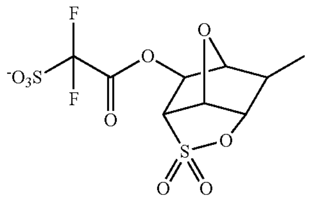

-continued
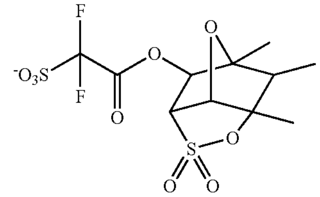
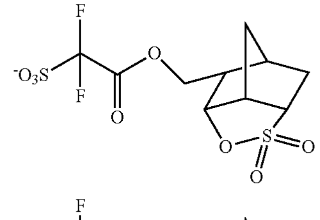
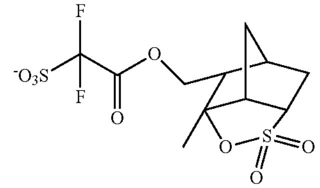
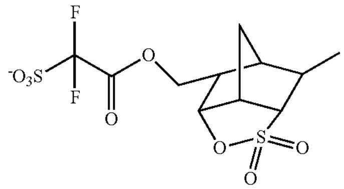
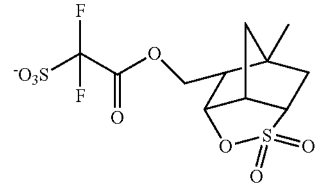
In the formula (IB), examples of the anion in which the hydrogen atom contained in the ring W' is not replaced or is replaced only by a hydrocarbon group (the —$CH_2$— contained in the hydrocarbon group may be replaced by —O—) are the anions below.
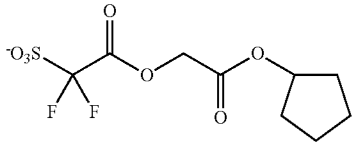
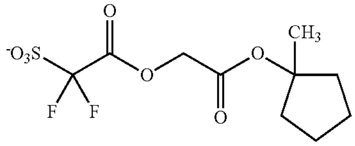
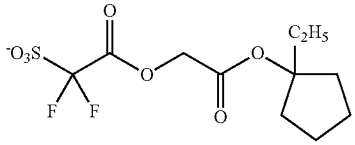
-continued
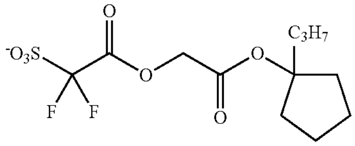
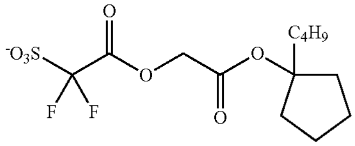
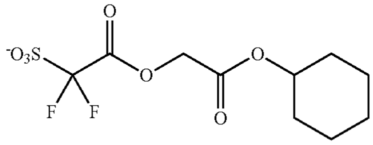
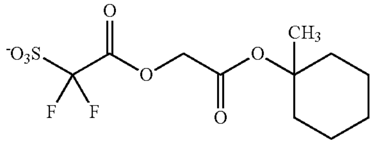
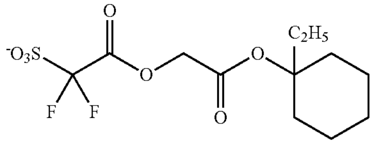
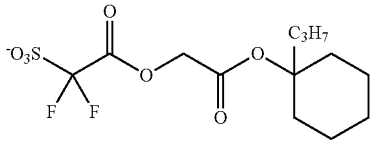
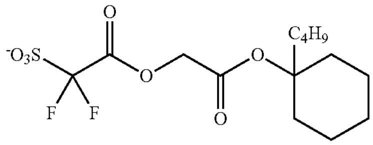
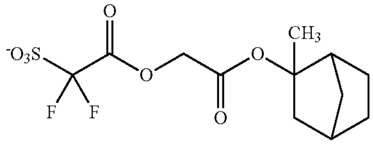
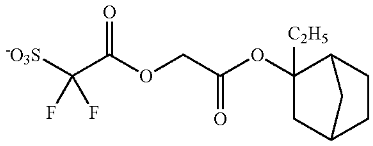
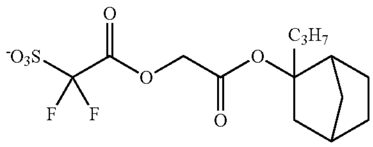
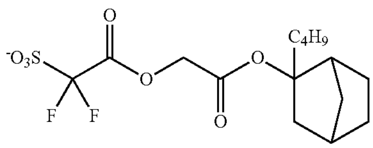

-continued
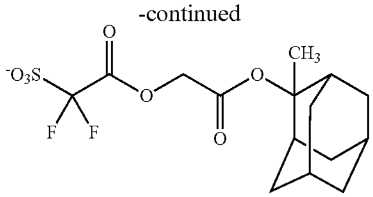
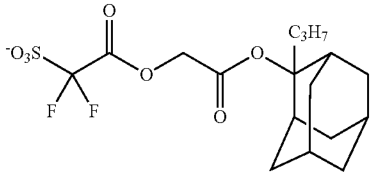
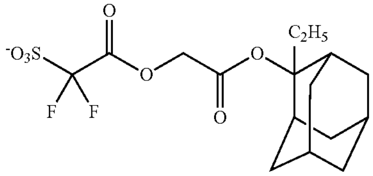
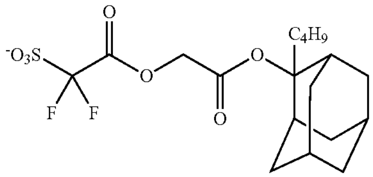
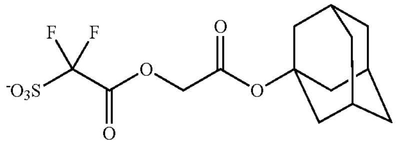
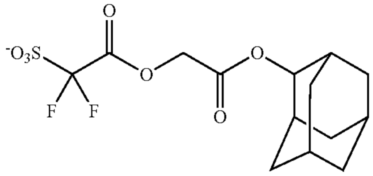
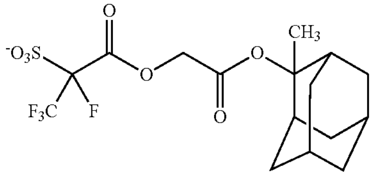
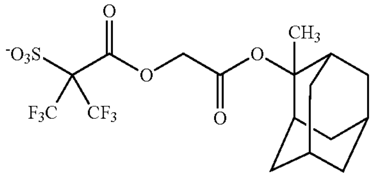
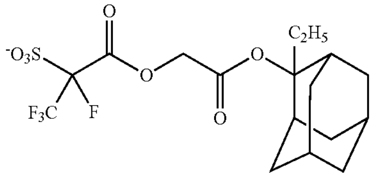
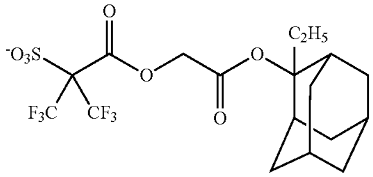
-continued
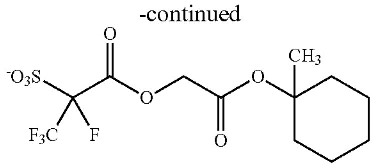
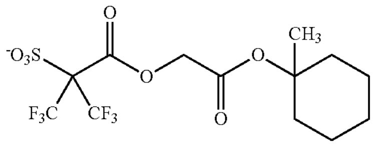
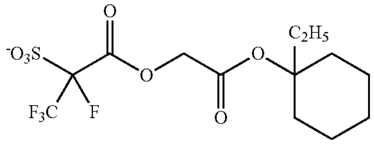
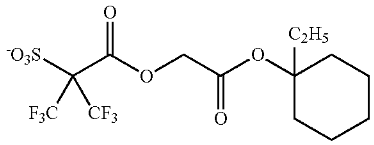
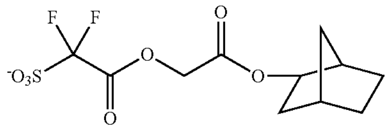
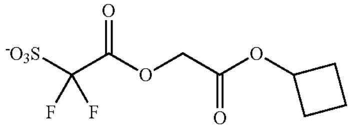
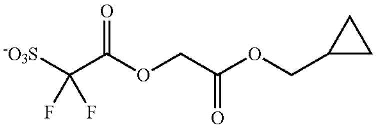
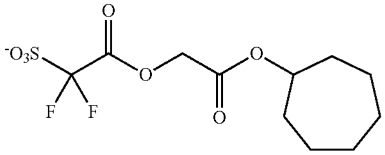
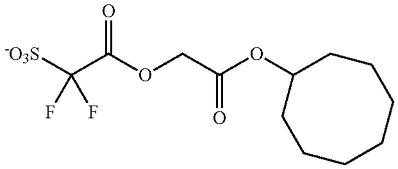
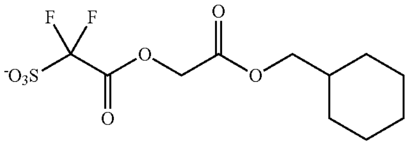
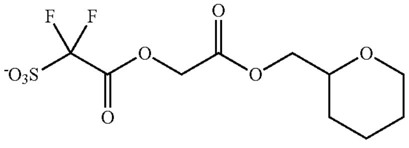
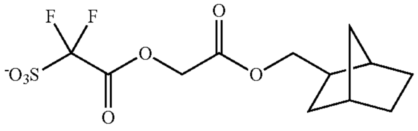

-continued
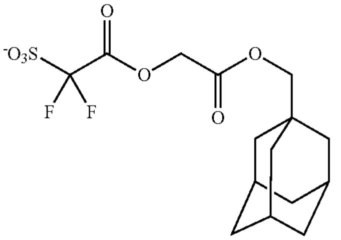
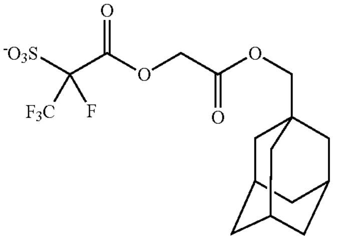
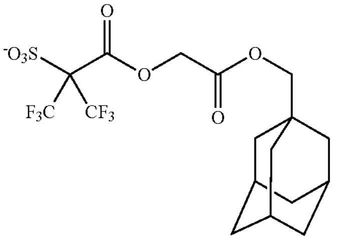
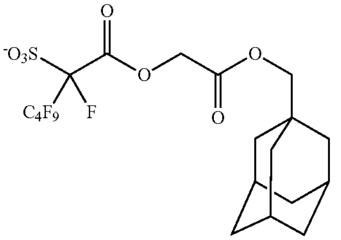
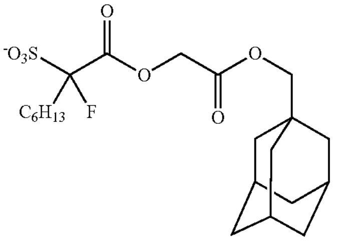
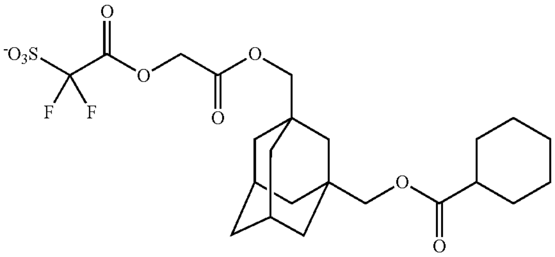
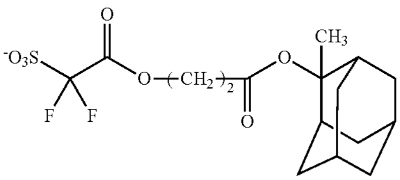
-continued
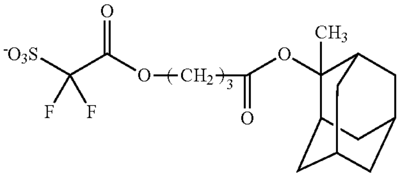
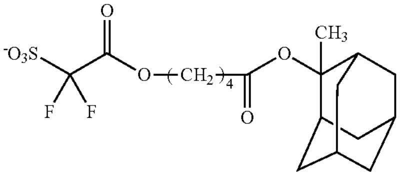
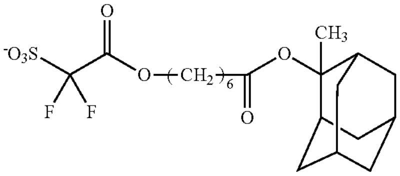
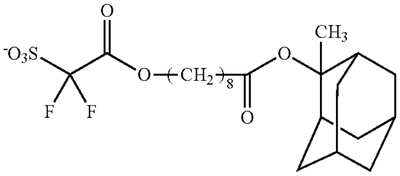
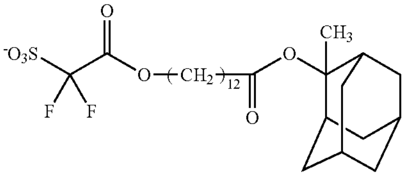
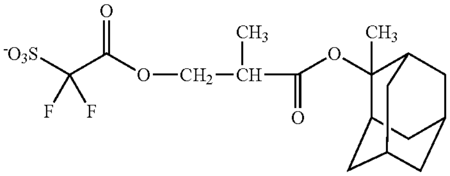
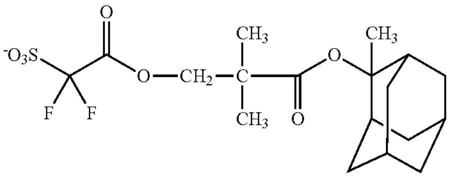
In the formula (IB), examples of the anion in which the hydrogen atom contained in the ring W' is replaced by a hydroxyl group or a hydroxyl group-containing group include the anions below.
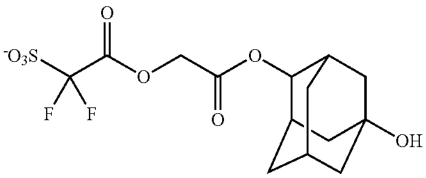

-continued
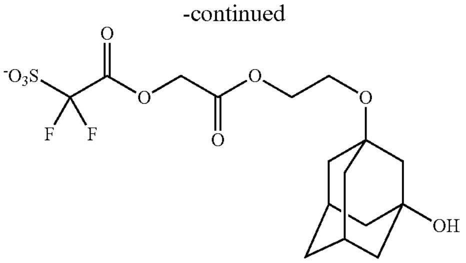
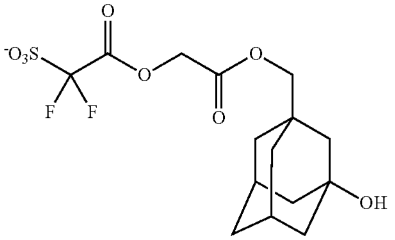
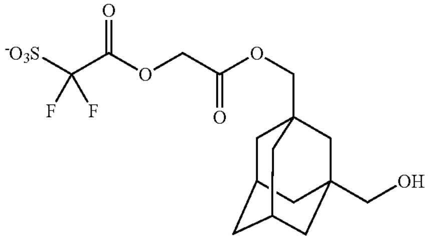
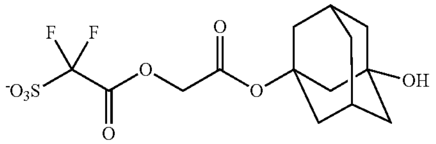
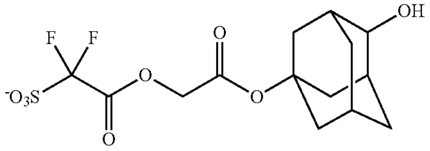
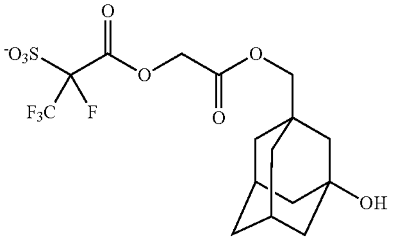
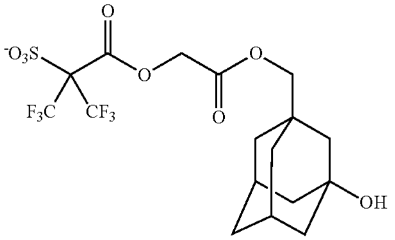
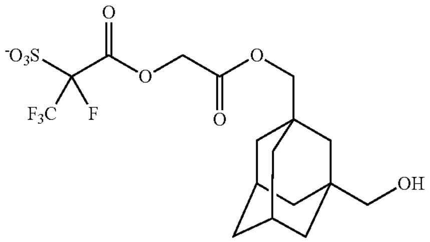
-continued
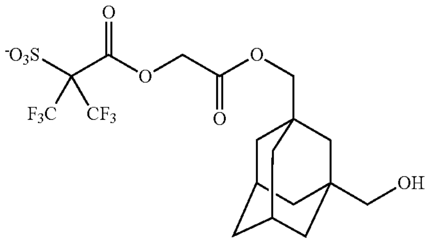
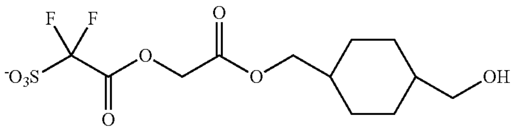
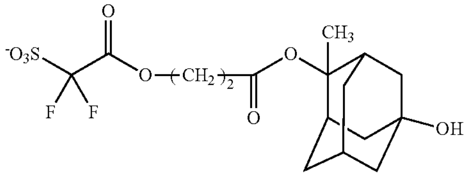
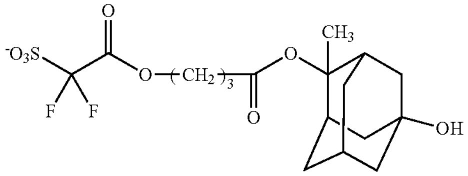
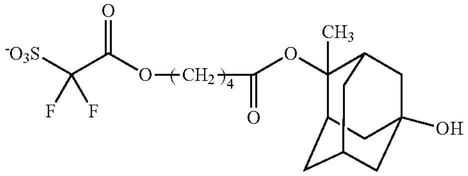
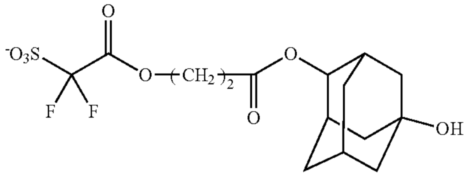
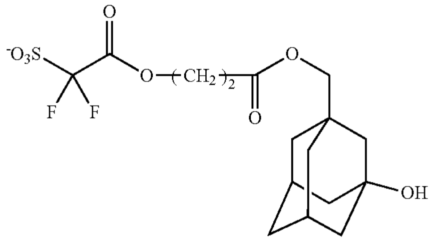
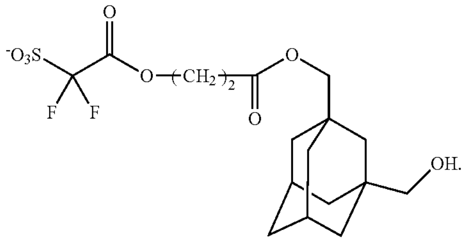
In the formula (IB), examples of the anion having a lactone structure in which two adjacent —$CH_2$— contained in the ring W' is replaced by a —O— and a —CO— group include the anions below.

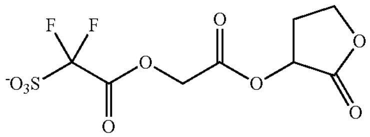
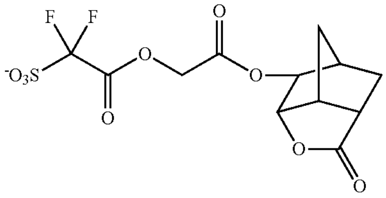
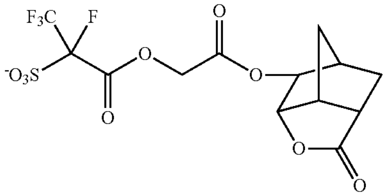
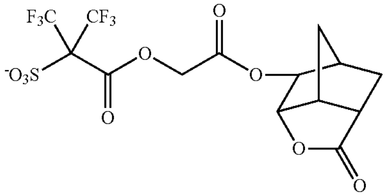
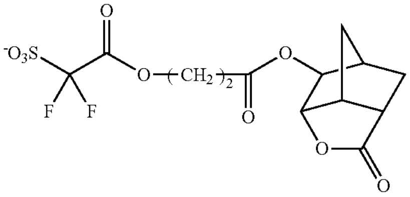
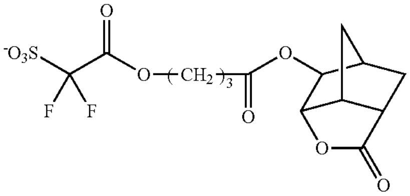
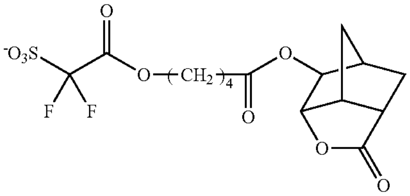
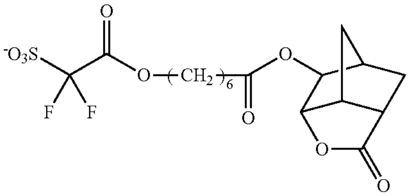
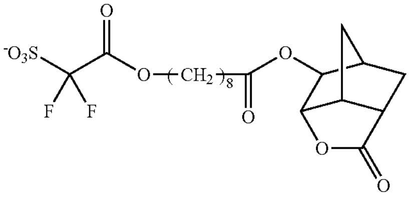
-continued
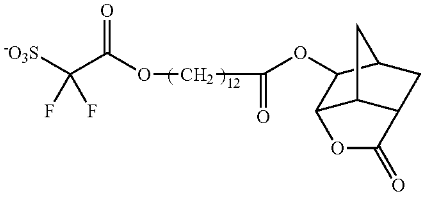
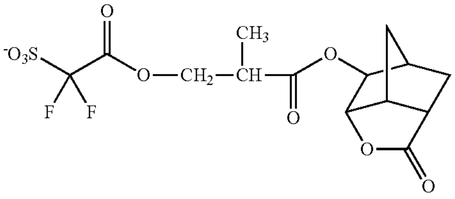
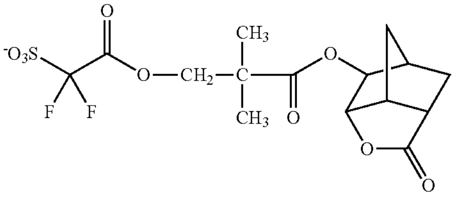
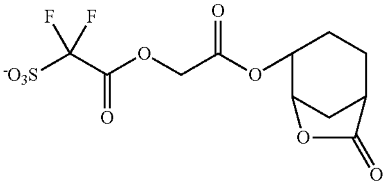
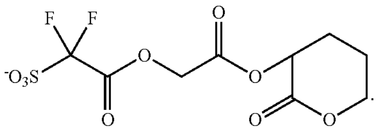
In the formula (IB), examples of the anion having a ketone structure in which the —$CH_2$— contained in the ring W' is replaced by —CO— group include the anions below.
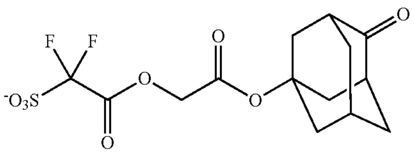
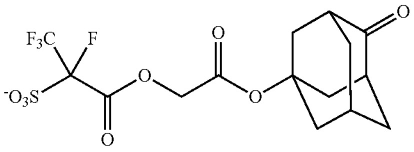
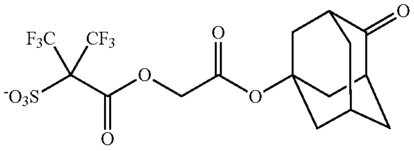
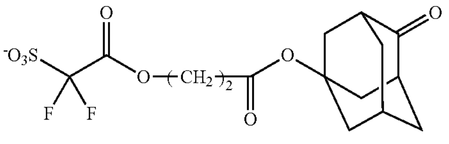

-continued

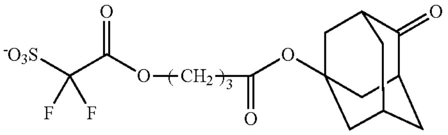

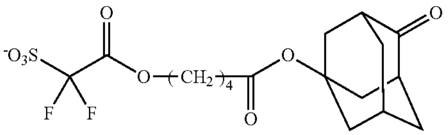

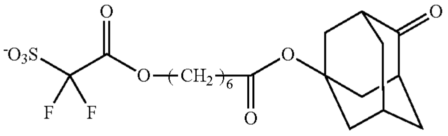

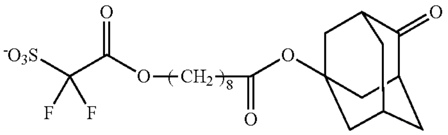

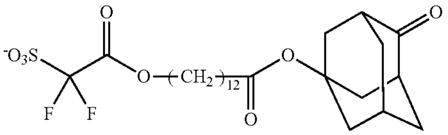

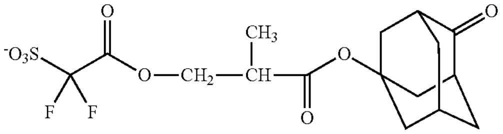

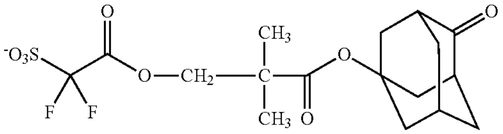

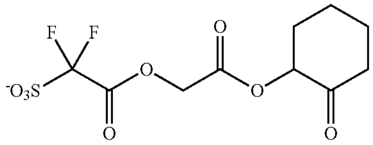

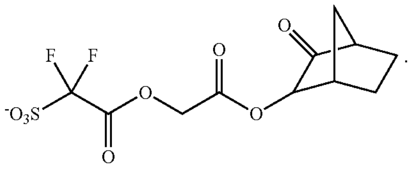

In the formula (IB), examples of the anion in which the hydrogen atom contained in the ring W' is replaced by an aromatic hydrocarbon group include the anions below.

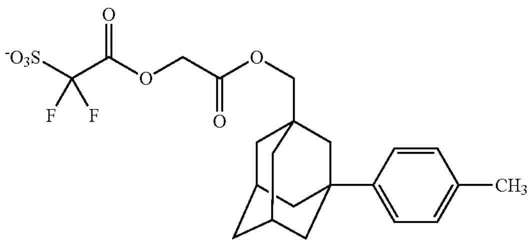

-continued

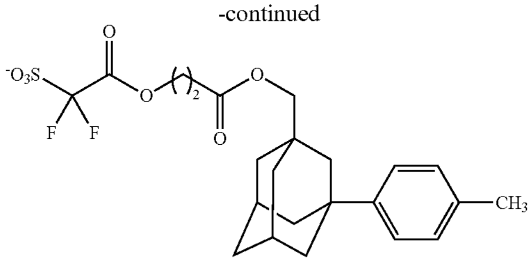

Further, examples of the anion represented by the formula (IB) include the anions below.

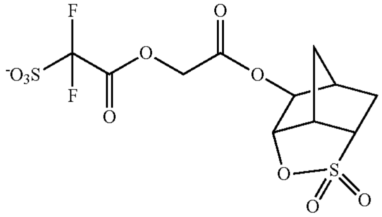

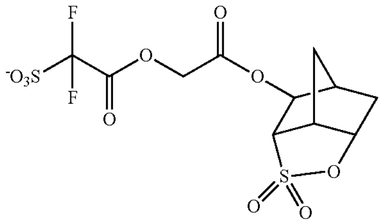

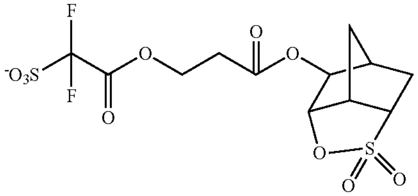

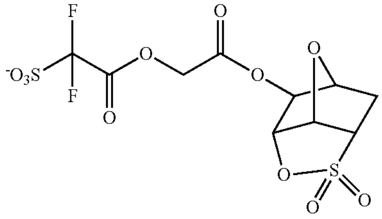

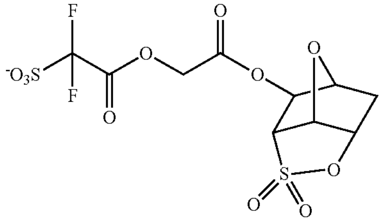

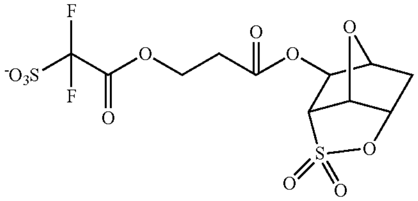

In the formula (IC), examples of the anion in which the hydrogen atom contained in the ring W' is not replaced or is replaced only by a hydrocarbon group (the —$CH_2$— contained in the ring W' may be replaced by a —O—) are the anions below.

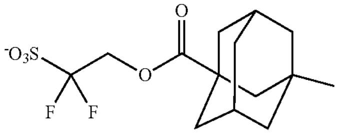
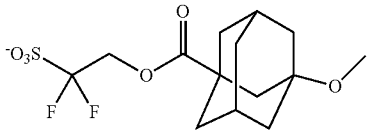
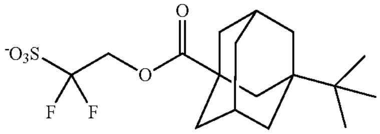
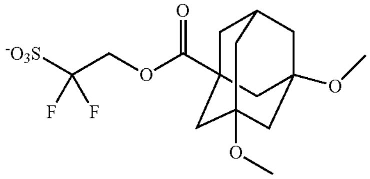
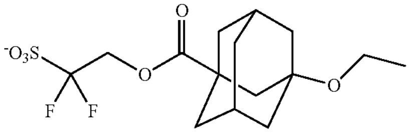
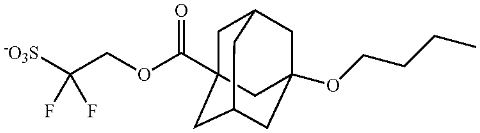
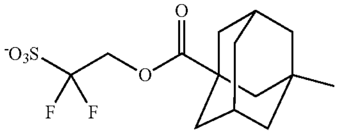
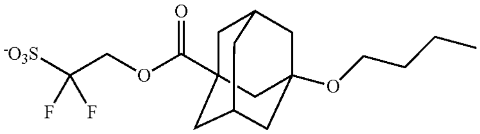

In the formula (IC), examples of the anion in which the hydrogen atom contained in the ring W' is replaced by a hydroxyl group or a hydroxyl group-containing group include the anions below.

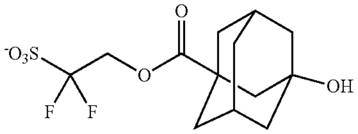
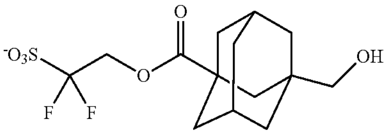

-continued

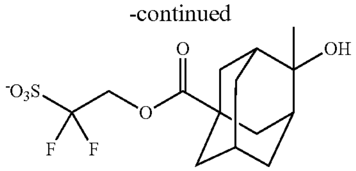
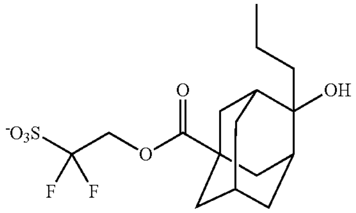
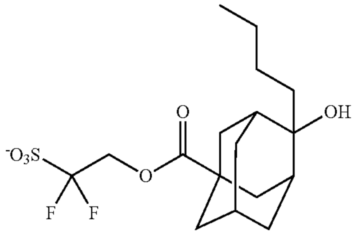
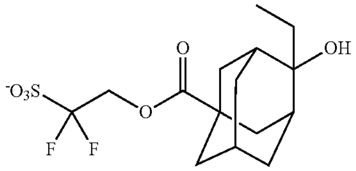
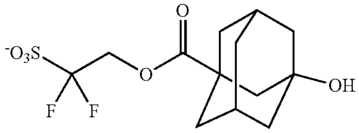
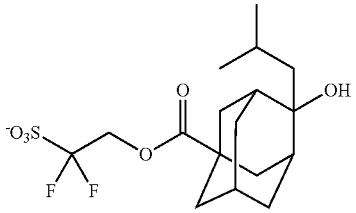
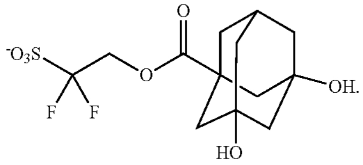

In the formula (IC), examples of the anion having a ketone structure in which one —$CH_2$— contained in the ring W' is replaced by —CO— group include the groups below.

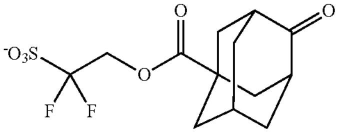
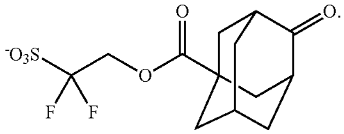

Further, examples of the anion represented by the formula (IC) include the anions below.

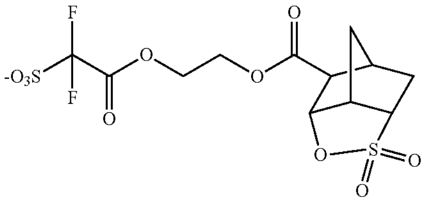

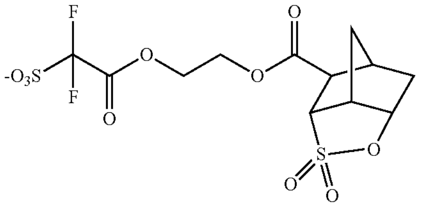

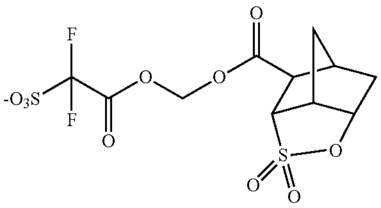

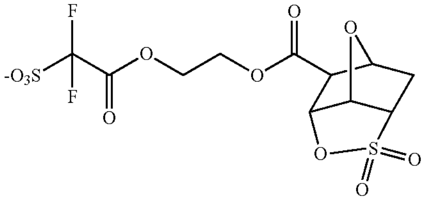

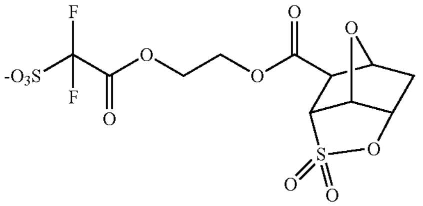

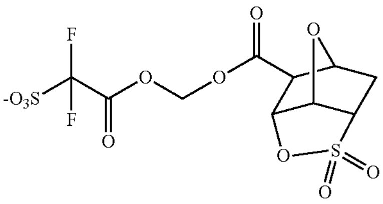

In the formula (ID), examples of the anion in which the hydrogen atom contained in the ring W' is not replaced or is replaced only by a hydrocarbon group (the —$CH_2$— contained in the ring W' may be replaced by —O—) include the anions below.

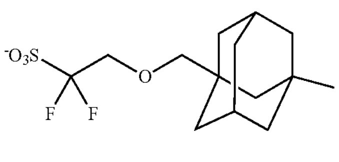

-continued

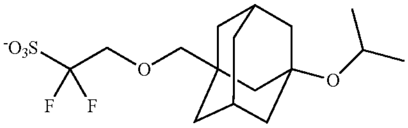

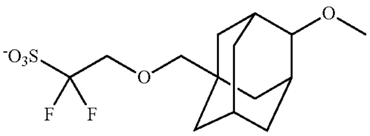

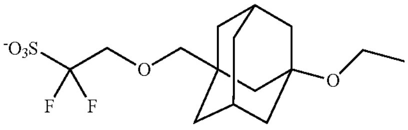

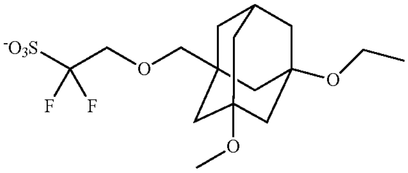

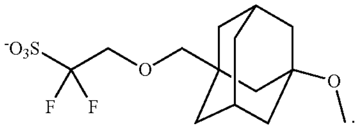

In the formula (ID), examples of the anion in which the hydrogen atom contained in the ring W' is replaced by a hydroxyl group or a hydroxyl group-containing group include the anions below.

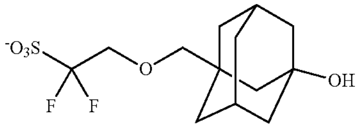

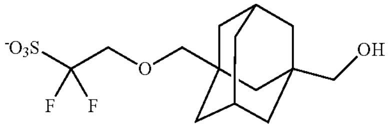

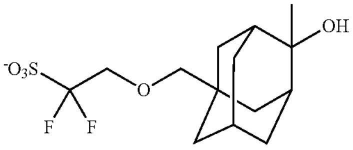

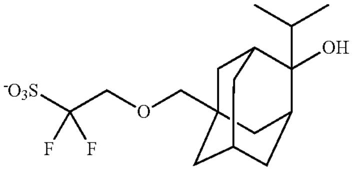

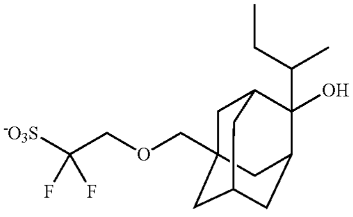

-continued

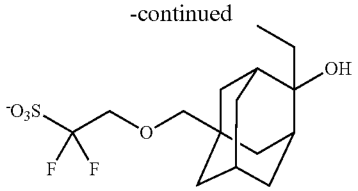

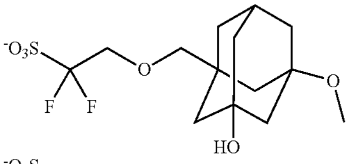

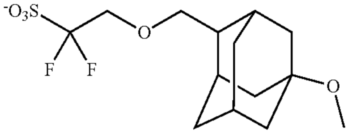

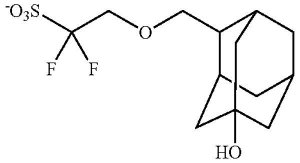

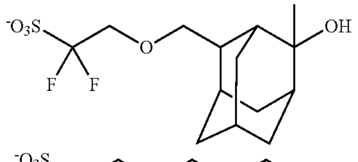

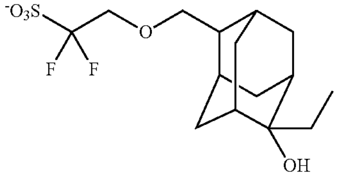

In the formula (ID), examples of the anion having a ketone structure in which one —$CH_2$— contained in the ring W is replaced by —CO— group include the groups below.

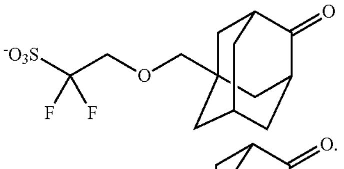

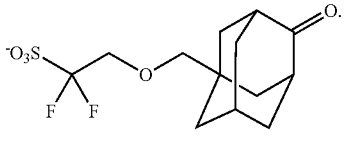

Further, examples of the anion represented by the formula (ID) include the anions below.

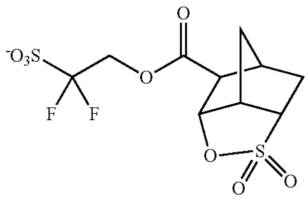

-continued

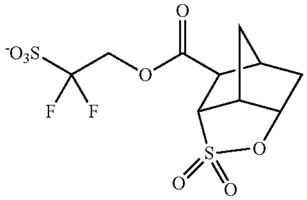

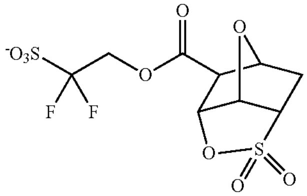

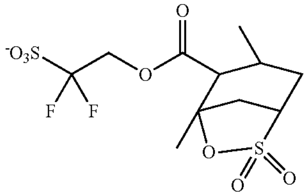

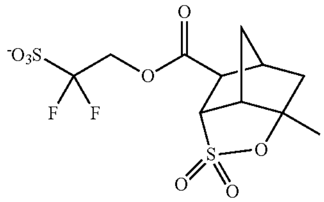

Examples of the $Z^+$ of the salt represented by the formula (I) include cations represented by the formula (IXa), the formula (IXb), the formula (IXc) and the formula (IXd).

(IXz)

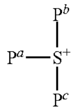

(IXb)

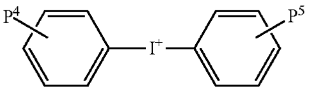

(IXc)

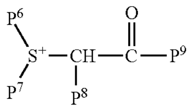

(IXd)

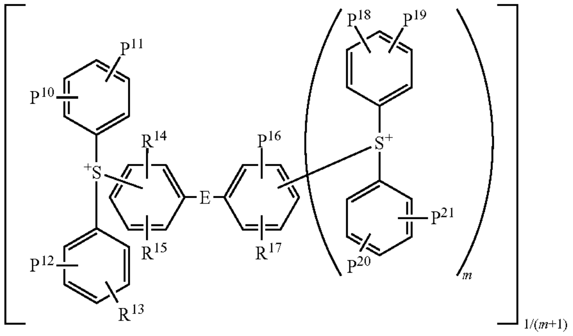

wherein $P^a$, $P^b$ and $P^c$ in the formula (IXz) independently represent a linear or branched chain $C_1$ to $C_{30}$ alkyl group, a $C_3$ to $C_{30}$ alicyclic hydrocarbon group or a $C_6$ to $C_{20}$ aromatic hydrocarbon group, when any of $P^a$, $P^b$ and $P^c$ are the alkyl group, the hydrogen atom contained in the alkyl group may be replaced by a hydroxyl group, a linear or branched chain $C_1$ to $C_{12}$ alkyl group, a $C_1$ to $C_{12}$ alkoxy group or a $C_3$ to $C_{12}$ saturated cyclic hydrocarbon group, and when any of $P^a$, $P^b$ and $P^c$ are the alicyclic hydrocarbon group or the aromatic hydrocarbon group, the hydrogen atom contained in the alicyclic hydrocarbon group or the aromatic hydrocarbon group may be replaced by a halogen atom, a hydroxyl group, a linear or branched chain $C_1$ to $C_{12}$ alkyl group, a linear or branched chain $C_1$ to $C_{12}$ alkoxy group, a $C_6$ to $C_{12}$ aryl group, a $C_7$ to $C_{12}$ aralkyl group, a glycidoxy group and a $C_2$ to $C_4$ acyl group;

$P^4$ and $P^5$ in the formula (IXb) independently represent a hydrogen atom, a hydroxyl group, a linear or branched chain $C_1$ to $C_{12}$ alkyl group or a $C_1$ to $C_{12}$ alkoxyl group;

$P^6$ and $P^7$ in the formula (IXc) independently represent a linear or branched chain $C_1$ to $C_{12}$ alkyl group or a $C_3$ to $C_{12}$ cycloalkyl group, or $P^6$ and $P^7$ may be bonded to form a $C_3$ to $C_{12}$ ring;

$P^8$ represents a hydrogen atom;

$P^9$ represents a linear or branched chain $C_1$ to $C_{12}$ alkyl group or $C_6$ to $C_{20}$ aromatic cyclic group which is optionally substituted with a $C_3$ to $C_{12}$ cycloalkyl group, or $P^8$ and $P^9$ may be bonded to form a $C_3$ to $C_{12}$ ring;

$P^{10}$ to $P^{21}$ in the formula (IXd) independently represent a hydrogen atom, a hydroxyl group, a $C_1$ to $C_{12}$ alkyl group or a $C_1$ to $C_{12}$ alkoxyl group;

E represents a sulfur atom or an oxygen atom; and m represents 0 or 1.

Examples of the alkyl group, the alicyclic hydrocarbon group, the alkoxyl group, cyclic hydrocarbon group, cycloalkyl group, aromatic hydrocarbon group include the same meaning as defined above.

Among the cations represented by the formula (IXz), a cation represented by the formula (IXa) is preferable.

(IXa)

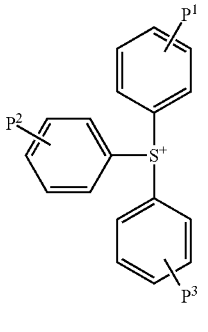

wherein $P^1$ to $P^3$ independently represent a hydrogen atom, a hydroxyl group, a halogen atom, a linear or branched chain $C_1$ to $C_{12}$ alkyl group, a linear or branched chain $C_1$ to $C_{12}$ alkoxy group or a $C_4$ to $C_{36}$ alicyclic hydrocarbon group, and the hydrogen atom contained in the alicyclic hydrocarbon group may be replaced by a halogen atom, a hydroxyl group, a linear or branched chain $C_1$ to $C_{12}$ alkyl group, a linear or branched chain $C_1$ to $C_{12}$ alkoxy group, a $C_6$ to $C_{12}$ aryl group, a $C_7$ to $C_{12}$ aralkyl group, a glycidoxy group and a $C_2$ to $C_4$ acyl group.

Particularly, the alicyclic hydrocarbon group is suitably a group-containing adamantyl structure or isobornyl structure, and preferably 2-alkyl-2-adamantyl group, 1-(1-adamantyl)-1-alkyl group and isobornyl group.

Specific examples of the cation represented by the formula (IXa) include a cation below.

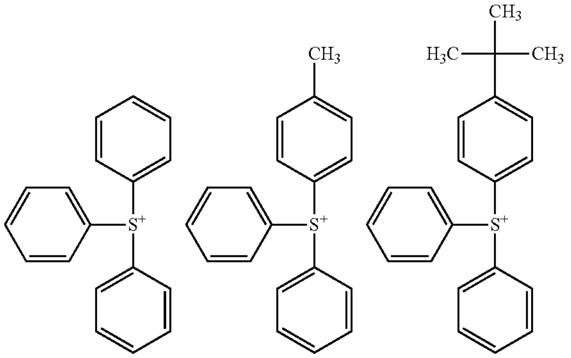

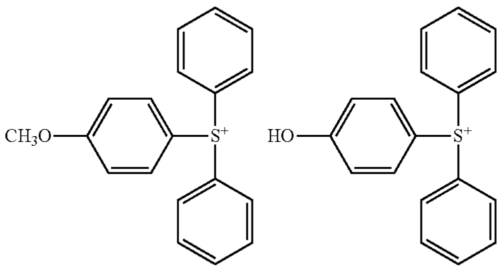

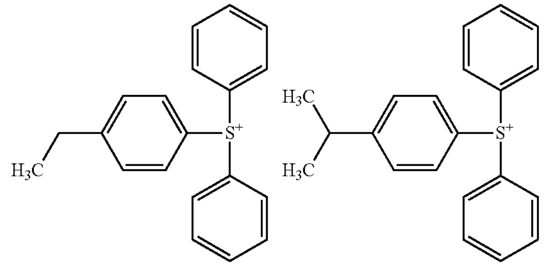

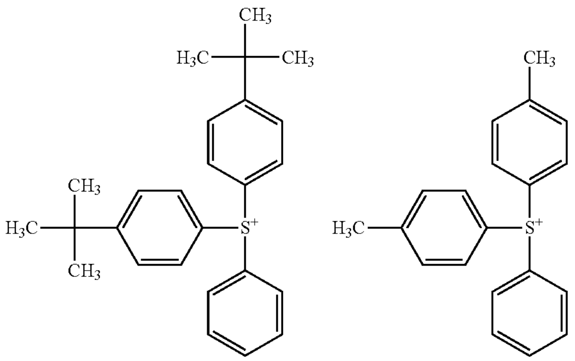

-continued

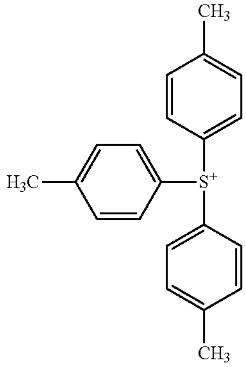

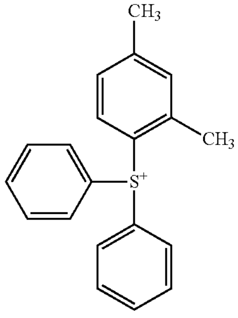

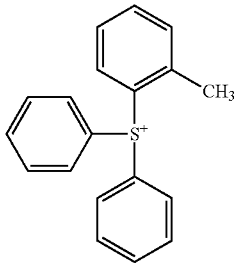

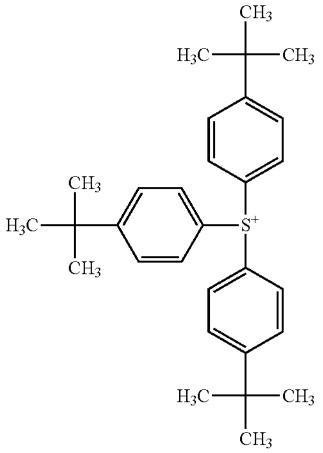

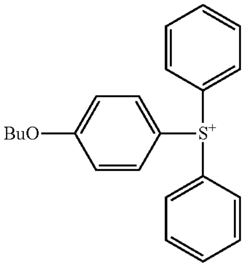

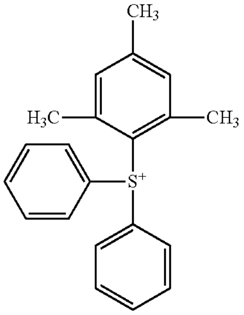

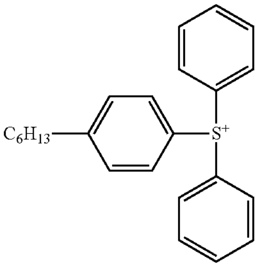

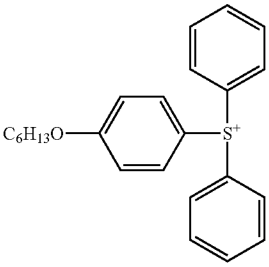

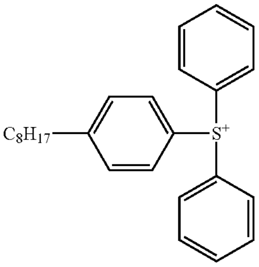

-continued

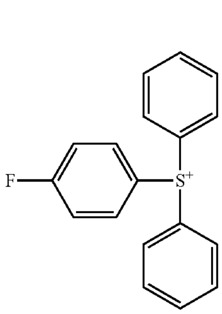

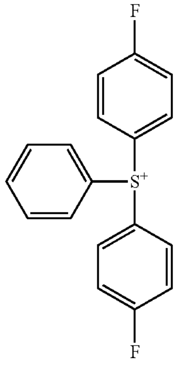

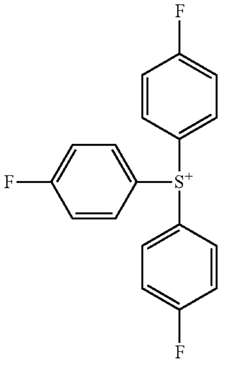

Among the cation represented by the formula (IXa), a cation represented by the formula (IXe) is preferable because of easily-manufacturing.

(IXe)

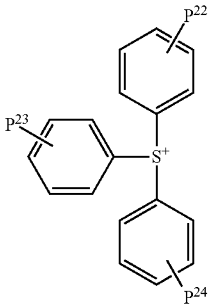

wherein $P^{22}$, $P^{23}$ and $P^{24}$ independently represent a hydrogen atom, a hydroxyl group, a halogen atom, a linear or branched chain $C_1$ to $C_{12}$ alkyl group or a linear or branched chain $C_1$ to $C_{12}$ alkoxy group.

Specific examples of the cation represented by the formula (IXb) include a cation below.

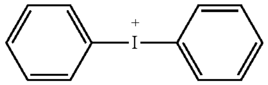

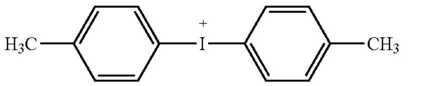

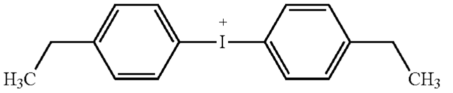

-continued
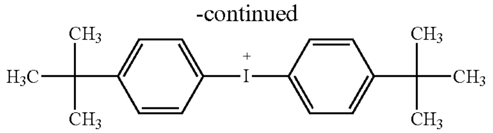
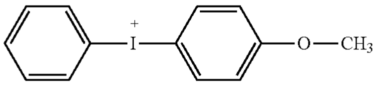
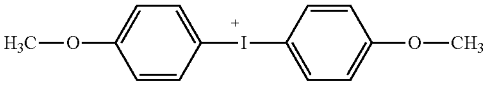
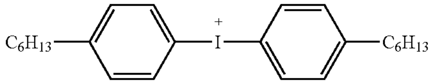
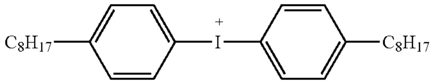
Specific examples of the cation represented by the formula (IXc) include a cation below.
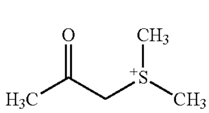
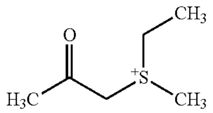
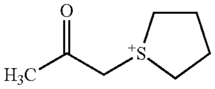
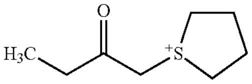
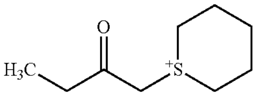
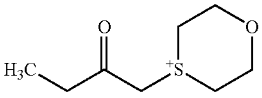
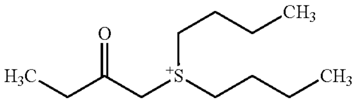
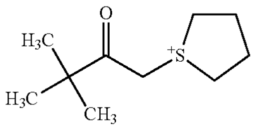
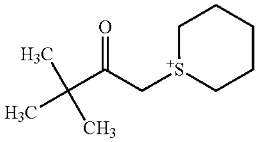
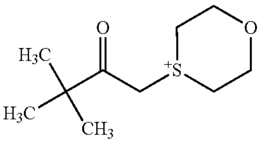
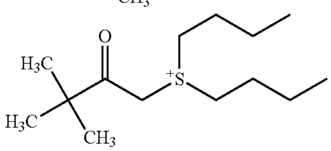
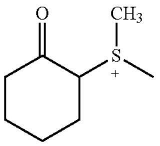
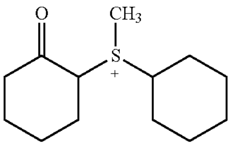
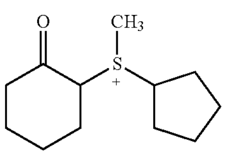
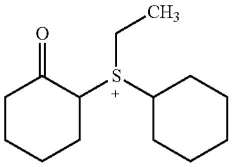
-continued
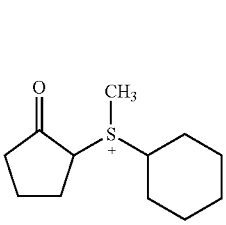
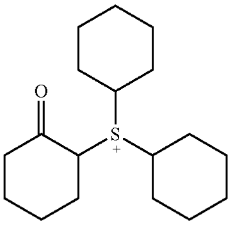
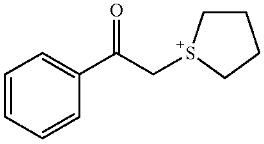
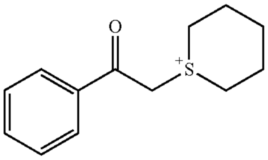
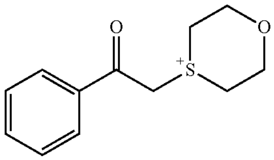
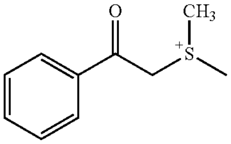
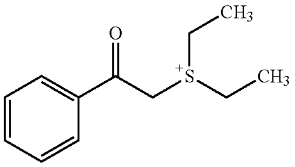
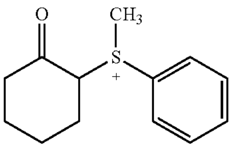
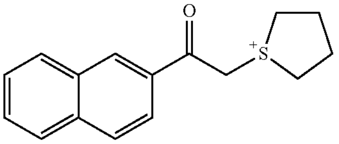
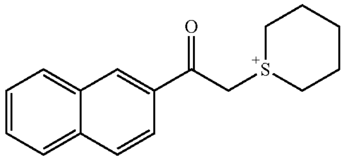
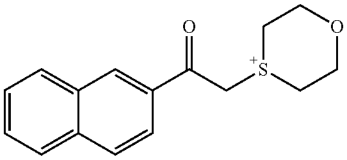
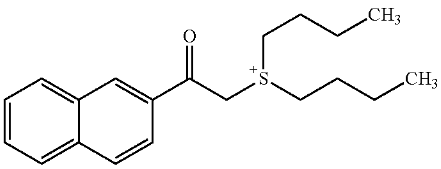
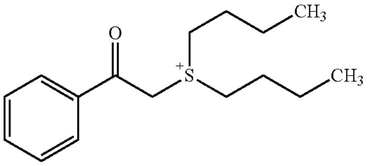
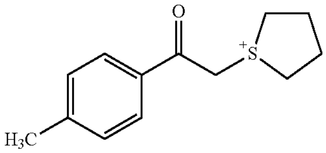

-continued
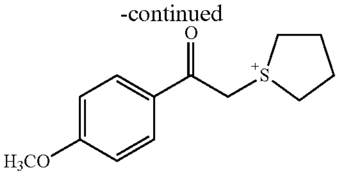
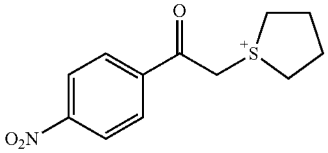
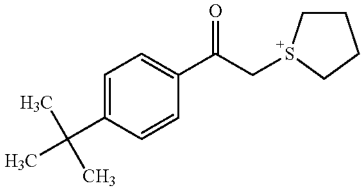
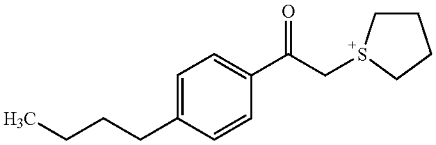
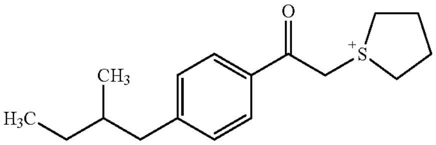
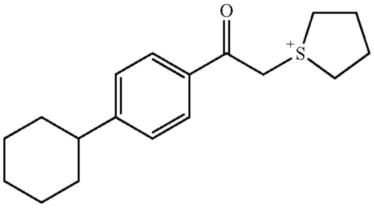
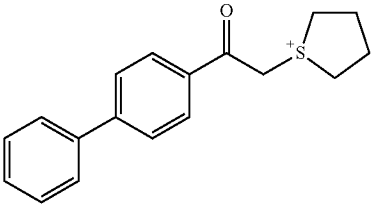
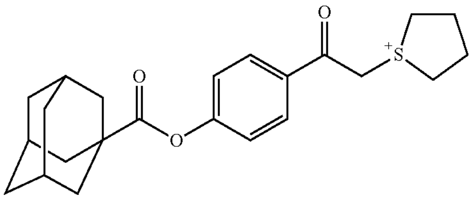
Specific examples of the cation represented by the formula (IXd) include a cation below.
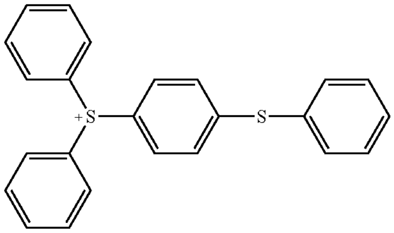
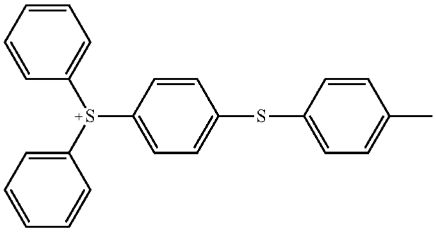
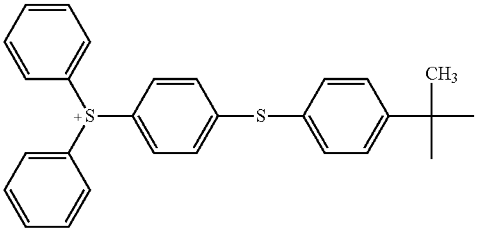
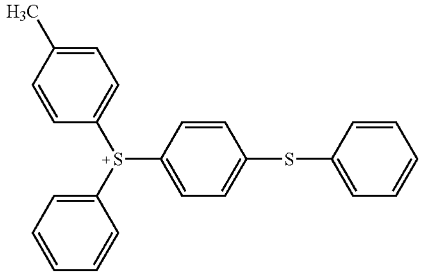
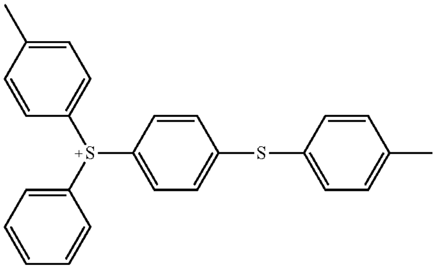
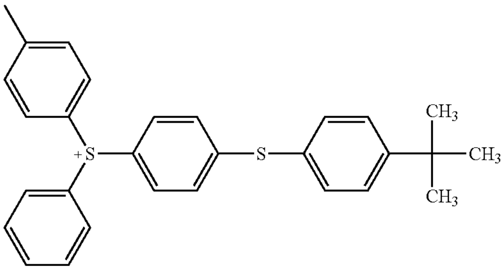

-continued
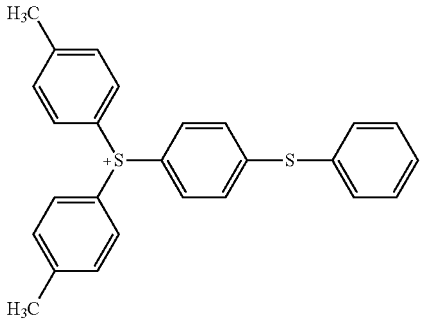
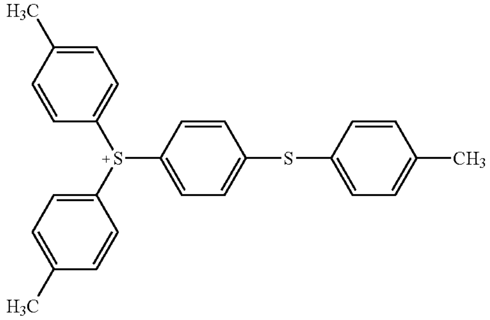
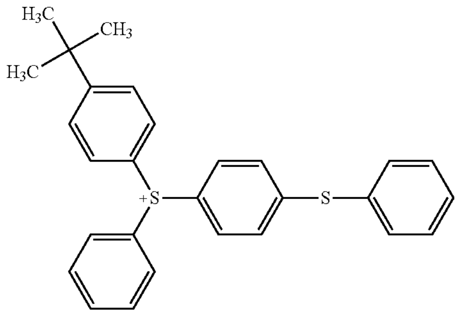
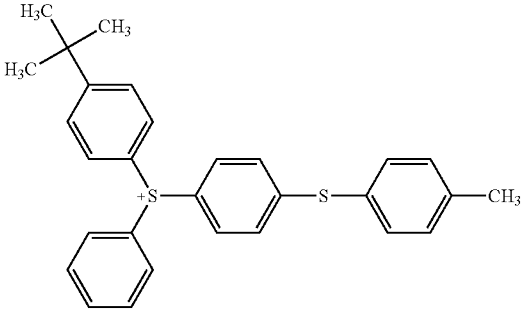
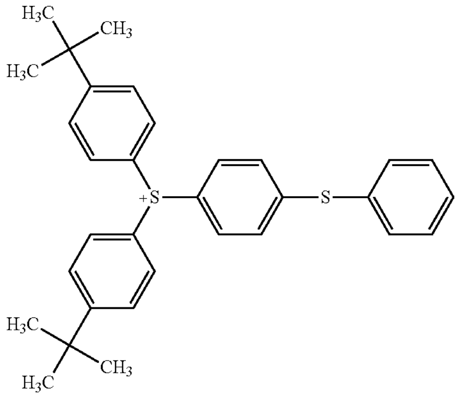
-continued
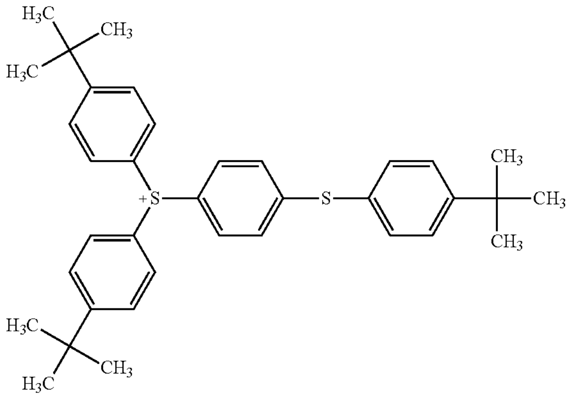
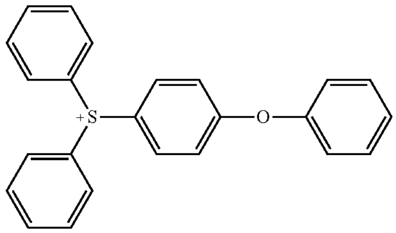
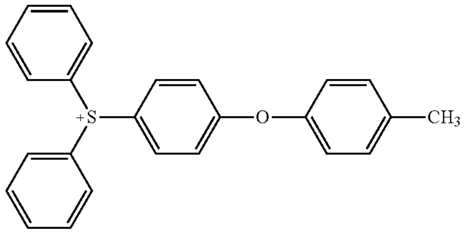
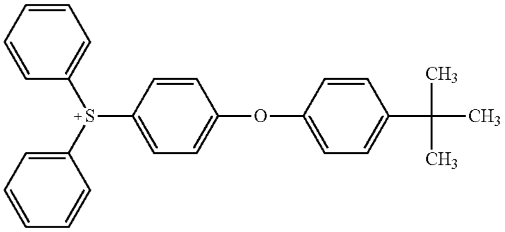
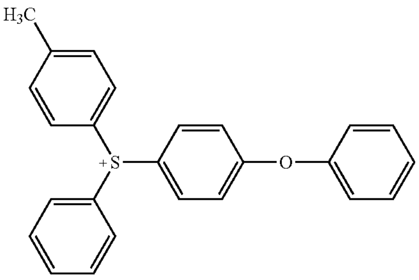
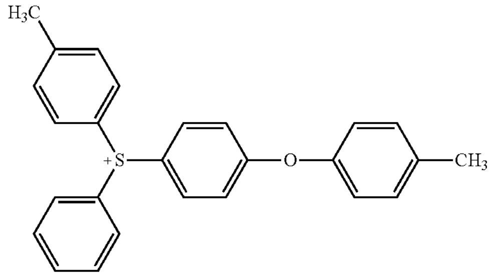

-continued
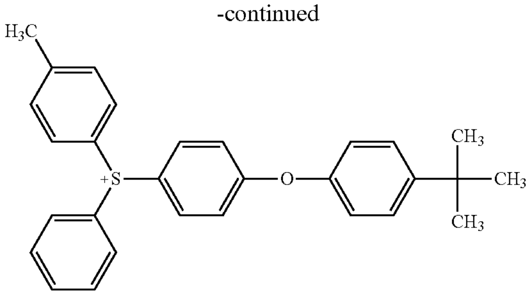
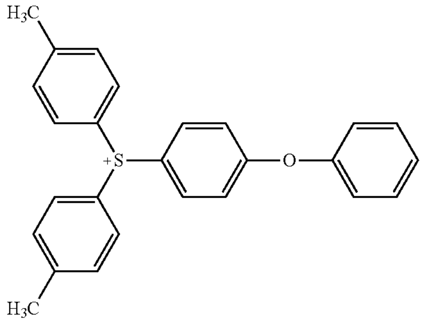
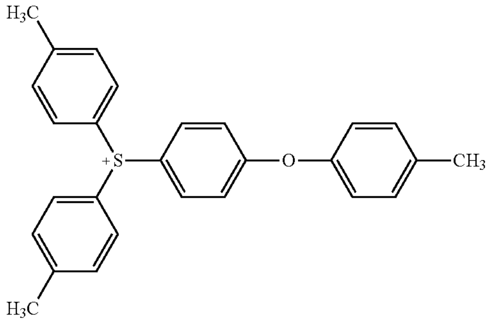
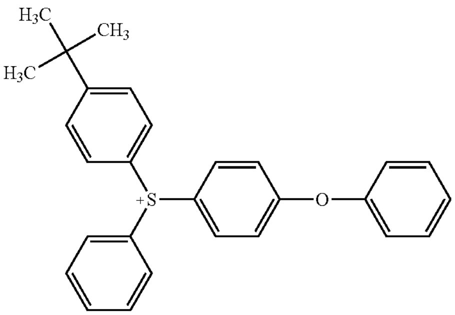
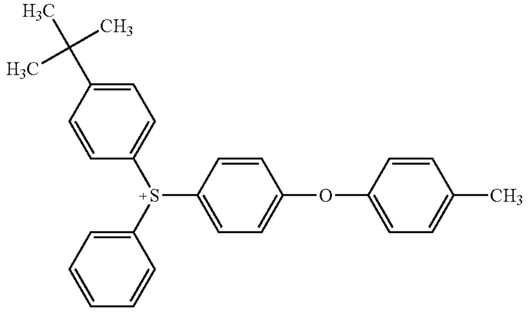
-continued
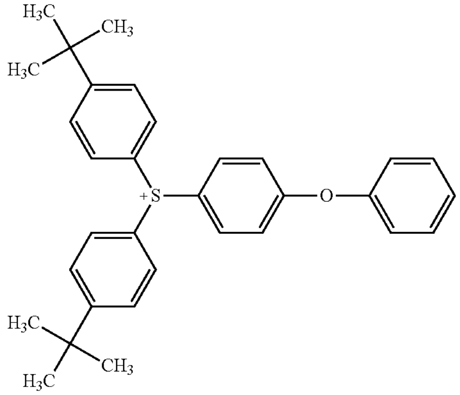
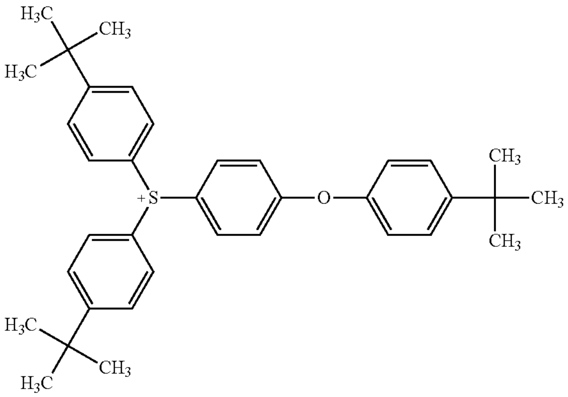
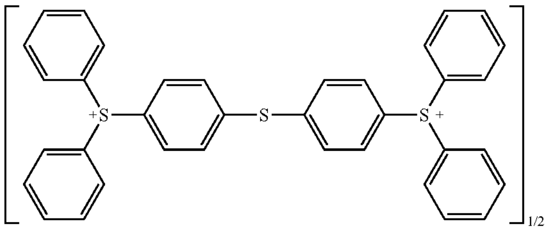
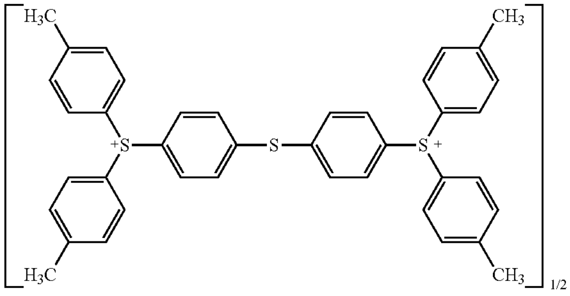
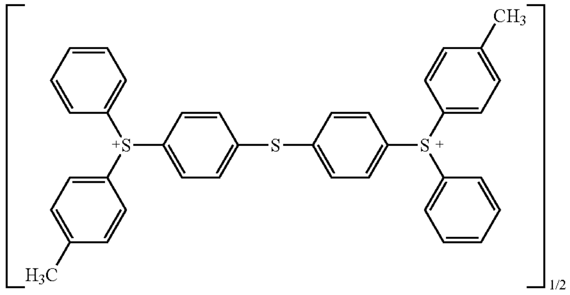

-continued
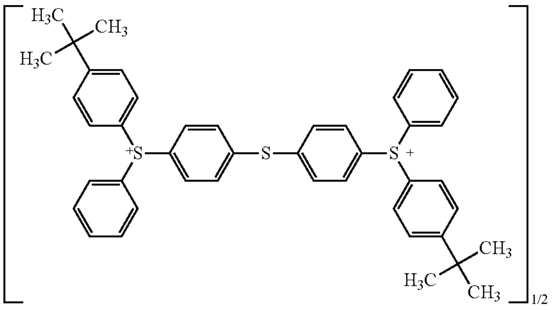
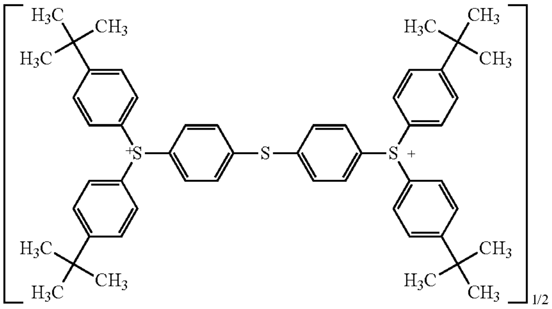
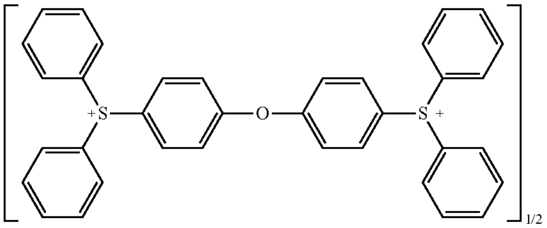
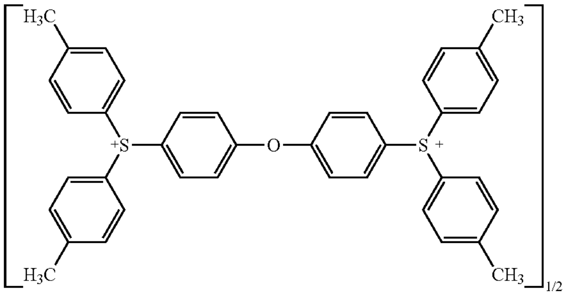
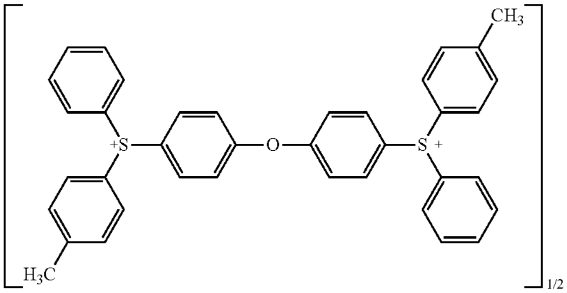
-continued
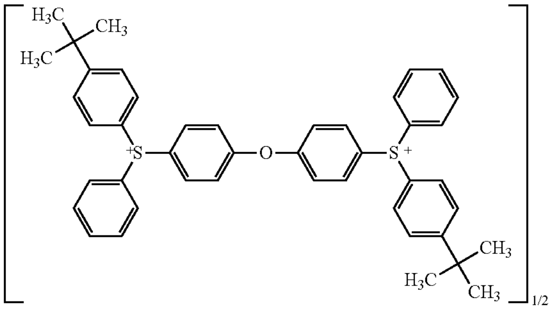
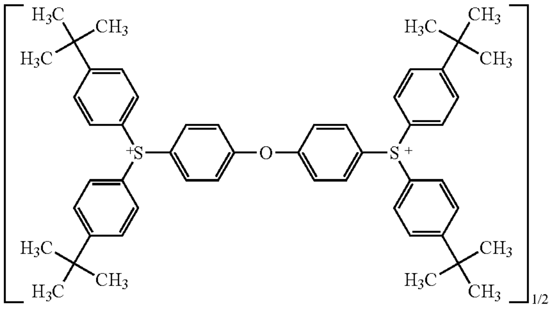
Among theses, $Z^+$ is preferably an arylsulfonium cation.
The above-mentioned anions and cations can be combined as desired.
Examples of the salt represented by the formula (I) include the compounds represented by the formula (Xa) to the formula (Xi).
(Xa)
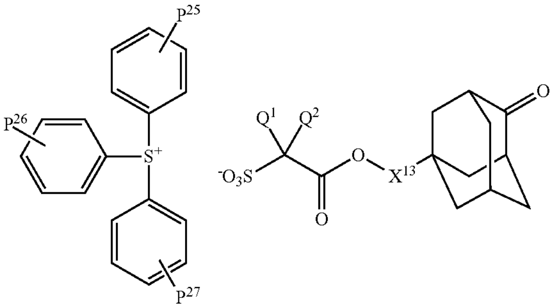
(Xb)
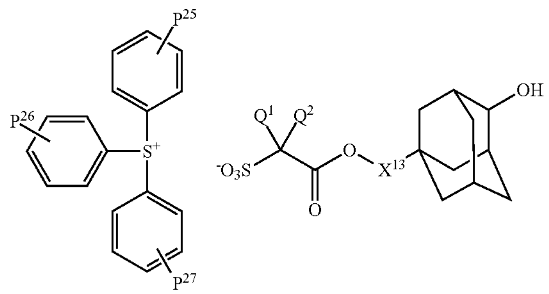

-continued
(Xc)
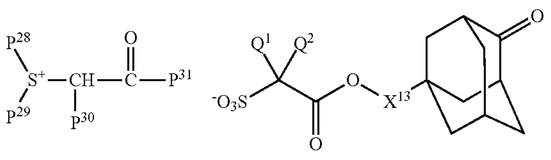
(Xd)
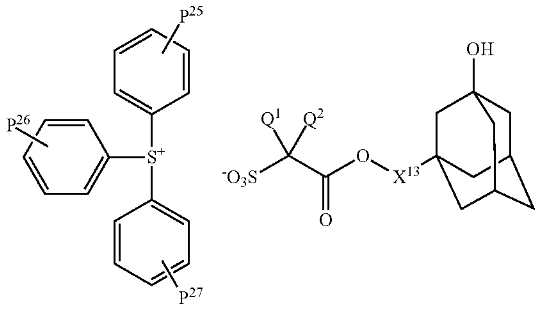
(Xe)
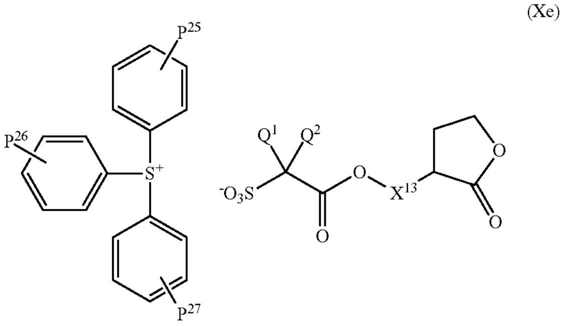
(Xf)
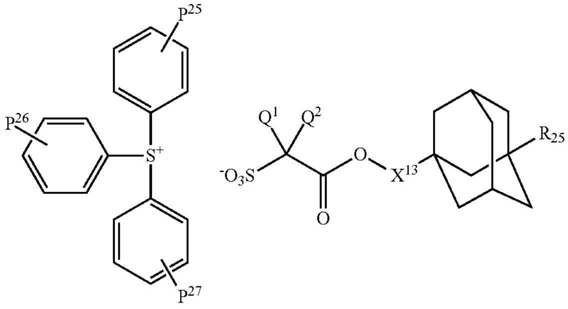
(Xg)
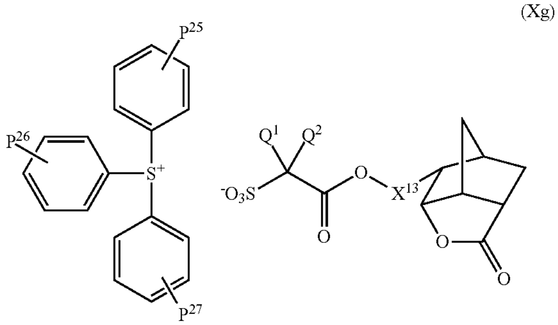
-continued
(Xh)
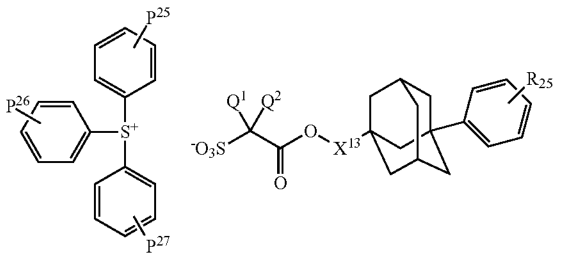
(Xi)
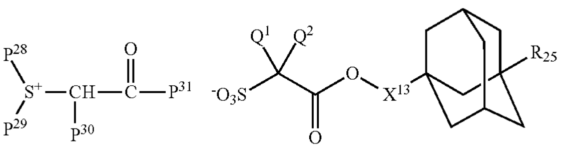
(Xj)
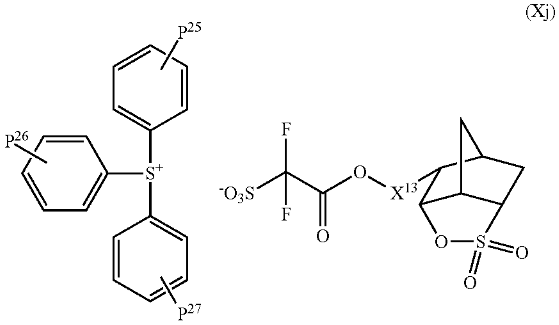
(Xk)
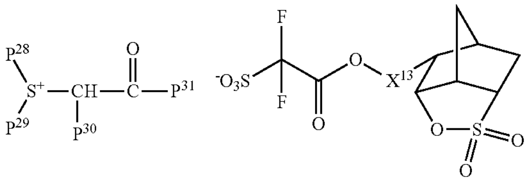
(Xl)
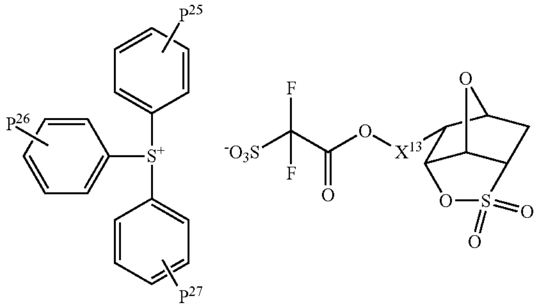
(Xm)
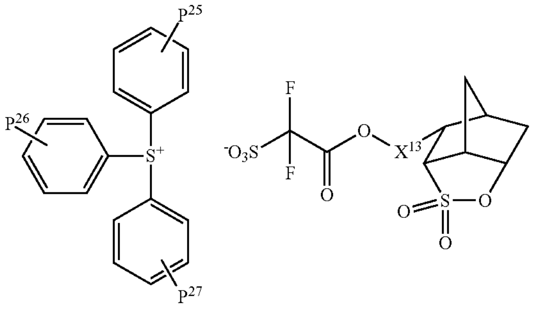

-continued (Xn)

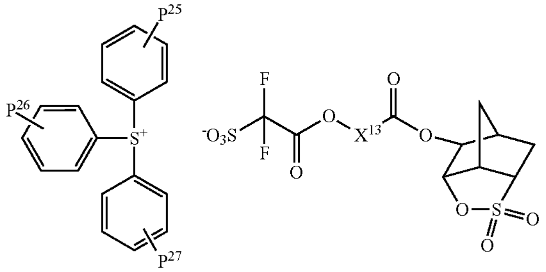

(Xo)

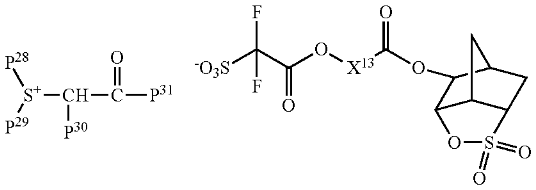

wherein $P^{25}$, $P^{26}$ and $P^{27}$ independently represent a hydrogen atom, a linear or branched chain $C_1$ to $C_4$ aliphatic hydrocarbon group or a $C_4$ to $C_{36}$ alicyclic hydrocarbon group;

$P^{28}$ and $P^{29}$ independently represent a linear or branched chain $C_1$ to $C_{12}$ aliphatic hydrocarbon group or a $C_4$ to $C_{36}$ alicyclic hydrocarbon group, or $P^8$ and $P^9$ can be bonded together to form a $C_2$ to $C_6$ ring that includes $S^+$;

$P^{30}$ represent a linear or branched chain $C_1$ to $C_{12}$ aliphatic hydrocarbon group, a $C_4$ to $C_{36}$ alicyclic hydrocarbon group or an optionally substituted $C_6$ to $C_{20}$ aromatic hydrocarbon group, or $P^{30}$ and $P^{31}$ can be bonded together to form a $C_3$ to $C_{12}$ ring, and the —$CH_2$— contained in the ring may be replaced by —CO—, —O—, —S—, —$SO_2$— or —$N(R^c)$—;

$Q^1$, $Q^2$ and $R^c$ have the same meaning as defined above and $X^{13}$ represents a single bond or a —$CH_2$— group.

Examples of the ring formed by $P^{28}$ and $P^{29}$ bonded together include tetrahydrothiophenium group.

Examples of the ring formed by $P^{30}$ and $P^{31}$ bonded together include the group represented by the formula (W13) to the formula (W15) described above.

Among the abovementioned combinations, examples include the salts below.

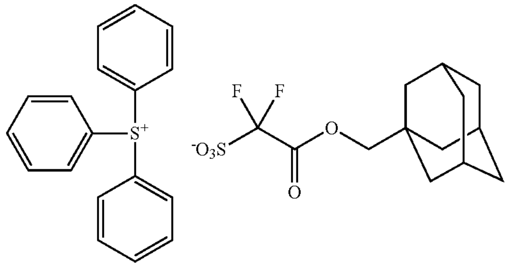

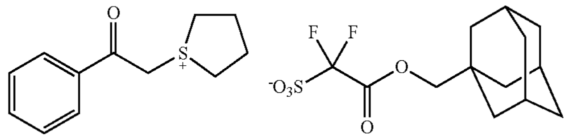

-continued

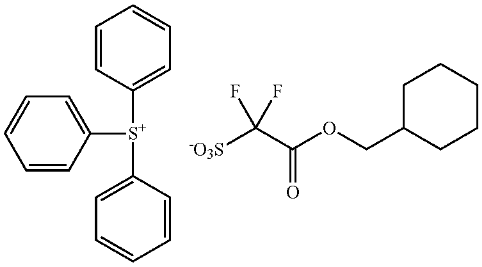

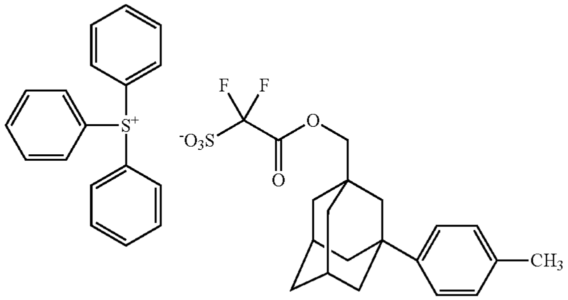

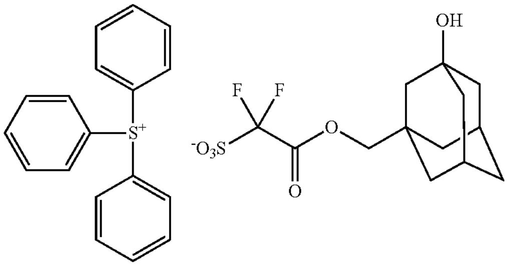

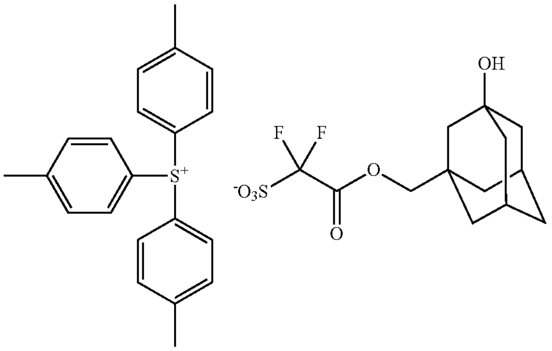

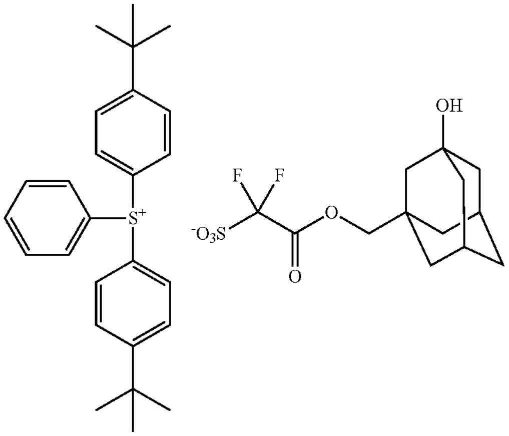

-continued
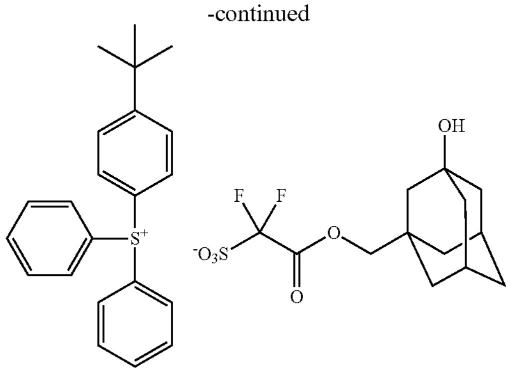
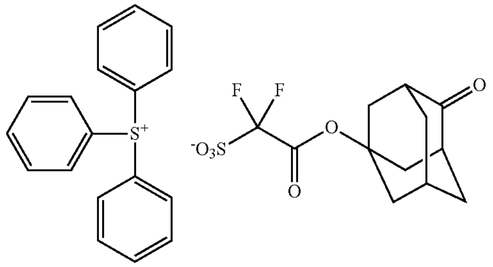
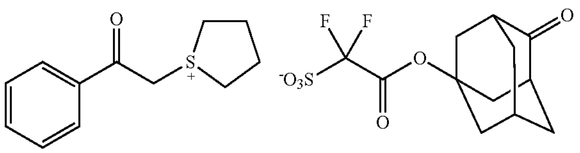
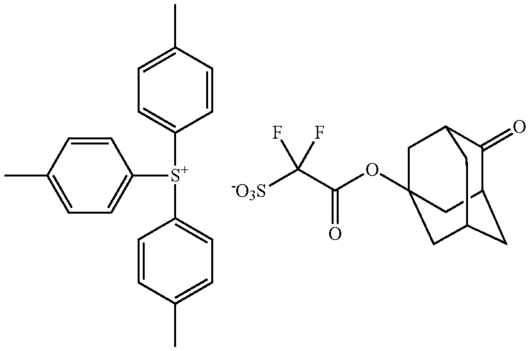
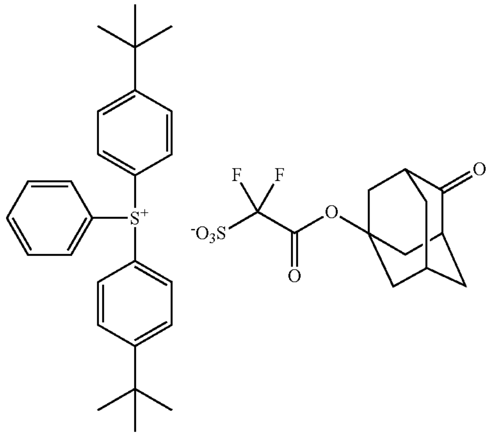
-continued
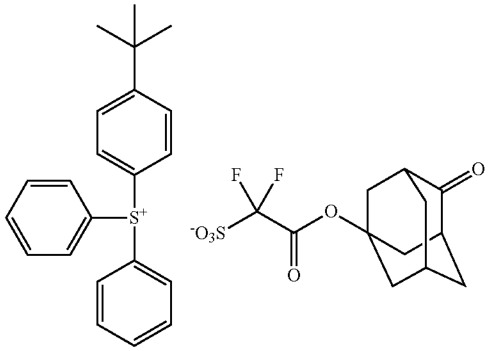
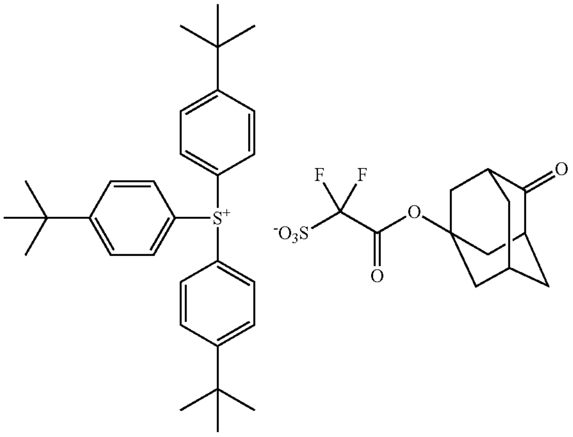
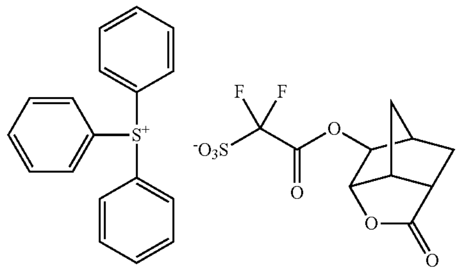
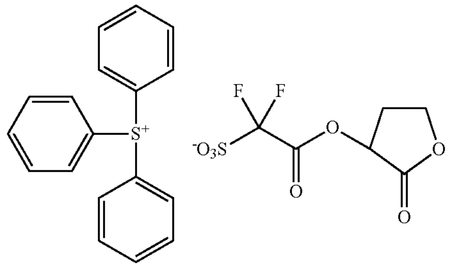
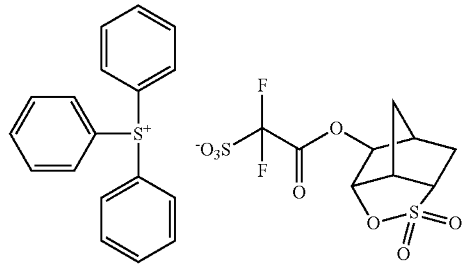

-continued
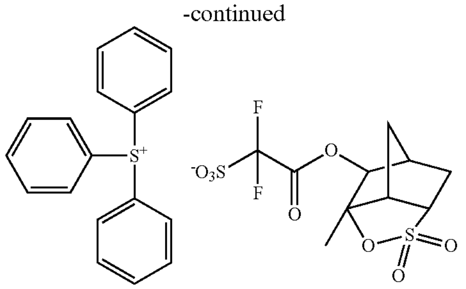
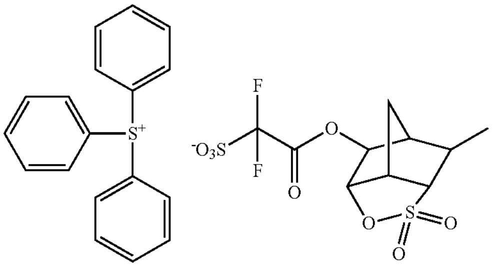
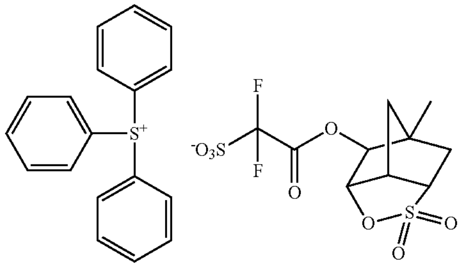
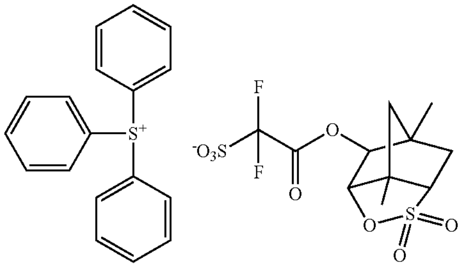
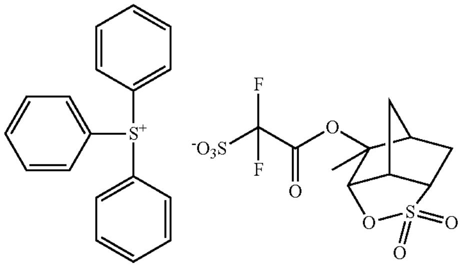
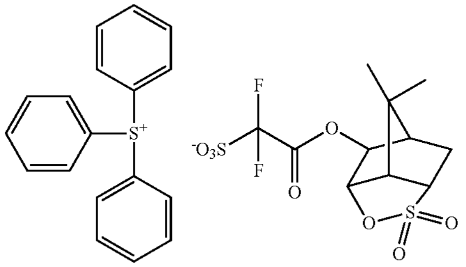
-continued
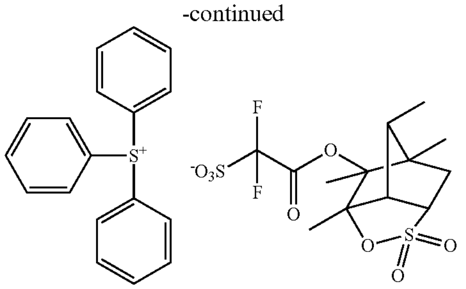
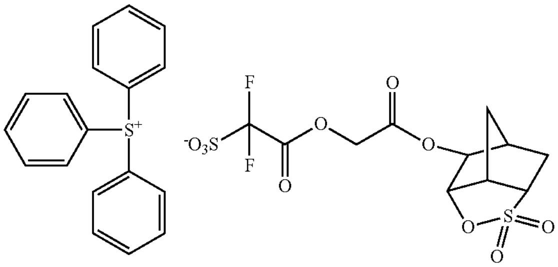
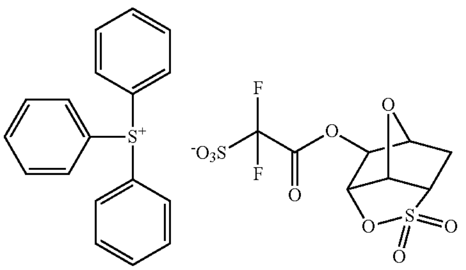
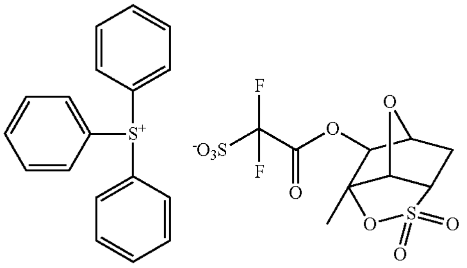
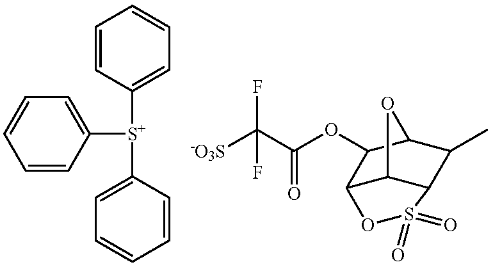
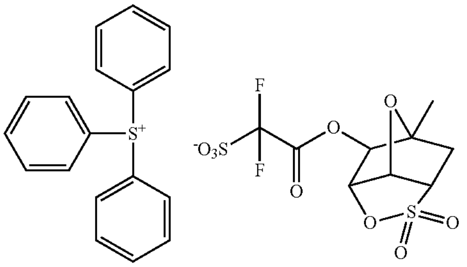

-continued
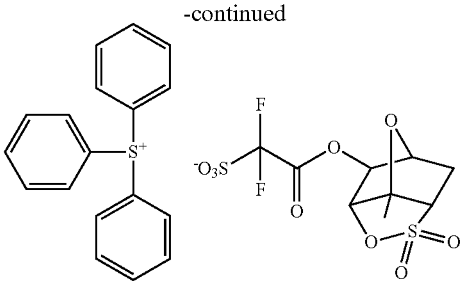
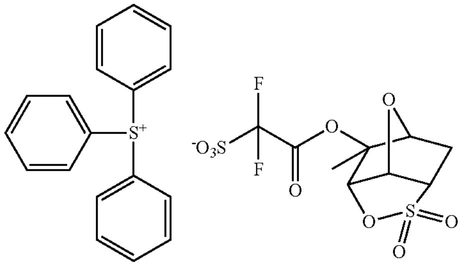
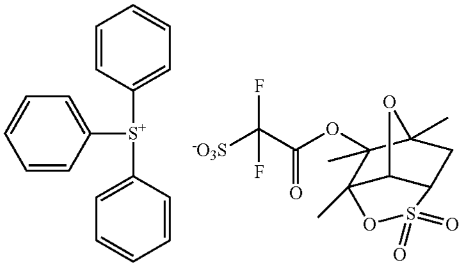
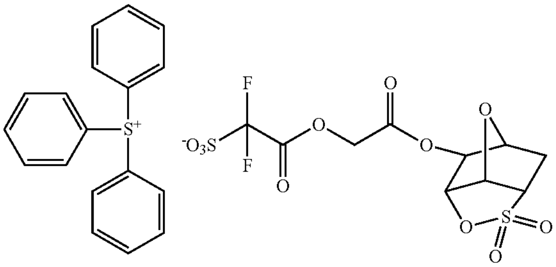
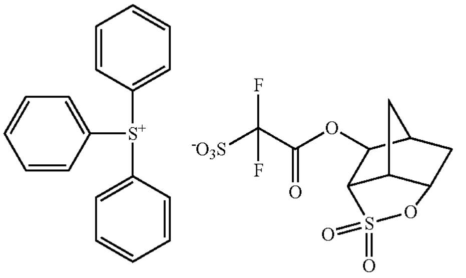
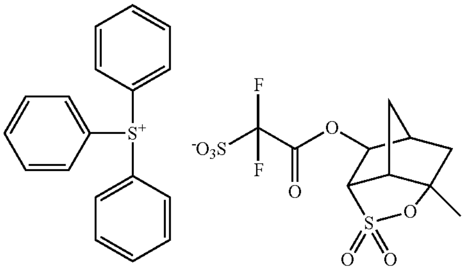
-continued
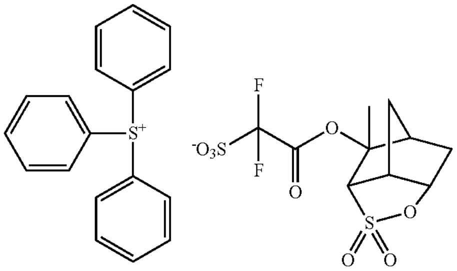
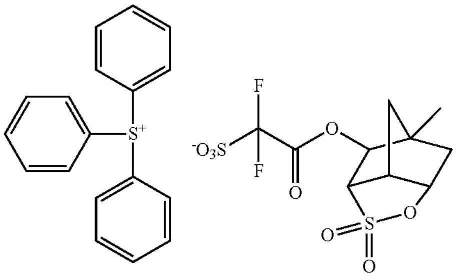
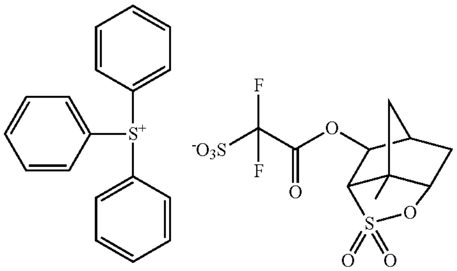
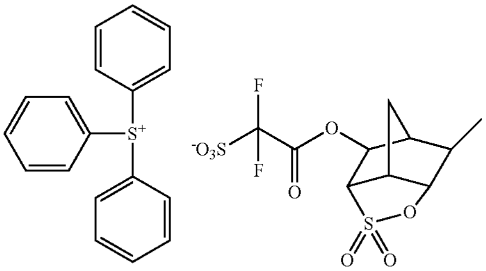
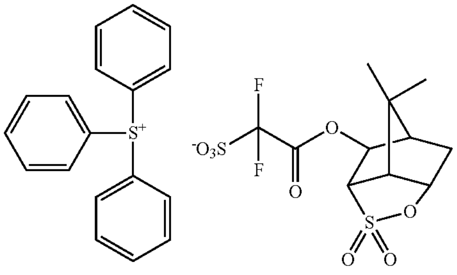
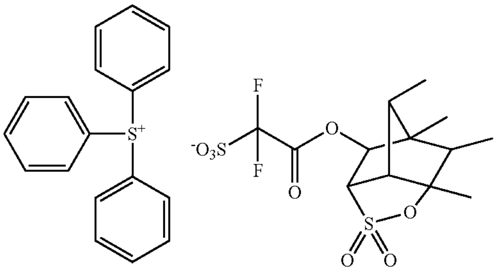

-continued
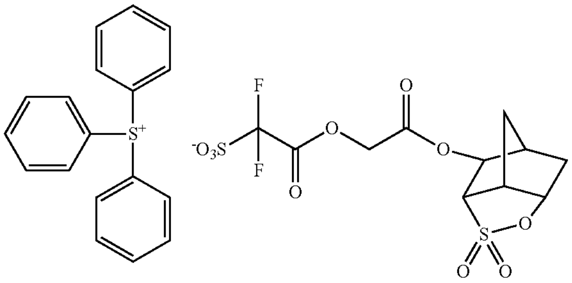
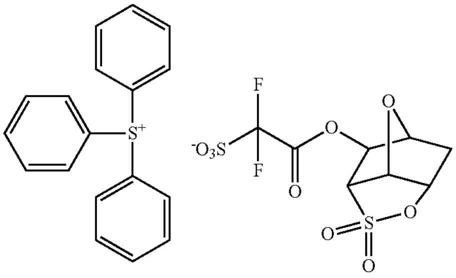
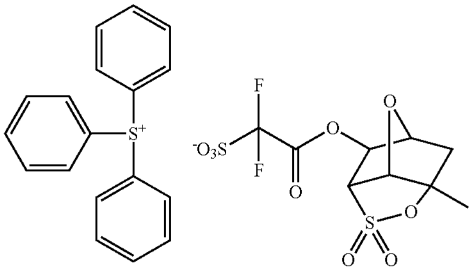
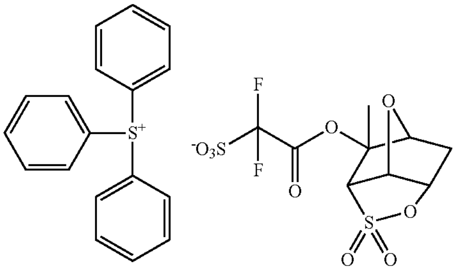
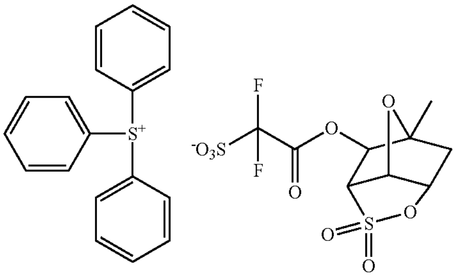
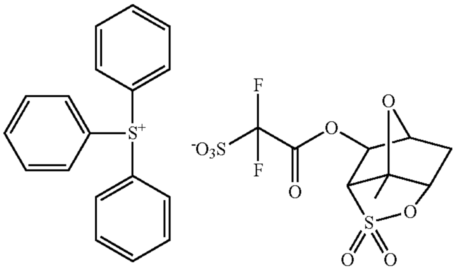
-continued
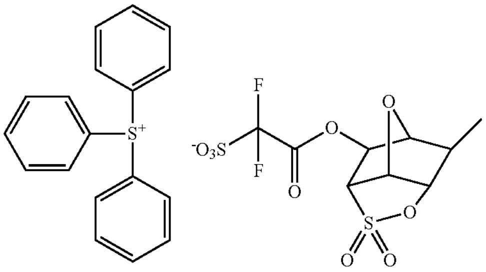
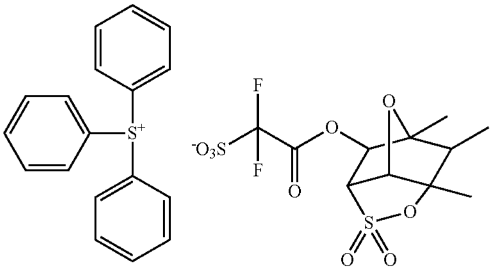
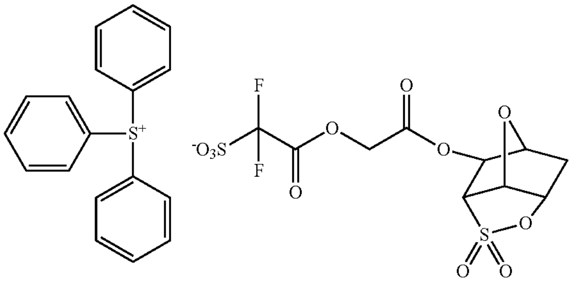
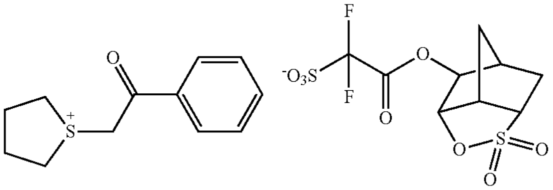
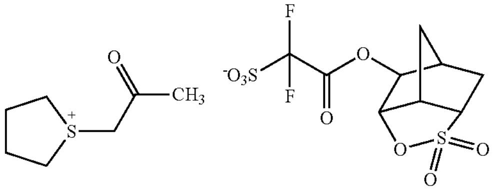
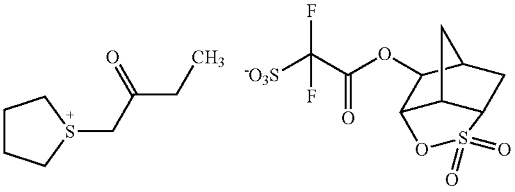
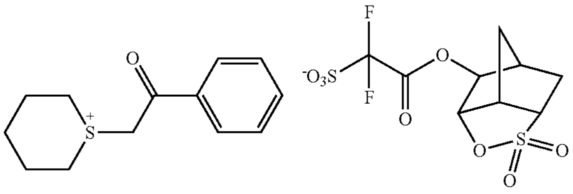

-continued
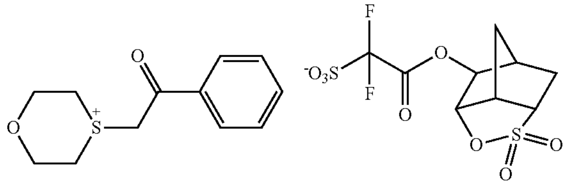
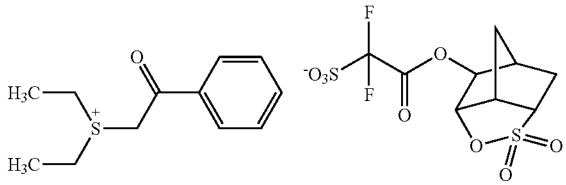
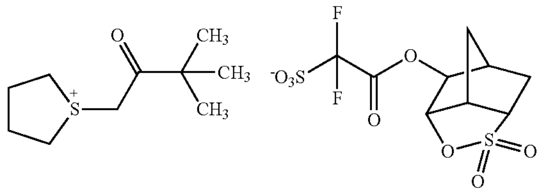
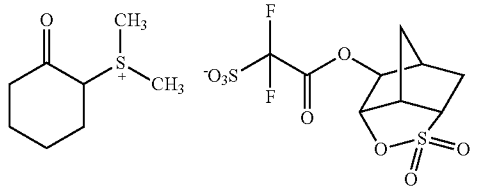
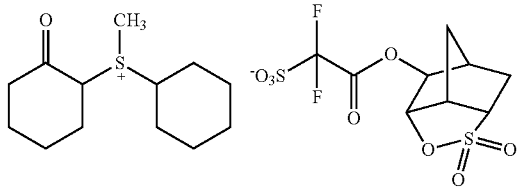
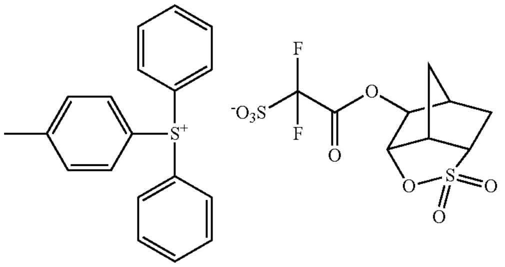
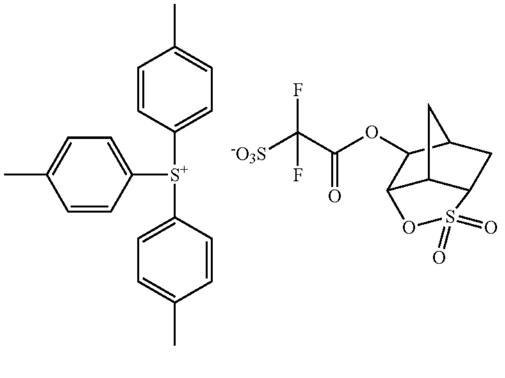
-continued
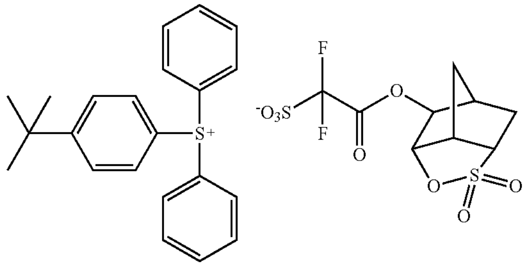
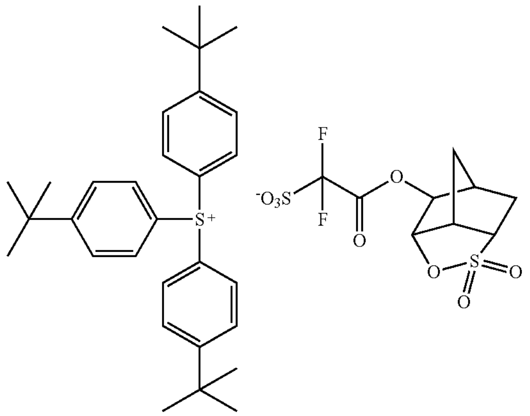
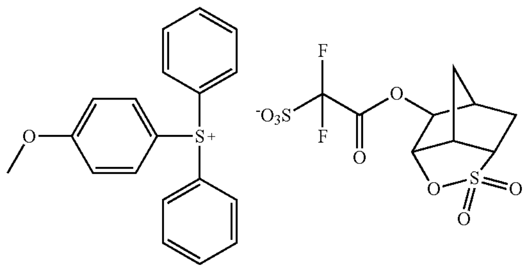
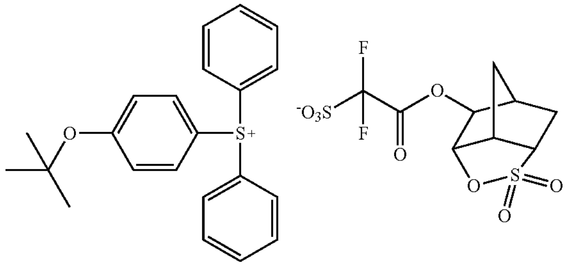
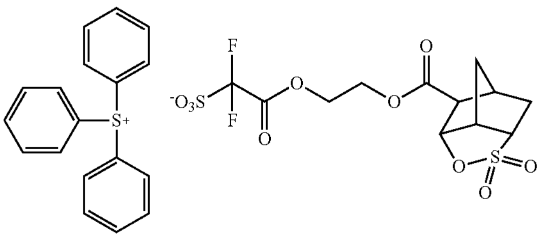
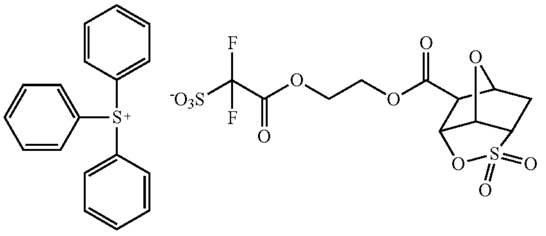

-continued

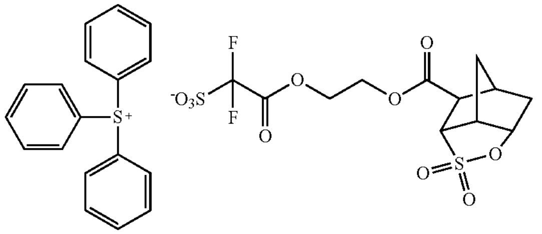

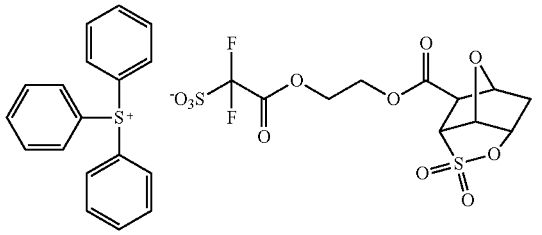

The salt represented by the formula (I) when the cation is $Z^+$ can be produced according to the manufacturing methods below. Furthermore, unless otherwise specified, the definitions of substituents in the formulae below that show manufacturing methods for an acid generator have the same meaning as defined above.

For example, the acid generator can be produced according to a reaction method wherein the salt represented by the formula (1) and the onium salt represented by the formula (3) are reacted by being stirred in an inert solvent such as acetonitrile, water, methanol, chloroform and methylene chloride, or a aprotic solvent at a temperature in the range of about 0° C. to 150° C., and preferably 0° C. to 100° C.

Examples of aprotic solvents include dichloroethane, toluene, ethylbenzene, monochlorobenzene, acetonitrile and N,N-dimethylformamide.

(1)

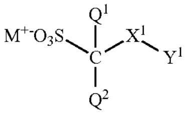

(3)

$Z^+Z^{1-}$ wherein $M^+$ represents $Li^+$, $Na^+$, $K^+$ or $Ag^+$; and $Z^{1-}$ represents $F^-$, $Cl^-$, Br, $I^-$, $BF_4^-$, $AsF_6^-$, $SbF_6^-$, $PF_6^-$ or $ClO_4^-$.

The amount of the onium salt of the formula (3) used is generally in the range of 0.5 to 2 moles per 1 mole of the salt represented by the formula (1). The salt is recovered by recrystallization or purified by washing with water.

Among the salts represented by the formula (1), the salt having the anion represented in the above-mentioned the formula (IA) can be obtained from an esterification reaction of an alcohol represented by the formula (4) and a carboxylic acid represented by the formula (5).

(4)

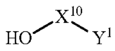

(5)

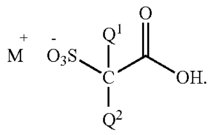

The amount of the carboxylic acid represented by the formula (5) used in the esterification reaction is generally in the range of 0.2 to 3 moles per 1 mole of the alcohol represented by the formula (4), and preferably in the range of 0.5 to 2 moles. The amount of an acid catalyst used in the esterification reaction may be a catalytic amount, and it may be the amount correspond to the amount of the solvent, and is generally in the range of 0.001 to 5 moles.

Additionally, among the salts represented by the formula (1), the salt having the anion represented by the above-mentioned the formula (IA) can be produced by conducting the esterification reaction of an alcohol represented by the formula (6) and a carboxylic acid represented by the formula (7) followed by a hydrolysis with an alkali metal hydroxide compound represented by MOH.

(6)

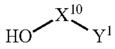

(7)

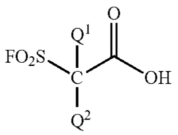

Examples of the MOH include lithium hydroxide, sodium hydroxide and potassium hydroxide, and preferred examples include lithium hydroxide and sodium hydroxide.

The above-mentioned esterification reaction is generally carried out by stirring in the aprotic solvent the same as mentioned above, in the temperature range of 20 to 200° C., preferably in the temperature range of 50 to 150° C.

In the esterification reaction, an organic acid such as p-toluenesulfonic acid, or an inorganic acid such as sulfuric acid may be generally added as an acid catalyst.

Further, a dehydrating agent can be used in the above-mentioned esterification reaction.

Examples of the dehydrating agent include dicyclohexylcarbodiimide, 1-alkyl-2-halopyridinium salt, 1,1-carbonyldiimidazole, bis-(2-oxo-3-oxazolidinyl) phosphinic chloride, 1-ethyl-3-(3-dimethylaminopropyl)carbodiimide hydrochloride, di-2-pyridyl carbonate, di-2-pyridyl thionocarbonate and 6-methyl-2-nitrobenzoic acid anhydride in the presence of 4-(dimethylamino)pyridine.

Performing the esterification reaction using the acid catalyst while water is being removed using a Dean-Stark apparatus or the like, is preferable because it tends to shorten the reaction time.

For the above-mentioned reaction, the same methods can be applied in the manufacture of the salts having the anion represented by the formula (IB).

Further, the salt having the anion represented by the above-mentioned the formula (IC) can be obtained by an esterification reaction of an alcohol represented by the formula (9) and a carboxylic acid represented by the formula (8).

(8)

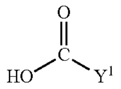

(9)

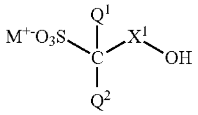

The amount of the alcohol represented by the formula (9) that is used in the esterification reaction is generally in the range of 0.5 to 3 moles per 1 mole of the carboxylic acid represented by the formula (8), and preferably in the range of 1 to 2 moles. The amount of the acid catalyst used in the esterification reaction may be the amount of the catalyst, and may be also the amount correspond to the amount of the solvent, and is generally in the range of 0.001 to 5 moles per 1 mole of the carboxylic acid represented by the formula (8). The amount of the dehydrating agent in the esterification reaction is generally in the range of 0.5 to 5 moles per 1 mole of the carboxylic acid represented by the formula (8), and preferably in the range 1 to 3 moles.

In the esterification reaction of a carboxylic acid represented by the formula (8) and an alcohol represented by formula (9), the carboxylic acid represented by the formula (8) can also be converted to an acid halide followed by carrying out the reaction with the alcohol represented by the formula (9).

Examples of the reagents for conversion to the acid halide include thionyl chloride, thionyl bromide, phosphorus trichloride, phosphorus pentachloride and phosphorus tribromide.

Examples of the solvent used in the conversion reaction to the acid halide include the same aprotic solvents as used above. The reaction is suitably carried out by stirring in the temperature range of 20 to 200° C., and preferably in the temperature range of 50 to 150° C.

In the above-mentioned reaction, an amine compound can be added as a catalyst.

The acid halide obtained can be used in a reaction with the alcohol represented by the formula (9) in an inert solvent (for example, the aprotic solvent), to obtain the salt having the anion represented by the formula (IC). The reaction is preferably carried out in the temperature range of 20 to 200° C., and more preferably in the temperature range of 50 to 150° C. The use of an acid trapping agent is appropriate.

Examples of acid trapping agents include organic bases such as triethylamine and pyridine, or inorganic bases such as sodium hydroxide, potassium carbonate and sodium hydride.

The amount of the acid trapping agent used can also correspond to the amount of solvent, and is generally in the range of 0.001 to 5 moles per 1 mole of the halide, and preferably 1 to 3 moles.

Further, for the manufacturing method for the salt that has the anion represented by the above (IC), after the esterification reaction of a carboxylic acid represented by the formula (10) with an alcohol represented by the formula (11), there is also a method to obtain a hydrolyzed salt with an alkali metal hydroxide compound represented by MOH. $M^+$ represents the same meaning as above.

(10)

$$HOOC-Y^1$$

(11)

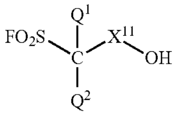

The esterification reaction of a carboxylic acid represented by the formula (10) an alcohol represented by the formula (11) can generally be carried out by stirring in the same aprotic solvent as mentioned above, in the temperature range of 20 to 200° C., preferably in the temperature range of 50 to 150° C.

In the esterification reaction, the acid catalyst that is the same as mentioned above is generally added.

The dehydrating agent such as mentioned above can be added into this esterification reaction.

Examples of methods for the manufacture of the salt that has an anion represented by the formula (ID) include a first dehydration-condensation of an alcohol represented by the formula (12) and an alcohol represented by the formula (13).

(12)

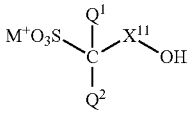

(13)

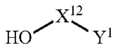

In addition, in a manufacturing method for the salt that has an anion represented by the formula (ID), after the reaction of an alcohol represented by the formula (14) with an alcohol represented by the formula (15), there is also a method to obtain a hydrolyzed salt with an alkali metal hydroxide compound represented by MOH.

(14)

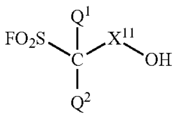

(15)

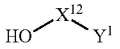

The reaction of the alcohol represented by the formula (14) and the alcohol represented by the formula (15) can generally be carried out by stirring in an aprotic solvent in the temperature range of 20 to 200° C., preferably in the temperature range of 50 to 150° C.

In the above-mentioned reaction, an acid catalyst is generally used.

Furthermore, in the aforementioned reaction, the dehydrating agent as mentioned above can be added.

Performing the esterification reaction using the acid catalyst while water is being removed using a Dean-Stark apparatus or the like, is preferable because it tends to shorten the reaction time.

The amount of the alcohol represented by the formula (14) that is used in the reaction is in the range of 0.5 to 3 moles per 1 mole of the alcohol represented by the formula (15), and preferably in the range of 1 to 2 moles. For the acid catalyst in the etherification reaction, the amount of catalyst can also correspond to the amount of solvent, and is generally in the range of 0.001 to 5 moles per 1 mole of the alcohol represented by the formula (15). The dehydrating agent in the etherification reaction is in the range of 0.5 to 5 moles per 1 mole of the alcohol represented by the formula (15), and is preferably in the range 1 to 3 moles.

For the reaction of the an alcohol represented by the formula (16) and an alcohol represented by the formula (17), the alcohol represented by the formula (17) can be converted into a compound represented by the formula (18), and a reaction can also be carried out with the compound represented by the formula (18) and the alcohol represented by the formula (16).

(16)

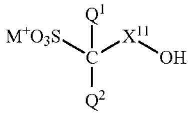

(17)

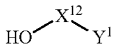

(18)

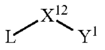

wherein L represents a chloride, bromine, iodine, mesyloxy group, tosyloxy group or trifluoromethanesulfonyloxy group.

The conversion of the alcohol represented by the formula (17) into the compound represented by the formula (18) can be carried out, for example, by reaction of the alcohol represented by the formula (17) with thionyl chloride, thionyl bromide, phosphorus trichloride, phosphorus pentachloride, phosphorus tribromide, mesyl chloride, tosyl chloride or trifluoromethanesulfonic acid anhydride.

The aforementioned reaction is carried out in the above-mentioned inert solvents. Additionally, the aforementioned reaction is carried out by stirring in the temperature range of −70 to 200° C., preferably in the temperature range of −50 to 150° C. Moreover, the use of the acid trapping agent as mentioned above is appropriate.

The amount of the base used can also correspond to the amount of solvent, and is generally in the range of 0.001 to 5 moles per 1 mole of the alcohol represented in the formula (17), preferably in the range of 1 to 3 moles.

By reacting the obtained compound represented by the formula (18) in an inert solvent with the alcohol represented by the formula (16), the salt that has the anion represented by the formula (ID) can be obtained. The reaction is carried out by stirring in the temperature range of 20 to 200° C., preferably in the temperature range of 50 to 150° C.

For the aforementioned reaction, the use of an acid trapping agent is appropriate.

When the acid trapping agent is used, its amount can also correspond to the amount of solvent, and is generally in the range of 0.001 to 5 moles per 1 mole of the compound represented by the formula (18), preferably 1 to 3 moles.

In the resist composition of the present invention, the content of the acid generator (A) is preferably in the range of 1 to 20 parts by weight, and more preferably 1 to 15 parts by weight with respect to 100 parts by weight of the resin (B).

In the resist composition of the present invention, the salt represented by the formula (I) of the acid generator generates acid due to light exposure, that acts catalytically on the acid-labile group in the resin, which is cleaved so that the resin becomes soluble in aqueous alkali. Such a resist composition is suitable as a chemically amplified positive photoresist composition.

Furthermore, in addition to the salt represented in the formula (I), a photoinitiator for photo-cationic polymerization, photoinitiator for photo-radical polymerization, photodecolorizing agent, photo-color changing agent, a compound generally known for generating acid due to irradiation with activating light rays or radiation used in micro-resists and a mixture thereof can be used by suitably selecting as the acid generator of the resist composition of the present invention.

Examples include a diazonium salt, a phosphonium salt, a sulfonium salt, an iodonium salt, an imidosulfonate, an oximesulfonate, a diazodisulfone, a disulfone, an o-nitrobenzenesulfonate.

In addition, for a group or a compound which generate an acid by irradiation with such activating light rays or radiation that are introduced into a polymer main chain or a side chain, for example, compounds described in U.S. Pat. No. 3,849,137, DE Patent 3914407, JP-S63-26653 A, JP-S55-164824 A, JP-S62-69263 A, JP-S63-146038 A, JP-S63-163452 A, JP-S62-153853 A, and JP-S63-146029 A can be used.

Further, compounds which generate an acid by light described in U.S. Pat. No. 3,779,778 and EP 126712 A can be also used.

In the resist composition of the present invention, the content of the acid generator is preferably in the range of 1 to 20 parts by weight, and more preferably 1 to 15 parts by weight with respect to 100 parts by weight of the resin.

When a composition containing the acid generator and resin described above is used for a resist composition, a basic compound can be contained therein. As the basic compounds, nitrogen-containing basic compounds are preferable and, amines and ammonium salts are more preferable. The basic compound can be added as a quencher to improve performance from being compromised by the inactivation of the acid while the material is standing after exposure.

The Examples of such basic compounds include those represented by the following formulae.

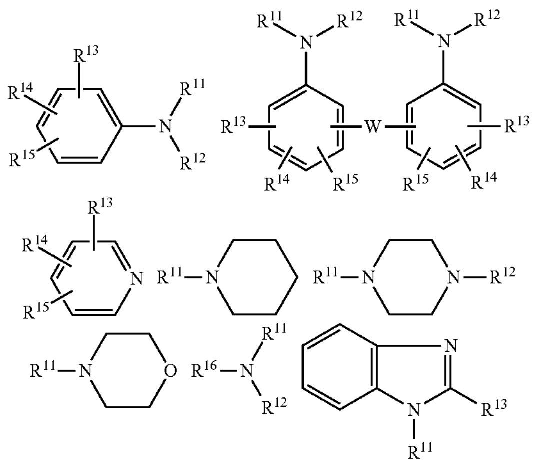

-continued

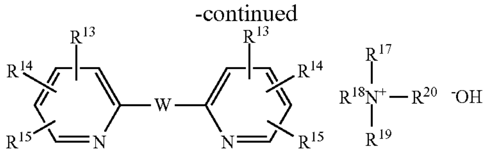

wherein $R^{11}$, $R^{12}$, $R^{17}$, $R^{18}$ and $R^{19}$ independently represent a hydrogen atom, a $C_1$ to $C_6$ aliphatic hydrocarbon group, a $C_5$ to $C_{10}$ alicyclic hydrocarbon group or a $C_6$ to $C_{20}$ aromatic hydrocarbon group, the hydrogen atom contained in the aliphatic hydrocarbon group, alicyclic hydrocarbon group and aromatic hydrocarbon group may be replaced by a hydroxyl group, an amino group or a $C_1$ to $C_6$ alkoxyl group, the hydrogen atom contained in the amino group may be placed by a $C_1$ to $C_4$ aliphatic hydrocarbon group;

$R^{13}$ to $R^{15}$ independently represent a hydrogen atom, a linear or branched chain $C_1$ to $C_6$ aliphatic hydrocarbon group, a linear or branched chain $C_1$ to $C_6$ alkoxyl group, a $C_5$ to $C_{10}$ alicyclic hydrocarbon group, a $C_6$ to $C_{20}$ aromatic hydrocarbon group or a nitro group, the hydrogen atom contained in the aliphatic hydrocarbon group, the alkoxyl group, the alicyclic hydrocarbon group and aromatic hydrocarbon group may be replaced by a hydroxyl group, an amino group or a linear or branched chain $C_1$ to $C_6$ alkoxy group, the hydrogen atom contained in the amino group may be replaced by a linear or branched chain $C_1$ to $C_4$ aliphatic hydrocarbon group, or $R^{13}$ and $R^{14}$ may be bonded together to form an aromatic ring;

$R^{16}$ and $R^{20}$ represent a linear or branched chain $C_1$ to $C_6$ aliphatic hydrocarbon group or a $C_5$ to $C_{10}$ alicyclic hydrocarbon group, the hydrogen atom contained in the aliphatic hydrocarbon group and the alicyclic hydrocarbon group may be replaced by a hydroxyl group, an amino group or a linear or branched chain $C_1$ to $C_6$ alkoxy group, the hydrogen atom contained in the amino group may be replaced by a linear or branched chain $C_1$ to $C_4$ aliphatic hydrocarbon group;

W represents a $C_1$ to $C_6$ alkylene group, a carbonyl group, an imino group, a sulfide group or a disulfide group.

Specific examples of such compounds include hexylamine, heptylamine, octylamine, nonylamine, decylamine, aniline, 2-, 3- or 4-methylaniline, 4-nitroaniline, diisopropylaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxyl)ethyl]amine, triisopropanolamine, N,N-dimethylaniline, 2,6-isopropylaniline, imidazole, pyridine, 4-methylpyridine, 4-methylmidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy) ethane, 4,4'-dipyridyl sulfide, 4,4'-dipyridyl disulfide, 1,2-bis(4-pyridyl) ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-(trifluoromethyl) phenyltrimethylammonium hydroxide, and (2-hydroxyethyl)trimethylammonium hydroxide (choline). Among these, diisopropylaniline is preferable.

Furthermore, hindered amine compounds with a piperidine skeleton such as those disclosed in JP-A-H11-52575 can be used as a quencher.

In the present resist composition, the content of the resin is preferably in the range of about 80 to 99.9 wt %, and the content of the acid generator is preferably in the range of about 0.1 to 20 wt %, based on the total amount of solids.

The content of the basic compound serving as a quencher in the chemically amplified resist composition, if used, is preferably in the range of about 0.01 to 1 wt %, based on the total amount of solids in the resist composition.

The resist composition can also include small amounts of various additives such as sensitizers, dissolution inhibitors, other resins, surfactants, stabilizers, and dyes, as needed.

The resist composition of the present invention is generally a resist solution, with the various ingredients above dissolved in a solvent, and is applied onto a substrate such as a silicon wafer by a method industrially-used such as spin coating. The solvent used here can be any solvent that is industrially used in the field and that dissolves the ingredients, dries at a suitable rate, and results in a smooth, uniform film after evaporating off.

Examples thereof include glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents can be used alone or in combination of two or more.

The method for pattern formation of the present invention includes steps of:

(1) applying the abovementioned resist composition of the present invention onto a substrate;

(2) removing solvent from the applied composition to form a composition layer;

(3) exposing to the composition layer using an exposure device (or liquid immersion exposure device);

(4) heating the exposed composition layer and, (5) developing the heated composition layer using a developing apparatus.

The application of the resist composition onto the substrate can generally be carried out through the use of a device such as a spin coater.

The removal of the solvent, for example, can either be carried out by evaporation of the solvent using a heating device such as a hotplate, or can be carried out using a decompression device, and a composition layer with the solvent removed is formed. The temperature in this case is generally the range of 50 to 200° C. Moreover, the pressure is generally the range of 1 to $1.0\times10^5$ Pa.

The composition layer obtained is exposed to light using an exposure device or a liquid immersion exposure device. The exposure is generally carried out through a mask that corresponds to the required pattern. Various types of exposure light source can be used, such as irradiation with ultraviolet lasers such as KrF excimer laser (wavelength: 248 nm), ArF excimer laser (wavelength: 193 nm), $F_2$ laser (wavelength: 157 nm), or irradiation with far-ultraviolet wavelength-converted laser light from a solid-state laser source (YAG or semiconductor laser or the like) or vacuum ultraviolet harmonic laser light or the like.

After exposure, the composition layer is subjected to a heat treatment to promote the deprotection reaction. The heating temperature is generally in the range of 50 to 200° C., preferably in the range of 70 to 150° C.

The composition layer is developed after the heat treatment, generally by utilizing an alkaline developing solution using a developing apparatus. Here, for the alkaline developing solution, various types of aqueous alkaline solutions used in this field can be satisfactory. Examples include aqueous solutions of tetramethylammonium hydroxide and (2-hydroxyethyl)trimethylammonium hydroxide (common name: choline).

After developing, it is preferable to rinse with ultrapure water and to remove any residual water on the substrate and the pattern.

EXAMPLES

The resist composition of the present invention will be described more specifically by way of examples, which are not construed to limit the scope of the present invention.

All percentages and parts expressing the content or amounts used in the Examples and Comparative Examples are based on weight, unless otherwise specified.

The weight average molecular weight is a value determined by gel permeation chromatography (Toso Co. ltd. HLC-8120GPC type, column: three of TSK gel Multipore HXL-M, solvent: tetrahydroflun) using polystyrene as the standard product.

Columun: TSKgel Multipore $H_{XL}$-M 3 connecting+guardcolumn (Toso Co. ltd.)

Eluant: tetrahydrofran

Flow rate: 1.0 mL/min

Detecting device: RI detector

Columun temperature: 40° C.

Injection amount: 100 μL

Standard material for calculating molecular weight: standard polysthylene (Toso Co. ltd.)

The structures of the compounds were verified by NMR (Nippon electric, GX-270 type or EX-270 type) and mass analysis (LC: Agilent 1100 type, MASS: Agilent LC/MSD type or LC/MSD TOF type).

(Synthesis of Acid generator A1)

To 100 parts of methyl difluoro(fluorosulfonyl)acetate ester and 150 parts of ion-exchanged water, 230 parts of 30% sodium hydroxide aqueous solution was added in the form of drops in an ice bath. The resultant mixture was refluxed for 3 hours at 100° C., cooled, and then neutralized with 88 parts concentrated hydrochloric acid. The resulting solution was concentrated, giving 164.4 parts of sodium difluorosulfoacetate (containing inorganic salt: 62.7% purity).

1.0 parts of 1,1'-carbonyldiimidazol was added to a mixture of 1.9 parts of the resulting sodium salt of difluorosulfoacetateic acid (62.7% purity) and 9.5 parts of N,N-dimethylformamide, and the resultant mixture was stirred for 2 hours to obtain a mixture. Also, 0.2 parts of sodium hydride was added to a mixture of 1.1 parts of 3-hydroxyadamantyl methanol and 5.5 parts of N,N-dimethylformamide, and the resultant mixture was stirred for 2 hours. To thus obtained mixture solution, the above obtained mixture was added. The resulting mixture was stirred for 15 hours to obtain a solution containing sodium salt of (3-hydroxy-1-adamantyl) methoxycarbonyl)difluoromethanesulfonic acid. Just as obtained solution was used for next reaction.

To thus obtained solution containing sodium salt of (3-hydroxy-1-adamantyl)methoxycarbonyl)difluoromethanesulfonic acid 17.2 parts of chloroform and 2.9 parts of 14.8% triphenylsulfonium chloride were added, and the resulting mixture was stirred for 15 hours, separated, and a water layer was extracted with 6.5 parts of chloroform to obtain an organic layer. The obtained organic layers were mixed, and washed with ion-exchanged water, and the resulting organic layer was concentrated. To the concentrate was added 5.0 parts of tert-bythyl methyl ether, the resulting mixture was stirred, and filtrated, giving 0.2 parts of triphenylsulfonium (3-hydroxy-1-adamantyl)methoxycarbonyl)difluromethanesulfonate (A1) in the form of a white solid.

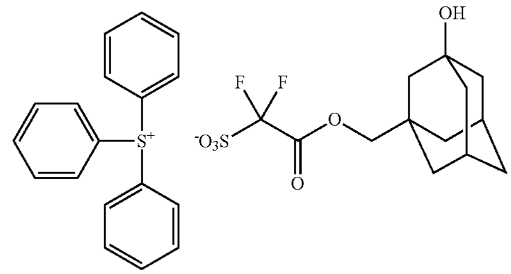

(Synthesis of Acid Generator A2)

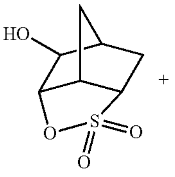

(aa-1-a)

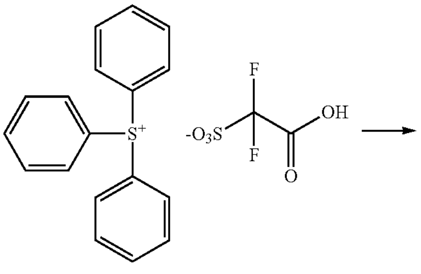

(aa-1-b)

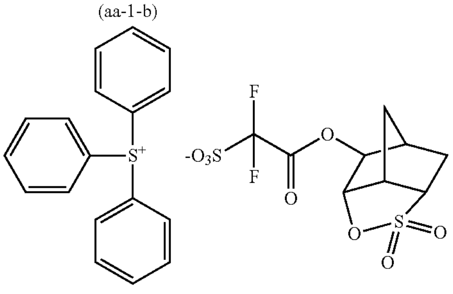

(aa-1-1)

30.00 parts of the compound (aa-1-b), 120.00 parts of monochlorobenzene and 16.00 parts of the compound (aa-1-a) were charged, and into this was 1.40 parts of sulfuric acid was charged while stirring at 23° C., thus obtained mixture was elevated temperature to 125° C., and concentrated. The resulting reactant was added 4.00 parts of molecular sieve (4 A, Wako Pure Chemical Industries, Ltd.), refluxed and dehydrated for 8 hours at 125° C., and concentrated. The obtained concentrate was added 166 parts of chloroform and 83 parts of ion-exchanged water, washed, and separated to obtain an organic layer. This washing was repeated total 6 times, and the resulting solution was added 1.66 parts of an activated carbon, stirred, and filtered. The obtained filtrate was concentrated, giving 42.26 parts of pale yellow oil.

To the obtained pale yellow oil was added 42.26 parts of acetonitrile, and homogenized, and further added 126.78 parts of methyl-tert-buthylether. The mixture was stirred, and then stood. The lower layer within the separated two layers was recovered, was added 42.26 parts of acetonitrile, and homogenized. After that, To the obtained mixture was further added 126.78 parts of methyl-tert-buthylether. The mixture was stirred, and stood. The lower layer within the separated two layers was recovered, concentrated, stirred and filtered, giving 8.53 parts of a compound (aa-1-1) (yield: 20%) as a white solid. The resulting compound (aa-1-1) was designated A2.

MS(ESI(+) Spectrum): $M^+$ 263.1

MS(ESI(−) Spectrum): $M^-$ 347.0

$^{1}$H-NMR (chloroform-d, internal standard material tetramethylsilane): δ(ppm) 1.77-1.79 (m, 1H), 2.03-2.07 (m, 1H), 2.16-2.21 (m, 1H), 2.27-2.29 (m, 1H), 2.65 (m, 1H), 3.45-3.47 (m, 1H), 3.50-3.53 (m, 1H), 4.77 (m, 1H), 4.82-4.83 (m, 1H), 7.71-7.81 (m, 15H).

A compound H below corresponds to a compound represented by the formula (aa) of the present invention.

(Synthesis of Resin B1)

Monomer E, monomer F, monomer B, monomer H and monomer D were charged with molar ratio 28:14:6:21:31, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture methanol and ion-exchanged water in large amounts to precipitate. These operations were repeated 3 times for purification, giving 64% yield of copolymer having a weight average molecular weight of about 7600. This copolymer, which had the structural units derived from the monomers of the following formula, was designated Resin B1.

E

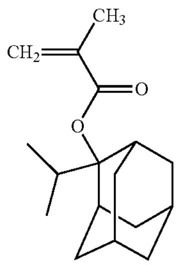

-continued

F

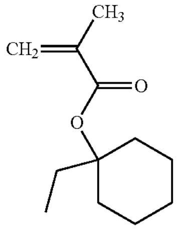

B

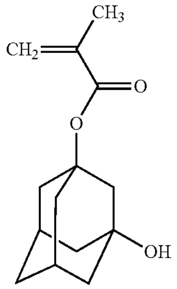

H

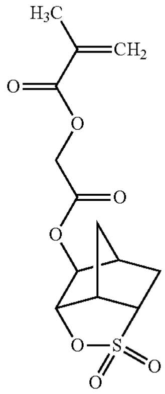

D

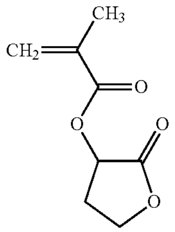

(Synthesis of Resin B2)

Monomer F, monomer E, monomer B, monomer H and monomer C were charged with molar ratio 40:10:8:26:16, and dioxane was added thereto in an amount equal to 1.2 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 62% yield of copolymer having a weight average molecular weight of about 7100. This copolymer, which had the structural units derived from the monomers of the following formula, was designated Resin B2.

E

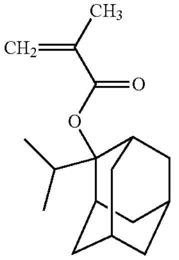

F

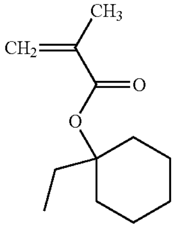

B

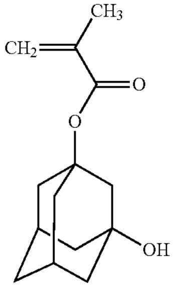

H

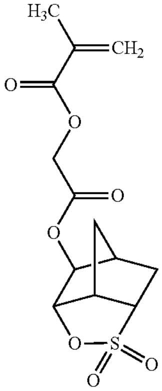

C

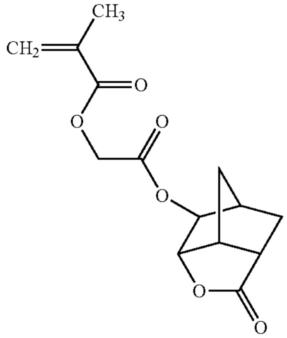

(Synthesis of Resin B3)

Monomer F, monomer E, monomer B, monomer H and monomer C were mixed with molar ratio 40:10:8:16:26, and dioxane was added thereto in an amount equal to 1.2 weight times of the total amount of monomers. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 69% yield of copolymer having a weight average molecular weight of about 6900. This copolymer, which had the structural units derived from the monomers of the following formulae, was designated Resin B3.

E

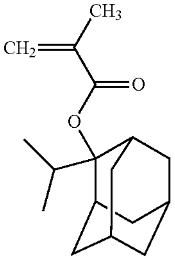

F

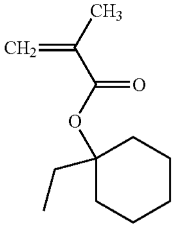

B

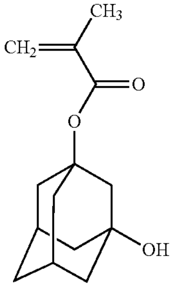

H

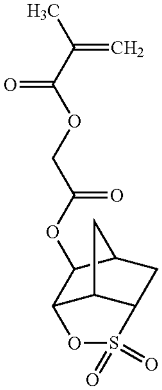

-continued

C

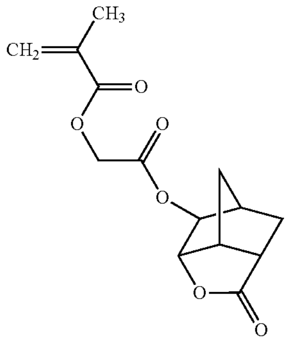

(Synthesis of Resin B4)

Monomer F, monomer E, monomer B, monomer H, monomer D and monomer C were mixed with molar ratio 40:10:8:10:22:10, and dioxane was added thereto in an amount equal to 1.2 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 61% yield of copolymer having a weight average molecular weight of about 6600. This copolymer, which had the structural units derived from the monomers of the following formulae, was designated Resin B4.

E

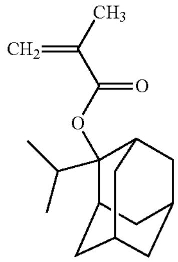

F

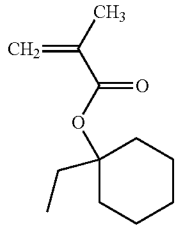

B

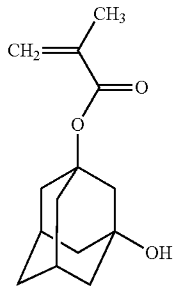

-continued

H

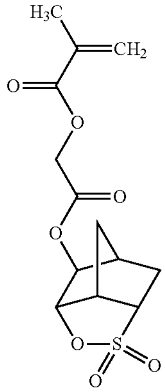

C

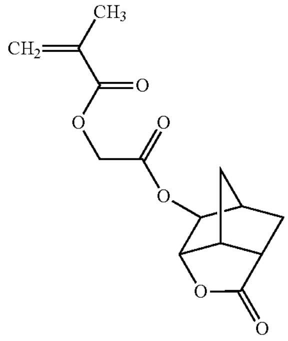

D

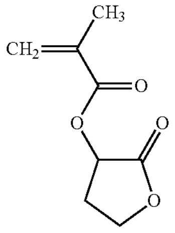

(Synthesis of Resin B5)

Monomer E, monomer F, monomer I, monomer H and monomer D were mixed with molar ratio 40:10:8:26:16, and dioxane was added thereto in an amount equal to 1.2 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 66% yield of copolymer having a weight average molecular weight of about 7000. This copolymer, which had the structural units derived from the monomers of the following formulae, was designated Resin B5.

E

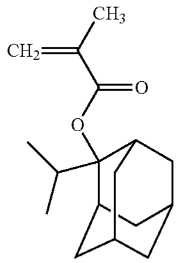

F

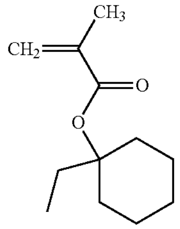

I

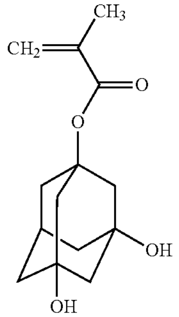

H

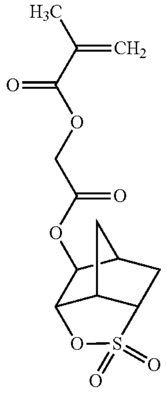

D

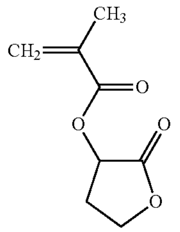

(Synthesis of Resin B6)

Monomer E, monomer F, monomer I, monomer H and monomer D were mixed with molar ratio 40:10:5:25:20, and dioxane was added thereto in an amount equal to 1.2 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 75% yield of copolymer having a weight average molecular weight of about 7000. This copolymer, which had the structural units derived from the monomers of the following formulae, was designated Resin B6.

E

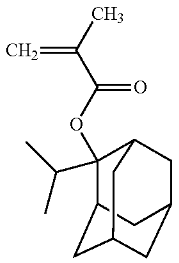

F

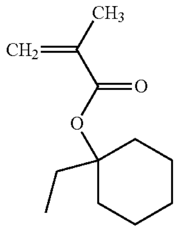

I

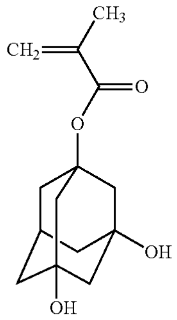

H

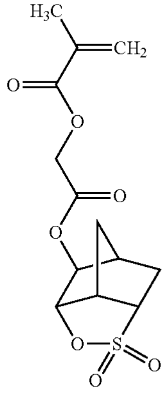

-continued

D

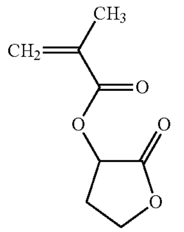

(Synthesis of Resin B7)

Monomer E, monomer F, monomer I, monomer B, monomer H and monomer D were mixed with molar ratio 40:10:4:4:22:20, and dioxane was added thereto in an amount equal to 1.2 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 69% yield of copolymer having a weight average molecular weight of about 7000. This copolymer, which had the structural units derived from the monomers of the following formulae, was designated Resin B7.

E

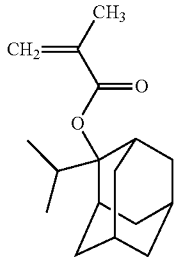

F

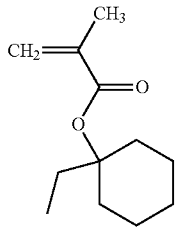

I

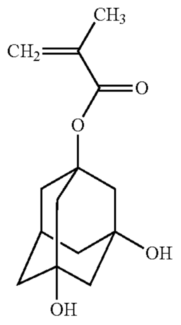

-continued

B

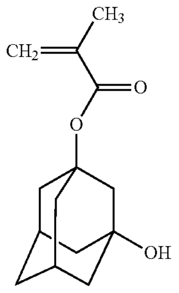

H

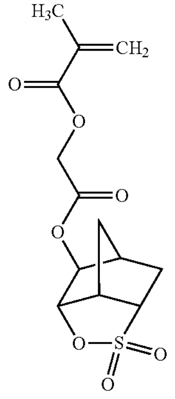

D

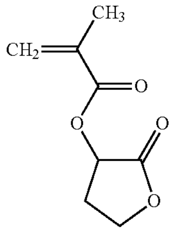

(Synthesis of Resin B8)

Monomer A, monomer J and monomer H were mixed with molar ratio 52.6:15.8:31.6, and dioxane was added thereto in an amount equal to 1.5 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 78° C. After that, the reaction solution was poured into a mixture of methanol and ion-exchanged water in large amounts to precipitate. These operations were repeated 3 times for purification, giving 74% yield of copolymer having a weight average molecular weight of about 7000. This copolymer, which had the structural units derived from the monomers of the following formulae, was designated Resin B8.

A

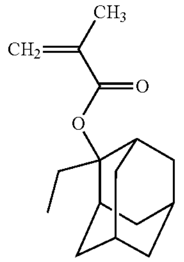

J

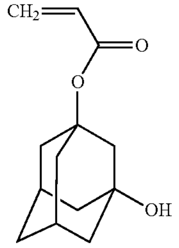

H

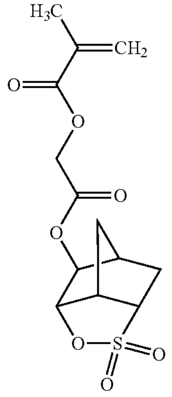

(Synthesis of Resin X1)

Monomer E, monomer F, monomer B, monomer C and monomer D were mixed with molar ratio 28:14:6:21:31, and dioxane was added thereto in an amount equal to 1.5 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 74% yield of copolymer having a weight average molecular weight of about 8500. This copolymer, which had the structural units derived from the monomers of the following formulae, was designated Resin X1.

E

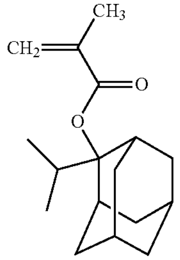

-continued

F

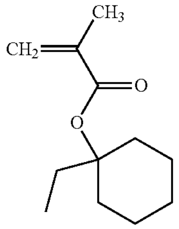

B

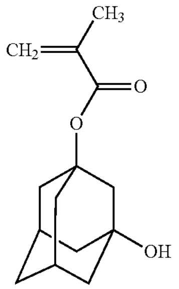

G

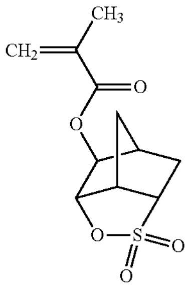

D

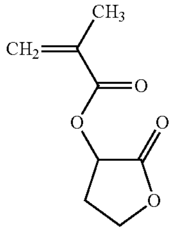

(Synthesis of Resin X2)

Monomer A, monomer B and monomer D were mixed with molar ratio 50:25:25, and dioxane was added thereto in an amount equal to 1.5 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 77° C. After that, the reaction solution was poured into a mixture of methanol and ion-exchanged water in large amounts to precipitate. These operations were repeated 3 times for purification, giving 55% yield of copolymer having a weight average molecular weight of about 8100. This copolymer, which had the structural units derived from the monomers of the following formulae, was designated Resin X2.

A

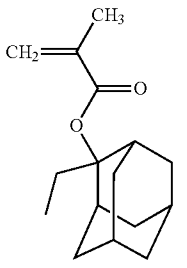

B

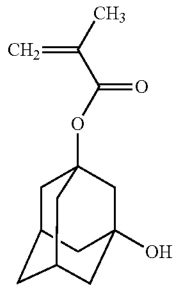

D

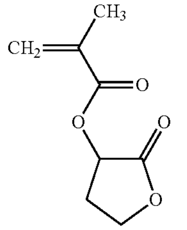

(Synthesis of Resin X3)

Monomer E, monomer F, monomer B, monomer G and monomer D were charged with molar ratio 28:14:6:21:31, and dioxane was added thereto in an amount equal to 1.5 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate. These operations were repeated 3 times for purification, giving 70% yield of copolymer having a weight average molecular weight of about 8000. This copolymer, which had the structural units derived from the monomers of the following formulae, was designated Resin X3.

E

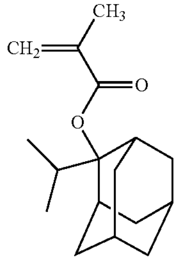

-continued

F

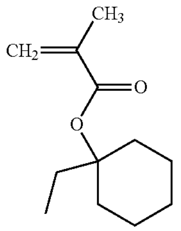

B

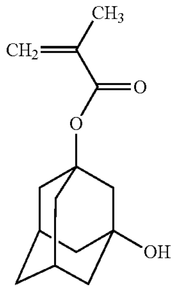

G

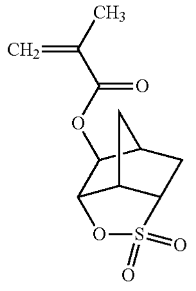

D

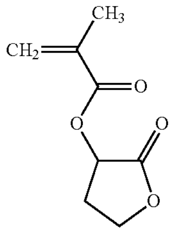

(Synthesis of Resin X4)

Monomer A, monomer J and monomer G were charged with molar ratio 52.6:15.8:31.6, and dioxane was added thereto in an amount equal to 1.5 weight times of the total amount of monomers. Azobisisobutyronitrile and azobis(2,4-dimethyl valeronitrile) was added as an initiator thereto in an amount of 1 mol % and 3 mol % respectively with respect to the entire amount of monomers, and the resultant mixture was heated for about 5 hours at 78° C. After that, the reaction solution was poured into a mixture of methanol and ion-exchanged water in large amounts to precipitate. These operations were repeated 3 times for purification, giving 68% yield of copolymer having a weight average molecular weight of about 7300. This copolymer, which had the structural units derived from the monomers of the following formulae, was designated Resin X4.

A

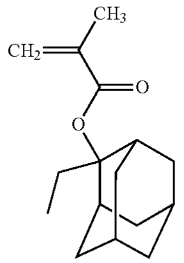

J

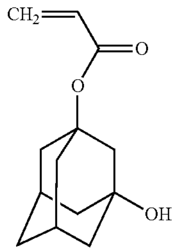

G

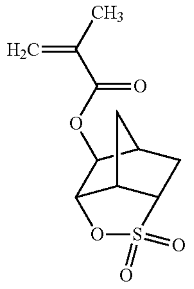

Examples and Comparative Examples

The resist compositions were prepared by mixing and dissolving each of the components shown in Tables 1 to 5, and then filtering through a fluororesin filter having 0.2 μm pore diameter.

TABLE 1

| | Resin (parts) | Acid generator (parts) | Quencher (parts) | PB/PEB (° C.) |
|---|---|---|---|---|
| Ex. 1 | B1 = 10 | A1 = 0.50 | Q1 = 0.07 | 95° C./95° C. |
| Ex. 2 | X2/B1 = 5/5 | A1 = 0.50 | Q1 = 0.07 | 95° C./95° C. |
| Comp. Ex. 1 | X2 = 10 | A1 = 0.50 | Q1 = 0.07 | 85° C./85° C. |

TABLE 2

| | Resin (parts) | Acid generator (parts) | Quencher (parts) | PB/PEB (° C.) |
|---|---|---|---|---|
| Ex. 3 | B1 = 10 | A2 = 1.50 | Q1 = 0.13 | 100° C./100° C. |
| Ex. 4 | X2/B1 = 5/5 | A2 = 1.50 | Q1 = 0.13 | 100° C./100° C. |
| Ex. 5 | B1/X3 = 5/5 | A2 = 1.50 | Q1 = 0.13 | 100° C./100° C. |
| Ex. 6 | B1 = 10 | A1 = 1.50 | Q1 = 0.13 | 100° C./100° C. |
| Comp. Ex. 2 | X2 = 10 | A1 = 1.50 | Q1 = 0.13 | 100° C./1000° C. |

TABLE 3

| | Resin (parts) | Acid generator (parts) | Quencher (parts) | PB/PEB (° C.) |
|---|---|---|---|---|
| Ex. 7 | B2 = 10 | A1 = 1.00 | Q1 = 0.02 | 100° C./100° C. |
| Ex. 8 | B3 = 10 | A1 = 1.00 | Q1 = 0.02 | 100° C./100° C. |
| Ex. 9 | B4 = 10 | A1 = 1.00 | Q1 = 0.02 | 100° C./100° C. |
| Comp. Ex. 3 | X2 = 10 | A1 = 1.00 | Q1 = 0.02 | 100° C./100° C. |

TABLE 4

| | Resin (parts) | Acid generator (parts) | Quencher (parts) | PB/PEB (° C.) |
|---|---|---|---|---|
| Ex. 10 | B5 = 10 | A1 = 1.00 | Q1 = 0.02 | 100° C./100° C. |
| Ex. 11 | B6 = 10 | A1 = 1.00 | Q1 = 0.02 | 100° C./100° C. |
| Ex. 12 | B7 = 10 | A1 = 1.00 | Q1 = 0.02 | 100° C./100° C. |
| Comp. Ex. 4 | X2 = 10 | A1 = 1.00 | Q1 = 0.02 | 100° C./100° C. |

TABLE 5

| | Resin (parts) | Acid generator (parts) | Quencher (parts) | PB/PEB (° C.) |
|---|---|---|---|---|
| Ex. 13 | B1 = 10 | A1 = 0.50 | Q1 = 0.07 | 95° C./95° C. |
| Ex. 14 | X1/B1 = 3/7 | A1 = 0.50 | Q1 = 0.07 | 95° C./95° C. |
| Ex. 15 | B8 = 10 | Y1 = 0.50 | Q1 = 0.07 | 95° C./95° C. |
| Comp. Ex. 5 | X2 = 10 | A1 = 0.50 | Q1 = 0.07 | 95° C./95° C. |
| Comp. Ex. 6 | X4 = 10 | Y1 = 0.50 | Q1 = 0.07 | 95° C./95° C. |

<Acid Generator>

Y1:

(Y1)

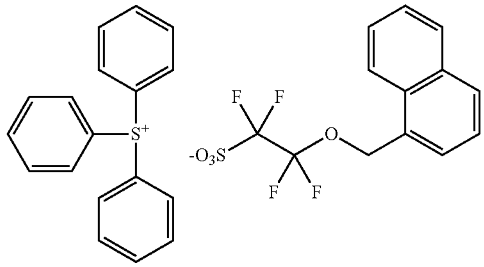

<Basic Compound: Qencher>

Q1: 2,6-diisopropylaniline,

| <Solvent of Resist composition> | |
|---|---|
| Propylene glycol monomethyl ether acetate | 265 parts |
| 2-Heptanone | 20 parts |
| Propylene glycol monomethyl ether | 20 parts |
| γ-butyrolactone | 3.5 parts |

[Evaluation of Resist Composition]

A composition for an organic antireflective film ("ARC-29A-8", by Nissan Chemical Co. Ltd.) was applied onto silicon wafers and baked for 60 seconds at 205° C. to form a 78 nm thick organic antireflective film.

The above resist liquids were then applied thereon by spin coating so that the thickness of the resulting film became 85 nm after drying.

The obtained wafers were then pre-baked for 60 sec on a direct hot plate at the temperatures given in the "PB" column in Table 1.

Line and space patterns were then exposed through stepwise changes in exposure quantity using an ArF excimer stepper ("FPA5000-AS3" by Canon: NA=0.75, ⅔ Annular), on the wafers on which the resist film had thus been formed.

The exposure was followed by 60 seconds of post-exposure baking at the temperatures given in the "PEB" column in Table 1.

This was followed by 60 sec of puddle development with 2.38 wt % tetramethylammonium hydroxide aqueous solution.

Table 6 gives the results of scanning electron microscopy of the developed dark field pattern on the organic antireflective film substrate.

The dark field pattern referred to here is a pattern in which the resist layer remains around the line and space pattern following exposure and development, as obtained by exposure through a reticle in which lines based on a chrome layer (light-blocking layer) were formed on the outside of a glass surface (the light transmitting portion) and development.

Effective sensitivity: It was represented as the exposure amount at which a 100 nm line and space pattern resolved to 1:1.

Line edge roughness (LER) evaluation: when the wall surface of the resist pattern following the lithography process was observed using a scanning electron microscope, a O was given if the discontinuities in the resist pattern side wall have a contact width nm, and it received an X if these are >9 nm.

Mask error factor (MEF) evaluation: an 85 nm line and space pattern was exposed to light with a 1:1 exposure, and corresponding mask patterns were formed with mask sizes of 90 nm, 95 nm and 100 nm. Mask size was plotted on the horizontal axis, and the line width of the line pattern formed by using each of the mask patterns was plotted on the vertical axis. A O was given when the slope of the line was ≤2.4, it received a Δ if this was >2.4 and ≤2.5, and it received an X if this was >2.5.

Table 6 gives the there results.

TABLE 6

| | LEW | MEF |
|---|---|---|
| Ex. 1 | ○ | ○ |
| Ex. 2 | ○ | ○ |
| Comp. Ex. 1 | X | X |

[Evaluation of Resist Composition for Immersion Lithography]

An organic antireflective film and the resist composition film were formed on the silicon wafers same as the above Examples.

The obtained wafers were then pre-baked for 60 sec on a direct hot plate at the temperatures given in the "PB" column in Table 2.

Line and space patterns were then exposed through stepwise changes in exposure quantity using an ArF excimer stepper for immersion lithography ("XT:1900Gi" by ASML Ltd.: NA=1.35, ¾ Annular, x-y deflection), on the wafers on which the resist film had thus been formed.

The exposure was followed by 60 seconds of post-exposure baking at the temperatures given in the "PEB" column in Table 2.

This was followed by 60 sec of puddle development with 2.38 wt % tetramethylammonium hydroxide aqueous solution.

Effective sensitivity: It was represented as the exposure amount at which a 50 nm line and space pattern resolved to 1:1.

Evaluation of Resolution: a resist pattern exposed as effective sensitivity was observed with a scanning electron microscope, these were evaluated with a O for having more resolution than 45 nm, and with an X for not having as much resolution as 45 nm.

Pattern collapse (PCM) evaluation: when the amount of exposure was increased with a 45 nm line and space pattern, a O was given if collapse was observed, or if the pattern was observed to disappear due to delamination when the line width was finer than 38 nm, and it received an X if collapse was observed, or if the pattern was observed to disappear due to delamination when the line width is ≥38 nm.

Focus margin (DOF) evaluation: for the effective sensitivity, when the focus fluctuated with a standard width as the range with a line width of 50 nm±5% (47.5 to 52.5 nm), a O was given when the DOF was ≥0.15 μm, a Δ when the DOF was ≥0.10 μm and <0.15 μm, and it received an X if the DOF was <0.10 μm.

Table 7 gives the there results.

TABLE 7

| | Resolution | PCM | DOF |
|---|---|---|---|
| Ex. 3 | ○ | ○ | ○ |
| Ex. 4 | ○ | ○ | ○ |
| Ex. 5 | ○ | ○ | ○ |
| Ex. 6 | ○ | ○ | ○ |
| Comp. Ex. 2 | X | X | X |

[Evaluation of Resist Composition for Immersion Lithography]

An organic antireflective film and the resist composition film were formed on the silicon wafers same as the above Examples.

The obtained wafers were then pre-baked for 60 sec on a direct hot plate at the temperatures given in the "PB" column in Table 3.

Contact hole patterns with hole pitch of 100 nm and hole diameter of 70 nm were then exposed through stepwise changes in exposure quantity using an ArF excimer stepper for immersion lithography ("XT:1900Gi" by ASML Ltd.: NA=1.35, ¾ Annular, x-y deflection), on the wafers on which the resist film had thus been formed.

The exposure was followed by 60 seconds of post-exposure baking at the temperatures given in the "PEB" column in Table 3.

This was followed by 60 sec of puddle development with 2.38 wt % tetramethylammonium hydroxide aqueous solution.

Effective sensitivity was represented as the exposure amount at which a hole pattern formed from a mask with a hole diameter of 70 nm is resolved to 55 nm of a hole diameter.

Resolution evaluation: in the effective sensitivity with a substrate in which a pattern formed from a mask with a 70 nm hole diameter was resolved, a O was given when a pattern formed from a mask with a hole diameter smaller than 67 nm is resolved, a Δ was given when a pattern formed from a mask with a hole diameter ≥67 nm and <70 nm was resolved, and received an X when a pattern formed from a mask with a hole diameter <70 nm could not be resolved.

Pattern (PCM) evaluation: when the amount of exposure was increased for a hole pattern formed from a mask with a hole diameter of 70 hole diameter, a O was given when a pattern was formed with a hole line thickness greater than 60 nm, a Δ was given when a pattern was formed with a hole line thickness that exceeds 57 nm but was ≤60 nm, and it received an X when the line thickness was ≤57 nm, when it was joined to the adjacent pattern, or when the pattern disappeared due to delamination.

Mask error factor (MEF) evaluation: for the effective sensitivity, the MEF was calculated from the slope of the line when the respective hole diameters of 72 nm, 71 nm, 70 nm, 69 nm, and 68 nm for the masks that form the patterns were plotted on the horizontal axis, and the hole diameters of the pattern were plotted on the vertical axis A O was given when the slope was <2.8, a Δ when it was ≥2.8 but <3.0, and it was judged as an X when it was larger than 3.0.

Table 8 gives the there results.

TABLE 8

| | Resolution | PCM | MEF |
|---|---|---|---|
| Ex. 7 | ○ | ○ | ○ |
| Ex. 8 | ○ | ○ | ○ |
| Ex. 9 | ○ | ○ | ○ |
| Comp. Ex. 3 | X | X | X |

[Evaluation of Resist Composition for Immersion Lithography]

An organic antireflective film and the resist composition film were formed on the silicon wafers same as the above Examples.

The obtained wafers were then pre-baked for 60 sec on a direct hot plate at the temperatures given in the "PB" column in Table 4.

Contact hole patterns with hole pitch of 100 nm and hole diameter of 70 nm were then exposed through stepwise changes in exposure quantity using an ArF excimer stepper for immersion lithography ("XT:1900Gi" by ASML Ltd.: NA=1.35, ¾ Annular, x-y deflection), on the wafers on which the resist film had thus been formed.

The exposure was followed by 60 seconds of post-exposure baking at the temperatures given in the "PEB" column in Table 4.

This was followed by 60 sec of puddle development with 2.38 wt % tetramethylammonium hydroxide aqueous solution.

Effective sensitivity was represented as the exposure amount at which a hole pattern formed from a mask with a hole diameter of 70 nm is resolved to 55 nm of a hole diameter.

Resolution evaluation: in the effective sensitivity with a substrate in which a pattern formed from a mask with a 70 nm hole diameter was resolved, a O was given when a pattern formed from a mask with a hole diameter smaller than 67 μm is resolved, a Δ was given when a pattern formed from a mask with a hole diameter ≥67 nm and <70 nm was resolved, and received an X when a pattern formed from a mask with a hole diameter <70 nm could not be resolved.

Focus margin (DOF) evaluation: for the effective sensitivity, DOF was represented as the focus range with a hole diameter of ≥52.2 μm and ≤57.7 μm, a O was given when the DOF was ≥0.18 μm, a Δ when the DOF was ≥0.15 μm but <0.18 μm, and it received an X if the DOF was <0.15 μm.

Table 9 gives the there results.

TABLE 9

| | Resolution | DOF |
|---|---|---|
| Ex. 10 | ○ | ○ |
| Ex. 11 | ○ | ○ |
| Ex. 12 | ○ | ○ |
| Comp. Ex. 4 | X | X |

[Evaluation of Resist Composition for Immersion Lithography]

An organic antireflective film and the resist composition film were formed on the silicon wafers same as the above Examples.

The obtained wafers were then pre-baked for 60 sec on a direct hot plate at the temperatures given in the "PB" column in Table 5.

Line and space patterns were then exposed through stepwise changes in exposure quantity using an ArF excimer stepper for immersion lithography ("XT:1900Gi" by ASML Ltd.: NA=1.35, ¾ Annular, x-y deflection), on the wafers on which the resist film had thus been formed.

The exposure was followed by 60 seconds of post-exposure baking at the temperatures given in the "PEB" column in Table 5.

This was followed by 60 sec of puddle development with 2.38 wt % tetramethylammonium hydroxide aqueous solution.

Effective sensitivity: It was represented as the exposure amount at which a 50 nm line and space pattern resolved to 1:1.

Evaluation of Resolution: a resist pattern exposed as effective sensitivity was observed with a scanning electron microscope, these were evaluated with a O for having more resolution than 45 nm, and with an X for not having as much resolution as 45 nm.

Shape evaluation: a 50 nm line and space pattern was observed using a scanning electron microscope. Top shape and footing shape that were satisfactorily close to rectangular were judged as O, and it was judged as an X when the top shape is rounded or close to a letter T shape, or when tailing was observed.

Focus margin (DOF) evaluation: for the effective sensitivity, when the focus fluctuated with a standard width as the range with a line width of 50 nm±5% (47.5 to 52.5 nm), a O was given when the DOF was ≥0.15 μm, a Δ when the DOF was ≥0.10 μm and <0.15 μm, and it received an X if the DOF was <0.10 μm.

Table 10 gives these results.

TABLE 10

| | Resolution | Shape | DOF |
|---|---|---|---|
| Ex. 13 | ○ | ○ | ○ |
| Ex. 14 | ○ | ○ | ○ |
| Comp. Ex. 5 | X | X | X |

[Evaluation of Resist Composition]

A composition for an organic antireflective film ("ARC-29A-8", by Nissan Chemical Co. Ltd.) was applied onto silicon wafers and baked for 60 seconds at 205° C. to form a 78 nm thick organic antireflective film.

The above resist liquids were then applied thereon by spin coating so that the thickness of the resulting film became 85 nm after drying.

The obtained wafers were then pre-baked for 60 sec on a direct hot plate at the temperatures given in the "PB" column in Table 5.

Line and space patterns were then exposed through stepwise changes in exposure quantity using an ArF excimer stepper ("FPA5000-AS3" by Canon: NA=0.75, ⅔ Annular), on the wafers on which the resist film had thus been formed.

The exposure was followed by 60 seconds of post-exposure baking at the temperatures given in the "PEB" column in Table 5.

This was followed by 60 sec of puddle development with 2.38 wt % tetramethylammonium hydroxide aqueous solution.

Table 11 gives the results of scanning electron microscopy of the developed dark field pattern on the organic antireflective film substrate.

The dark field pattern referred to here is a pattern in which the resist layer remains around the line and space pattern following exposure and development, as obtained by exposure through a reticle in which lines based on a chrome layer (light-blocking layer) were formed on the outside of a glass surface (the light transmitting portion) and development.

Effective sensitivity: It was represented as the exposure amount at which a 100 nm line and space pattern resolved to 1:1.

Line edge roughness (LER) evaluation: when the wall surface of the resist pattern following the lithography process was observed using a scanning electron microscope, a O was given if the discontinuities in the resist pattern side wall have a contact width ≤9 nm, and it received an X if these are >9 nm.

Mask error factor (MEF) evaluation: an 85 nm line and space pattern was exposed to light with a 1:1 exposure, and corresponding mask patterns were formed with mask sizes of 90 nm, 95 nm and 100 nm. Mask size was plotted on the horizontal axis, and the line width of the line pattern formed by using each of the mask patterns was plotted on the vertical axis. A O was given when the slope of the line was ≤2.45, it received a Δ if this was >2.4 and ≤2.5, and it received an X if this was >2.5.

Table 11 gives the there results.

TABLE 11

| | LEW | MEF |
|---|---|---|
| Ex. 15 | ○ | ○ |
| Comp. Ex. 6 | X | Δ |

The resin and composition using same of the present invention are useful in resist compositions, and particularly in chemically amplified photoresist compositions, and can be used in the microfabrication of semiconductors and in manufacture of liquid crystals, thermal print heads for circuit boards and the like, and furthermore in other photofabrication processes, and they can be suitably used in a wide range of applications. In particular, since they exhibit satisfactory shape and a superior DOF, they can be used as a suitable chemically amplified photoresist composition for excimer laser lithography such as with ArF, KrF or the like, as well as ArF liquid immersion exposure lithography and EUV exposure lithography. Moreover, in addition to liquid immersion exposure, they can also be used in dry exposure and the like. Furthermore, they can also be used in double imaging, and have industrial utility.

What is claimed is:

1. A resist composition comprising a resin comprising structural units derived from compounds represented by the formula (i) and an acid generator;

(i)

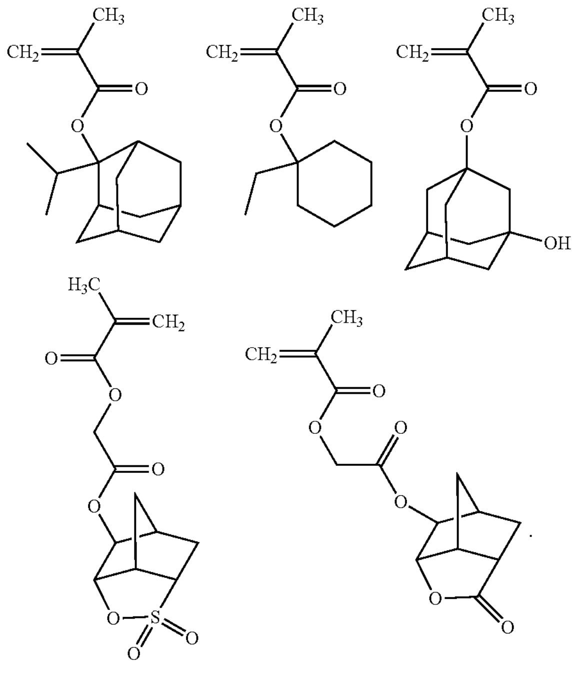

* * * * *